United States Patent
Kurokawa

(10) Patent No.: US 11,636,883 B2
(45) Date of Patent: *Apr. 25, 2023

(54) SEMICONDUCTOR DEVICE AND SYSTEM USING THE SAME

(71) Applicant: SEMICONDUCTOR ENERGY LABORATORY CO., LTD., Atsugi (JP)

(72) Inventor: Yoshiyuki Kurokawa, Kanagawa (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/086,742

(22) Filed: Nov. 2, 2020

(65) Prior Publication Data

US 2021/0049454 A1 Feb. 18, 2021

Related U.S. Application Data

(63) Continuation of application No. 16/934,110, filed on Jul. 21, 2020, now Pat. No. 11,003,986, which is a
(Continued)

(30) Foreign Application Priority Data

Mar. 18, 2016 (JP) ................................. 2016-055281

(51) Int. Cl.
*G11C 5/14* (2006.01)
*G11C 7/10* (2006.01)
(Continued)

(52) U.S. Cl.
CPC ............ *G11C 5/147* (2013.01); *G06N 3/063* (2013.01); *G06N 3/0635* (2013.01); *G06N 3/08* (2013.01);
(Continued)

(58) Field of Classification Search
CPC ........... G11C 5/14; G11C 5/063; G11C 5/147; G11C 7/1006; G11C 7/16; G11C 11/403;
(Continued)

(56) References Cited

U.S. PATENT DOCUMENTS 4,829,459 A 5/1989 Mcnutt
5,115,492 A 5/1992 Engeler
(Continued)

FOREIGN PATENT DOCUMENTS

CN 101140796 A 3/2008
CN 101278356 A 10/2008
(Continued)

OTHER PUBLICATIONS

Arima. Y et al., "A Self-Learning Neural Network Chip with 125 Neurons and 10K Self-Organization Synapses", IEEE Journal of Solid-State Circuits, Apr. 1, 1991, vol. 26, No. 4, pp. 607-611.
(Continued)

*Primary Examiner* — Hien N Nguyen
(74) *Attorney, Agent, or Firm* — Fish & Richardson P.C.

(57) ABSTRACT

To provide a semiconductor device which can execute the product-sum operation. The semiconductor device includes a first memory cell, a second memory cell, and an offset circuit. First analog data is stored in the first memory cell, and reference analog data is stored in the second memory cell. The first memory cell and the second memory cell supply a first current and a second current, respectively, when a reference potential is applied as a selection signal. The offset circuit has a function of supplying a third current corresponding to a differential current between the first current and the second current. In the semiconductor device, the first memory and the second memory supply a fourth current and a fifth current, respectively, when a potential corresponding to second analog data is applied as a selection
(Continued)

signal. By subtracting the third current from a differential current between the fourth current and the fifth current, a current that depends on the sum of products of the first analog data and the second analog data is obtained.

14 Claims, 35 Drawing Sheets

Related U.S. Application Data continuation of application No. 16/826,871, filed on Mar. 23, 2020, now Pat. No. 10,769,520, which is a continuation of application No. 15/450,315, filed on Mar. 6, 2017, now Pat. No. 10,664,748.

(51) Int. Cl.

| | | |
|---|---|---|
| G11C 5/06 | (2006.01) | |
| G11C 7/16 | (2006.01) | |
| H01L 27/12 | (2006.01) | |
| G06N 3/063 | (2023.01) | |
| G06N 3/08 | (2023.01) | |
| H01L 29/786 | (2006.01) | |
| G11C 11/403 | (2006.01) | |
| G06N 3/04 | (2023.01) | |

(52) U.S. Cl.
CPC ............ *G11C 5/063* (2013.01); *G11C 7/1006* (2013.01); *G11C 7/16* (2013.01); *H01L 27/1225* (2013.01); *H01L 27/1255* (2013.01); *H01L 29/7869* (2013.01); *G06N 3/0454* (2013.01); *G11C 11/403* (2013.01); *G11C 2207/104* (2013.01)

(58) Field of Classification Search
CPC ........... G11C 2207/104; G06N 3/0635; G06N 3/063; G06N 3/08; G06N 3/0454; H01L 27/1225; H01L 27/1255; H01L 29/7869; H01L 29/786
USPC .................................................. 365/189.09
See application file for complete search history.

(56) References Cited

U.S. PATENT DOCUMENTS

| | | | |
|---|---|---|---|
| 5,140,531 A | 8/1992 | Engeler | |
| 5,146,112 A | 9/1992 | Ito et al. | |
| 5,165,009 A * | 11/1992 | Watanabe | G06N 3/063 706/41 |
| 5,167,008 A | 11/1992 | Engeler | |
| 5,859,806 A * | 1/1999 | Wada | G11C 7/1051 365/189.05 |
| 6,038,187 A | 3/2000 | El Hajji | |
| 6,185,119 B1 | 2/2001 | Haeberli et al. | |
| 6,462,584 B1 * | 10/2002 | Proebsting | G11C 7/065 257/E21.659 |
| 6,844,582 B2 | 1/2005 | Ueda et al. | |
| 7,106,351 B2 | 9/2006 | Ito | |
| 7,443,202 B2 | 10/2008 | Kimura et al. | |
| 7,649,787 B2 | 1/2010 | Kozuma et al. | |
| 7,663,404 B2 | 2/2010 | Kimura et al. | |
| 7,715,237 B2 | 5/2010 | Cohen | |
| 7,881,124 B2 | 2/2011 | Kari et al. | |
| 7,961,006 B2 | 6/2011 | Kimura et al. | |
| 7,998,372 B2 | 8/2011 | Yano et al. | |
| 8,134,883 B2 | 3/2012 | Kozuma et al. | |
| 8,390,560 B2 | 3/2013 | Toyoshima et al. | |
| 8,471,596 B2 | 6/2013 | Kimura et al. | |
| 8,687,416 B2 | 4/2014 | Kurokawa | |
| 8,730,730 B2 | 5/2014 | Koyama et al. | |
| 8,953,363 B2 * | 2/2015 | Shimakawa | G11C 11/1673 365/148 |
| 9,093,136 B2 | 7/2015 | Kurokawa | |
| 9,330,355 B2 | 5/2016 | Rangan | |
| 9,350,358 B2 | 5/2016 | Okamoto et al. | |
| 9,418,333 B2 | 8/2016 | Kim et al. | |
| 9,542,643 B2 | 1/2017 | Levin et al. | |
| 2001/0047449 A1 * | 11/2001 | Wada | G11C 7/1051 711/104 |
| 2005/0160130 A1 | 7/2005 | Korekado et al. | |
| 2008/0187037 A1 | 8/2008 | Bulzacchelli et al. | |
| 2008/0247237 A1 | 10/2008 | Abe | |
| 2013/0148406 A1 * | 6/2013 | Shimakawa | G11C 11/1673 365/148 |
| 2013/0228773 A1 | 9/2013 | Kurokawa | |
| 2013/0242671 A1 | 9/2013 | Missiroli | |
| 2013/0314124 A1 | 11/2013 | Ikeda et al. | |
| 2014/0159771 A1 | 6/2014 | Ikeda et al. | |
| 2014/0241054 A1 | 8/2014 | Koyama | |
| 2014/0351186 A1 | 11/2014 | Julian et al. | |
| 2015/0046381 A1 | 2/2015 | Malone et al. | |
| 2016/0054940 A1 | 2/2016 | Khoueir et al. | |
| 2016/0064050 A1 | 3/2016 | Yoshimura et al. | |
| 2016/0295152 A1 | 10/2016 | Kurokawa | |
| 2016/0343452 A1 | 11/2016 | Ikeda et al. | |
| 2017/0063351 A1 | 3/2017 | Kurokawa | |
| 2017/0063549 A1 | 3/2017 | Zwart et al. | |
| 2017/0116512 A1 | 4/2017 | Kurokawa | |
| 2017/0118479 A1 | 4/2017 | Kurokawa | |
| 2017/0221553 A1 * | 8/2017 | Ishizu | G11C 11/4096 |

FOREIGN PATENT DOCUMENTS

| | | |
|---|---|---|
| EP | 0469885 A | 2/1992 |
| EP | 2814036 A | 12/2014 |
| JP | 04-067259 A | 3/1992 |
| JP | 04-127467 A | 4/1992 |
| JP | 04-216160 A | 8/1992 |
| JP | 06-274661 A | 9/1994 |
| JP | 07-134899 A | 5/1995 |
| JP | 09-065032 A | 3/1997 |
| JP | 2004-030624 A | 1/2004 |
| JP | 2004-110420 A | 4/2004 |
| JP | 2007-142195 A | 6/2007 |
| JP | 2012-150875 A | 8/2012 |
| JP | 2014-194837 A | 10/2014 |
| JP | 2016-197484 A | 11/2016 |
| KR | 1993-0700921 A | 3/1993 |
| KR | 19930700921 A | 3/1993 |
| KR | 2012-0099343 A | 9/2012 |
| KR | 2014-0144130 A | 12/2014 |
| KR | 2015-0105261 A | 9/2015 |
| KR | 2016-0010477 A | 1/2016 |
| TW | I250491 | 3/2006 |
| TW | 201128609 | 8/2011 |
| TW | I419122 | 12/2013 |
| WO | WO-2004/027680 | 4/2004 |
| WO | WO-2014/189717 | 11/2014 |
| WO | WO-2014/189970 | 11/2014 |
| WO | WO-2015/020802 | 2/2015 |
| WO | WO-2015/020815 | 2/2015 |
| WO | WO-2015/124770 | 8/2015 |

OTHER PUBLICATIONS

Aslam-Siddiqi.A et al., "A 16×16 Nonvolatile Programmable Analog Vector-Matrix Multiplier", IEEE Journal of Solid-State Circuits, Oct. 1, 1998, vol. 33, No. 10, pp. 1502-1509.
International Search Report (Application No. PCT/IB2017/051281) dated Jun. 13, 2017.
Written Opinion (Application No. PCT/IB2017/051281) dated Jun. 13, 2017.
Chinese Office Action (Application No. 201780014241.3) dated Mar. 22, 2022.

* cited by examiner

SEMICONDUCTOR DEVICE AND SYSTEM USING THE SAME

CROSS-REFERENCE TO RELATED APPLICATIONS

This application is a continuation of U.S. application Ser. No. 16/934,110, filed Jul. 21, 2020, now allowed, which is a continuation of U.S. application Ser. No. 16/826,871, filed Mar. 23, 2020, now U.S. Pat. No. 10,769,520, which is a continuation of U.S. application Ser. No. 15/450,315, filed Mar. 6, 2017, now U.S. Pat. No. 10,664,748, which claims the benefit of a foreign priority application filed in Japan as Ser. No. 2016-055281 on Mar. 18, 2016, all of which are incorporated by reference.

TECHNICAL FIELD

One embodiment of the present invention relates to a semiconductor device and a system using the semiconductor device.

Note that one embodiment of the present invention is not limited to the above technical field. The technical field of the invention disclosed in this specification and the like relates to an object, a method, or a manufacturing method. In addition, one embodiment of the present invention relates to a process, a machine, manufacture, or a composition of matter. Specifically, examples of the technical field of one embodiment of the present invention disclosed in this specification include a semiconductor device, a display device, a liquid crystal display device, a light-emitting device, a power storage device, an imaging device, a memory device, a processor, an electronic device, a method for driving any of them, a method for manufacturing any of them, a method for testing any of them, and a system including any of them.

BACKGROUND ART

An artificial neural network is an information processing system modeled on a biological neural network. A computer having a higher performance than a conventional Neumann computer is expected to be provided by utilizing the artificial neural network, and in these years, a variety of researches on an artificial neural network formed over an electronic circuit have been carried out.

In the artificial neural network, units which resemble neurons are connected to each other through units which resemble synapses. By changing the connection strength, a variety of input patterns are learned, and pattern recognition, associative storage, or the like can be performed at high speed. Furthermore, Non-Patent Document 1 discloses a technique relating to a chip having a self-learning function with the artificial neural network.

REFERENCE

[Non-Patent Document 1] Yutaka Arima et al., "A Self-Learning Neural Network Chip with 125 Neurons and 10K Self-Organization Synapses", *IEEE Journal of Solid-State Circuits*, Vol. 26, No. 4, April 1991, pp. 607-611

DISCLOSURE OF INVENTION

In order to form an artificial neural network using a semiconductor device, a synapse circuit that stores a connection strength between a first neuron circuit and a second neuron circuit and performs a product-sum operation in which output of the first neuron circuit and the connection strength are multiplied and summed needs to be provided. In other words, a memory that holds a connection strength, a multiplier circuit and an adder circuit that perform a product-sum operation, and the like are necessarily mounted on the semiconductor device.

In the case where the memory, the multiplier circuit, the adder circuit, and the like are formed using digital circuits, the memory needs to be able to store multi-bit data and moreover, the multiplier circuit and the adder circuit need to be able to perform multi-bit arithmetic operation. In other words, a large-scale memory, a large-scale multiplier circuit, and a large-scale adder circuit are required to form an artificial neural network using digital circuits; therefore, the chip area of the digital circuits is increased.

An object of one embodiment of the present invention is to provide a novel semiconductor device. Another object of one embodiment of the present invention is to provide a module including the novel semiconductor device. Another object of one embodiment of the present invention is to provide an electronic device using the module including the novel semiconductor device. Another object of one embodiment of the present invention is to provide a system with the module including the novel semiconductor device.

Another object of one embodiment of the present invention is to provide a semiconductor device with a small circuit area. Another object of one embodiment of the present invention is to provide a semiconductor device with low power consumption. Another object of one embodiment of the present invention is to provide a novel semiconductor device having an authentication function. Another object of one embodiment of the present invention is to provide a novel semiconductor device which compresses video data and/or image data.

Note that the objects of one embodiment of the present invention are not limited to the above objects. The objects described above do not disturb the existence of other objects. The other objects are the ones that are not described above and will be described below. The other objects will be apparent from and can be derived from the description of the specification, the drawings, and the like by those skilled in the art. One embodiment of the present invention achieves at least one of the above objects and the other objects. One embodiment of the present invention does not necessarily achieve all the above objects and the other objects.

(1)

One embodiment of the present invention is a semiconductor device including a memory cell array and an offset circuit, where the memory cell array includes a first memory cell and a second memory cell, where the offset circuit includes a first constant current circuit, a second constant current circuit, first to third transistors, a first capacitor, a first wiring, a second wiring, a first output terminal, a second output terminal, and a current mirror circuit, where the first constant current circuit is electrically connected to the first wiring and configured to supply a first current to the first wiring, where a first terminal of the first transistor is electrically connected to a first terminal of the second transistor, where a gate of the first transistor is electrically connected to a second terminal of the second transistor, where the first terminal of the second transistor is electrically connected to the first wiring, where a first terminal of the third transistor is electrically connected to the second terminal of the second transistor, where a first terminal of the first capacitor is electrically connected to the gate of the first transistor, where the first wiring is electrically connected to the first output terminal, where the second constant current circuit is electrically connected to the second wiring and is configured to supply a second current to the second wiring, where the second wiring is electrically connected to the second output terminal, where the current mirror circuit is configured to output a third current corresponding to a potential of the second wiring from the first wiring and the second wiring, where the first memory cell is electrically connected to the first output terminal, and where the second memory cell is electrically connected to the second output terminal.

(2)

Another embodiment of the present invention is the semiconductor device according to (1), where the first constant current circuit includes a fourth transistor, where the second constant current circuit includes a fifth transistor, where each of the fourth transistor and the fifth transistor includes a back gate, where a first terminal of the fourth transistor is electrically connected to the first wiring, where a gate of the fourth transistor is electrically connected to the first terminal of the fourth transistor, where a first terminal of the fifth transistor is electrically connected to the second wiring, and where a gate of the fifth transistor is electrically connected to the first terminal of the fifth transistor.

(3)

Another object of one embodiment of the present invention is the semiconductor device according to (1) or (2), where the current mirror circuit includes a sixth transistor and a seventh transistor, where a first terminal of the sixth transistor is electrically connected to the first wiring, where a gate of the sixth transistor is electrically connected to the second wiring, where a first terminal of the seventh transistor is electrically connected to the second wiring, and where a gate of the seventh transistor is electrically connected to the second wiring.

(4)

Another object of one embodiment of the present invention is the semiconductor device according to any one of (1) to (3), where the first memory cell includes an eighth transistor, a ninth transistor, and a second capacitor, where the second memory cell includes a tenth transistor, an eleventh transistor, and a third capacitor, where a first terminal of the eighth transistor is electrically connected to a gate of the ninth transistor, where a first terminal of the second capacitor is electrically connected to the first terminal of the eighth transistor, where a first terminal of the ninth transistor is electrically connected to the first output terminal, where a first terminal of the tenth transistor is electrically connected to a gate of the eleventh transistor, where a first terminal of the third capacitor is electrically connected to the first terminal of the tenth transistor, and where a first terminal of the eleventh transistor is electrically connected to the second output terminal.

(5)

Another embodiment of the present invention is the semiconductor device according to any one of (1) to (4), where the first to eleventh transistors have the same polarity.

(6)

Another embodiment of the present invention is the semiconductor device according to any one of (1) to (5), where at least one of channel formation regions in the first to eleventh transistors includes an oxide containing at least one of indium, an element M (M is any of aluminum, gallium, yttrium, or tin), and zinc.

(7)

Another embodiment of the present invention is a semiconductor wafer including a region for dicing and a plurality of semiconductor devices described in any one of (1) to (6).

(8)

Another embodiment of the present invention is an electronic device including the semiconductor device described in any one of (1) to (6) and a housing.

(9)

Another embodiment of the present invention is the electronic device according to (8), including the semiconductor device according to any one of (1) to (6) and being configured to perform processing such as pattern recognition and associative storage.

(10)

Another embodiment of the present invention is a biometric authentication system including the electronic device according to (9) and a device configured to obtain biological information.

(11)

Another embodiment of the present invention is a video distribution system including the electronic device according to (9) and being configured to encode a video data and to send an encoded video data.

According to one embodiment of the present invention, a novel semiconductor device can be provided. According to another embodiment of the present invention, a module including the novel semiconductor device can be provided. According to another embodiment of the present invention, an electronic device using the module including the novel semiconductor device can be provided. According to one embodiment of the present invention, a system with the memory device including the novel semiconductor device can be provided.

Another embodiment of the present invention can provide a semiconductor device with a small circuit area. Another embodiment of the present invention can provide a semiconductor device with lower power consumption. Another embodiment of the present invention can provide a novel semiconductor device having an authentication function. Another embodiment of the present invention can provide a novel semiconductor device that encodes video data and/or image data.

Note that the effects of one embodiment of the present invention are not limited to the above effects. The effects described above do not disturb the existence of other effects. The other effects are the ones that are not described above and will be described below. The other effects will be apparent from and can be derived from the description of the specification, the drawings, and the like by those skilled in the art. One embodiment of the present invention has at least one of the above effects and the other effects. Accordingly, one embodiment of the present invention does not have the aforementioned effects in some cases.

BEST MODE FOR CARRYING OUT THE INVENTION

An "electronic device", an "electronic component", a "module", and a "semiconductor device" are described. In general, an "electronic device" may refer to as a personal computer, a mobile phone, a tablet terminal, an e-book reader, a wearable terminal, an audiovisual (AV) device, an electronic appliance, a household appliance, an industrial appliance, a digital signage, a car, or an electric appliance including a system, for example. An "electronic component" or a "module" may refer to a processor, a memory device, a sensor, a battery, a display device, a light-emitting device, an interface device, a radio frequency (RF) tag, a receiver, or a transmitter included in an electronic device. A "semiconductor device" may refer to a device including a semiconductor element or a driver circuit, a control circuit, a logic circuit, a signal generation circuit, a signal conversion circuit, a potential level converter circuit, a voltage source, a current source, a switching circuit, an amplifier circuit, a memory circuit, a memory cell, a display circuit, a display pixel, or the like which includes a semiconductor element and is included in an electronic component or a module.

In this specification, an oxide semiconductor is referred to as an OS in some cases. Thus, a transistor including an oxide semiconductor in a channel formation region is referred to as an OS transistor in some cases.

Embodiment 1

In this embodiment, a product-sum operation circuit which is a semiconductor device according to one embodiment of the present invention will be described. Note that in the product-sum operation circuit, the sum of products of first analog data and second analog data is conducted.

<Configuration Example>

Figure 1:
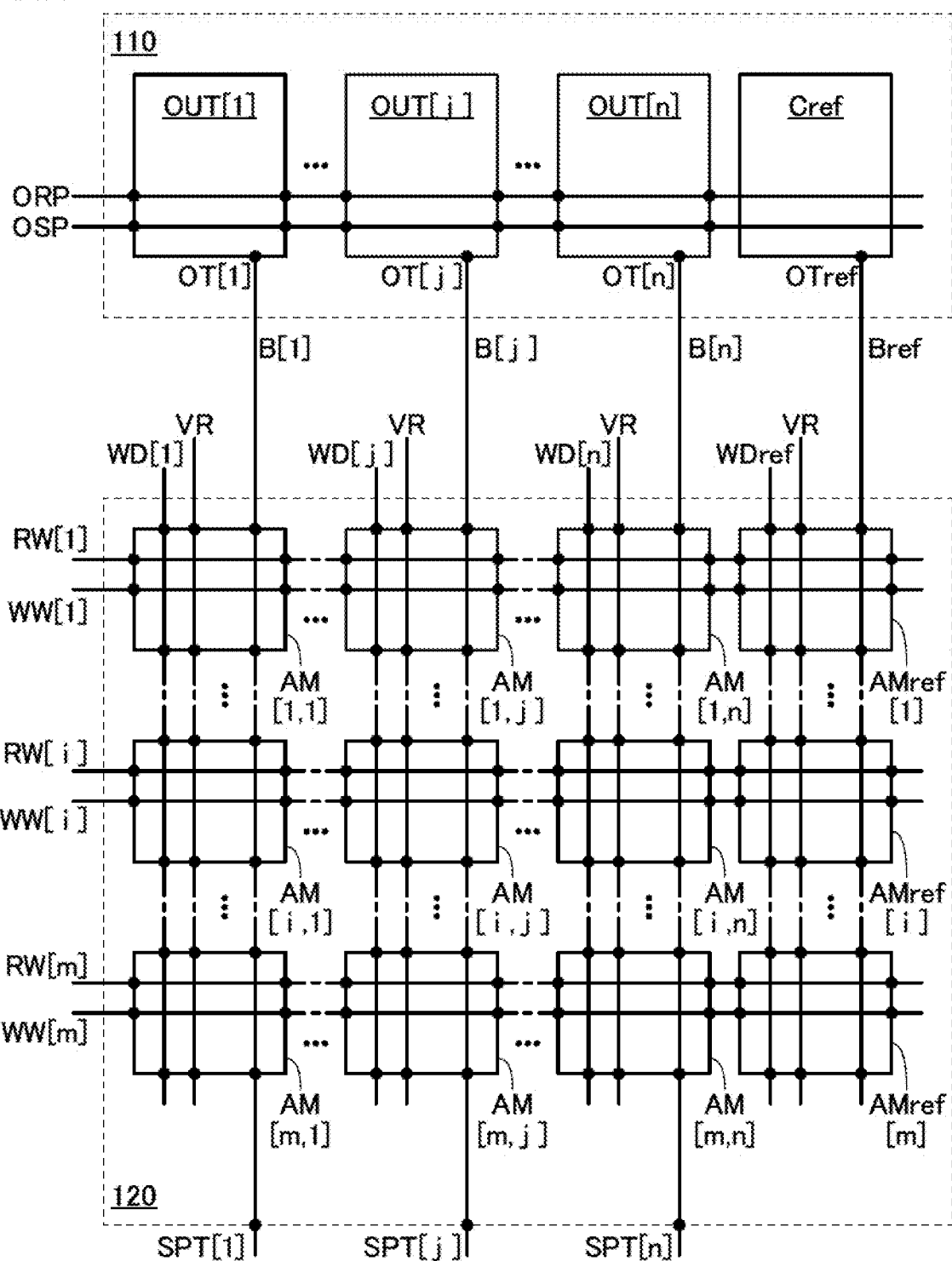
FIG. 1 is a block diagram showing an example of a semiconductor device.

FIG. 1 shows an example of a semiconductor device of one embodiment of the present invention. FIG. 1 is a block diagram of a product-sum operation circuit. A semiconductor device 100 includes an offset circuit 110 and a memory cell array 120.

The offset circuit 110 includes column output circuits OUT[1] to OUT[n] (n is an integer greater than or equal to 1) and a reference column output circuit $C_{ref}$.

In the memory cell array 120, m (m is an integer greater than or equal to 1) memory cells AM are arranged in the column direction and n memory cells AM are arranged in the row direction; that is, m×n memory cells AM are provided. In addition, m memory cells $AM_{ref}$ are arranged in the column direction. The total number of the memory cells AM and the memory cells $AM_{ref}$ provided in matrix in the memory cell array 120 is m×(n+1). In particular, in the memory cell array 120 in FIG. 1, the memory cell AM positioned in an i-th row and a j-th column is denoted by a memory cell AMP (i is an integer greater than or equal to 1 and less than or equal to m, and j is an integer greater than or equal to 1 and less than or equal to n), and the memory cell $AM_{ref}$ positioned in the i-th row is denoted by a memory cell $AM_{ref}[i]$.

The memory cell AM retains a potential corresponding to the first analog data, and the memory cell $AM_{ref}$ retains a predetermined potential. Note that the predetermined potential is a potential necessary for the product-sum operation, and in this specification, data corresponding to this predetermined potential is referred to as reference analog data in some cases.

The memory cell array 120 includes output terminals SPT[1] to SPT[n].

The column output circuit OUT[j] includes an output terminal OT[j], and the reference column output circuit $C_{ref}$ includes an output terminal $OT_{ref}$.

A wiring ORP is electrically connected to the column output circuits OUT[1] to OUT[n], and a wiring OSP is electrically connected to the column output circuits OUT[1] to OUT[n]. The wiring ORP and the wiring OSP are wirings for supplying a control signal to the offset circuit 110.

An output terminal SPT[j] of the memory cell array 120 is electrically connected to a wiring B [j].

The output terminal OT[j] of the column output circuit OUT[j] is electrically connected to the wiring B[j].

The output terminal $OT_{ref}$ of the reference column output circuit $C_{ref}$ is electrically connected to a wiring $B_{ref}$.

The memory cell $AM_{ref}$[i] is electrically connected to a wiring RW[i], a wiring WW[i], a wiring $WD_{ref}$, the wiring $B_{ref}$, and a wiring VR.

The memory cell $AM_{ref}$[i] is electrically connected to the wiring RW[i], the wiring WW[i], a wiring $WD_{ref}$, the wiring $B_{ref}$, and the wiring VR.

The wiring WW[i] functions as a wiring for supplying a selection signal to the memory cells AM[i,1] to AM[i,n] and the memory cell $AM_{ref}$[i]. The wiring RW[i] functions as a wiring for supplying either a reference potential or a potential corresponding to the second analog data to the memory cells AM[i,1] to AM[i,n] and the memory cell $AM_{ref}$[i]. The wiring WD[j] functions as a wiring for supplying writing data to the memory cells AM in the j-th column. The wiring VR functions as a wiring for supplying a predetermined potential to the memory cells AM or the memory cells $AM_{ref}$ when data is read out from the memory cells AM or the memory cells $AM_{ref}$.

The wiring B[j] functions as a wiring for supplying a signal from the column output circuit OUT[j] to the memory cells AM in the j-th column in the memory cell array 120.

The wiring $B_{ref}$ functions as a wiring for supplying a signal from the reference column output circuit $C_{ref}$ to the memory cells $AM_{ref}$[1] to $AM_{ref}$[m].

In the semiconductor device 100 in FIG. 1, only the following components are shown: the offset circuit 110; the memory cell array 120; the column output circuit OUT[1]; the column output circuit OUT[j]; the column output circuit OUT[n]; the reference column output circuit $C_{ref}$; an output terminal OT[1]; the output terminal OT[j]; an output terminal OT[n]; the output terminal $OT_{ref}$; an output terminal SPT[1]; the output terminal SPT[j]; an output terminal SPT[n]; a memory cell AM[1,1]; the memory cell AM[i,1]; a memory cell AM[m,1]; the memory cell AM[11]; the memory cell AM[i,n]; a memory cell AM[m,j]; a memory cell AM[1,n]; the memory cell AM[i,n]; a memory cell AM[m,n]; a memory cell $AM_{ref}$[1]; the memory cell $AM_{ref}$[i]; a memory cell $AM_{ref}$[m]; the wiring OSP; the wiring ORP; a wiring B[1]; the wiring B[j]; a wiring B[n]; the wiring $B_{ref}$; a wiring WD[1]; the wiring WD[j]; a wiring WD[n]; the wiring $WD_{ref}$; the wiring VR; a wiring RW[1]; the wiring RW[i]; a wiring RW[m]; a wiring WW[1]; the wiring WW[i]; and a wiring WW[m]. Other circuits, wirings, elements, and reference numerals thereof are not shown.

Note that a structure of one embodiment of the present invention is not limited to the configuration of the semiconductor device 100 shown in FIG. 1. Depending on circumstances or conditions or as needed, the structure of the semiconductor device 100 can be changed. For example, depending on a circuit configuration of the semiconductor device 100, the wiring WD[j] and the wiring VR are not separately provided, and one wiring may be shared therebetween. Alternatively, depending on a circuit configuration of the semiconductor device 100, the wiring ORP and the wiring OSP are not separately provided, and one wiring may be shared therebetween.

<<Offset Circuit 110>>

Figure 2:
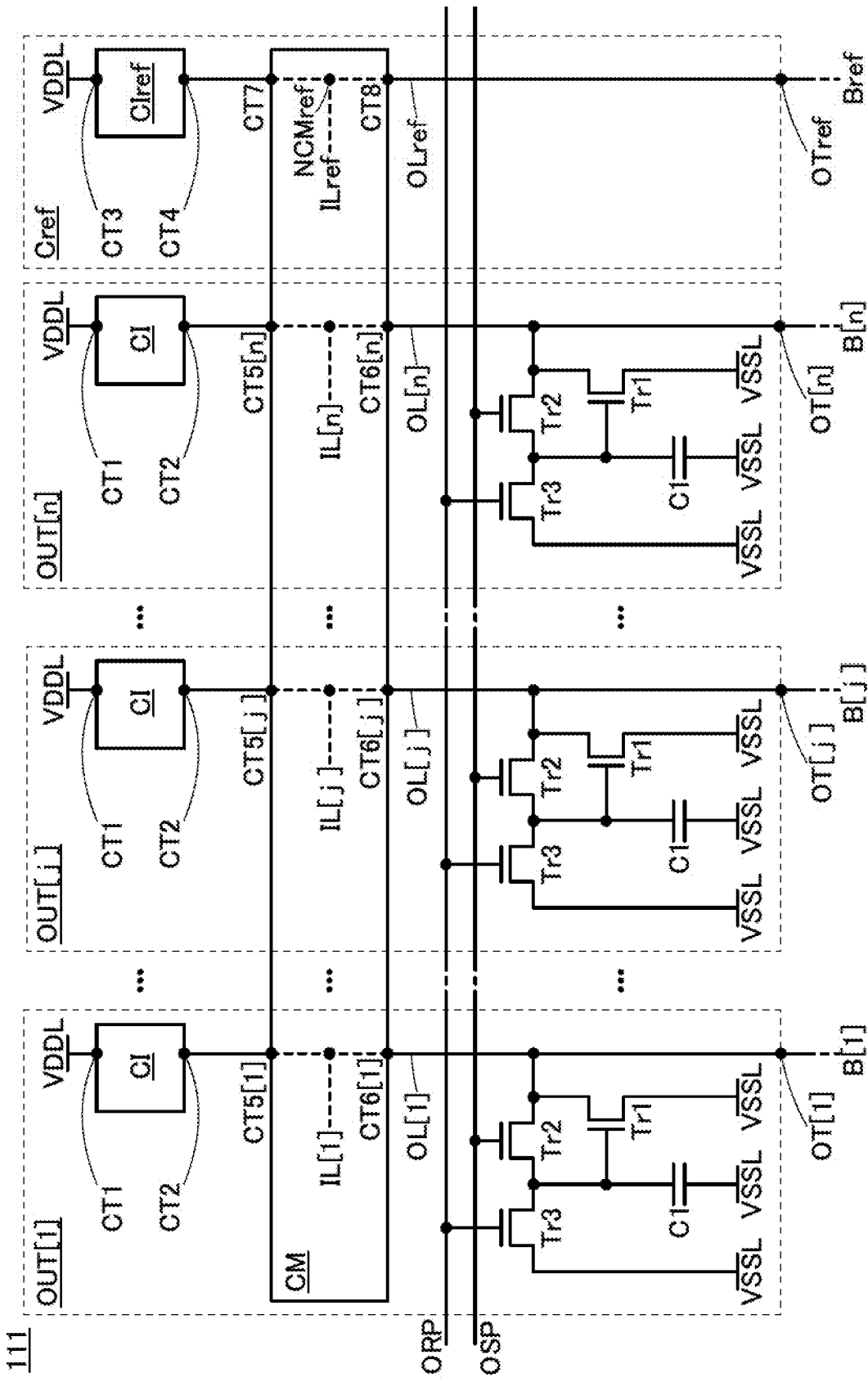
FIG. 2 is a circuit diagram showing an example of an offset circuit in the semiconductor device of FIG. 1.

Next, an example of a circuit configuration that can be applied for the offset circuit 110 is described. FIG. 2 shows an offset circuit 111 as an example of the offset circuit 110.

The offset circuit 111 is electrically connected to a wiring VDDL and a wiring VSSL for supplying a power supply voltage. Specifically, each of the column output circuits OUT[1] to OUT[n] are electrically connected to the wiring VDDL and the wiring VSSL, and the reference column output circuit $C_{ref}$ is electrically connected to the wiring VDDL. Note that a current mirror circuit CM described later is electrically connected to the wiring VSSL in some cases. The wiring VDDL supplies a high-level potential. The wiring VSSL supplies a low-level potential.

A circuit configuration of an inside of the column output circuit OUT[j] is described below. The column output circuit OUT[j] includes a constant current circuit CI, transistors Tr1 to Tr3, a capacitor C1, and a wiring OL[j]. The current mirror circuit CM is shared between the column output circuits OUT[1] to OUT[n] and the reference column output circuit $C_{ref}$.

The constant current circuit CI includes a terminal CT1 and a terminal CT2. The terminal CT1 functions as an input terminal of the constant current circuit CI, and the terminal CT2 functions as an output terminal of the constant current circuit CI. The current mirror circuit CM shared between the column output circuits OUT[1] to OUT[n] and the reference column output circuit $C_{ref}$ includes terminals CT5[1] to CT5[n], terminals CT6[1] to CT6[n], a terminal CT7, and a terminal CTB.

The constant current circuit CI has a function of keeping the amount of current flowing from the terminal CT1 to the terminal CT2 constant.

In the column output circuit OUT[j], a first terminal of the transistor Tr1 is electrically connected to the wiring OL[j], a second terminal of the transistor Tr1 is electrically connected to the wiring VSSL, and a gate of the transistor Tr1 is electrically connected to a first terminal of the capacitor C1. A first terminal of the transistor Tr2 is electrically connected to the wiring OL[j], a second terminal of the transistor Tr2 is electrically connected to the first terminal of the capacitor C1, and a gate of the transistor Tr2 is electrically connected to the wiring OSP. A first terminal of the transistor Tr3 is electrically connected to the first terminal of the capacitor C1, a second terminal of the transistor Tr3 is electrically connected to the wiring VSSL, and a gate of the transistor Tr3 is electrically connected to the wiring ORP. A second terminal of the capacitor C1 is electrically connected to the wiring VSSL.

Note that each of the transistors Tr1 to Tr3 is preferably an OS transistor. In addition, each channel formation region in the transistors Tr1 to Tr3 is preferably formed using an oxide containing at least one of indium, an element M (M is any of aluminum, gallium, yttrium, or tin), and zinc. It is further preferable that the transistors Tr1 to Tr3 have a structure of a transistor described in Embodiment 5.

The OS transistor has a characteristic of extremely low off-state current. Thus, when the OS transistor is in an off state, the amount of leakage current flowing between a source and a drain can be extremely small. With use of the OS transistors as the transistors Tr1 to Tr3, the leakage current of each of the transistors Tr1 to Tr3 can be suppressed, which enables a product-sum operation circuit with high calculation accuracy to be achieved in some cases.

In the column output circuit OUT[j], the terminal CT1 of the constant current circuit CI is electrically connected to the wiring VDDL, and the terminal CT2 of the constant current circuit CI is electrically connected to the terminal CT5[j] of the current mirror circuit CM. The terminal CT6[j] of the current mirror circuit CM is electrically connected to the output terminal OT[j].

Note that the wiring OL[j] is a wiring for making the terminal CT2 of the constant current circuit CI being electrically connected to the output terminal OT[j] through the terminal CT5[j] and the terminal CT6[j] of the current mirror circuit CM.

Next, the reference column output circuit $C_{ref}$ is described. The reference column output circuit $C_{ref}$ includes the constant current circuit $CI_{ref}$ and a wiring $OL_{ref}$. As described above, the reference column output circuit $C_{ref}$ includes the current mirror circuit CM that is shared with the column output circuits OUT[1] to OUT[n].

The constant current circuit $CI_{ref}$ includes a terminal CT3 and a terminal CT4. The terminal CT3 functions as an input terminal of the constant current circuit $CI_{ref}$, and the terminal CT4 functions as an output terminal of the constant current circuit $CI_{ref}$.

The constant current circuit $CI_{ref}$ has a function of keeping the amount of current flowing from the terminal CT3 to the terminal CT4 constant.

In the reference column output circuit $C_{ref}$, the terminal CT3 of the constant current circuit $CI_{ref}$ is electrically connected to the wiring VDDL, and the terminal CT4 of the constant current circuit $CI_{ref}$ is electrically connected to the terminal CT7 of the current mirror circuit CM. The terminal CT8 of the current mirror circuit CM is electrically connected to the output terminal $OT_{ref}$.

The wiring $OL_{ref}$ is a wiring for making the terminal CT4 of the constant current circuit $CI_{ref}$ being electrically connected to the output terminal $OT_{ref}$ through the terminal CT7 and the terminal CT8 of the current mirror circuit CM.

In the current mirror circuit CM, the terminal CT5 [j] is electrically connected to the terminal CT6[j], and the terminal CT7 is electrically connected to the terminal CT8. In addition, a wiring IL[j] is electrically connected between the terminal CT5[j] and the terminal CT6[j], and a wiring ILref is electrically connected between the terminal CT7 and the terminal CT8. Furthermore, a connection portion of the wiring $IL_{ref}$ between the terminal CT7 and the terminal CT8 is a node $NCM_{ref}$. The current mirror circuit CM has a function of equalizing the amount of current flowing in the wiring $IL_{ref}$ and the amount of current flowing in each of wirings IL[1] to IL[n] with reference to the potential at the node $NCM_{ref}$.

In the offset circuit 111 in FIG. 2, only the following components are shown: the column output circuit OUT[1]; the column output circuit OUT[j]; the column output circuit OUT[n]; the reference column output circuit $C_{ref}$; the constant current circuit CI; the constant current circuit $CI_{ref}$; the current mirror circuit CM; the output terminal OT[1]; the output terminal OT[j]; the output terminal OT[n]; the output terminal $OT_{ref}$; the terminal CT1; the terminal CT2; the terminal CT3; the terminal CT4; the terminal CT5[1]; the terminal CT5[j]; the terminal CT5[n]; the terminal CT6[1]; the terminal CT6[j]; the terminal CT6[n]; the terminal CT7; the terminal CT8; the transistor Tr1; the transistor Tr2; the transistor Tr3; the capacitor C1; a wiring OL[1]; the wiring OL[j]; a wiring OL[n]; the wiring $OL_{ref}$; the wiring ORP; the wiring OSP; the wiring B[1]; the wiring B[j]; the wiring B[n]; the wiring $B_{ref}$; the wiring IL[1]; the wiring IL[j]; the wiring IL[n]; the wiring $IL_{ref}$; the node $NCM_{ref}$; the wiring VDDL; and the wiring VSSL. Other circuits, wirings, elements, and reference numerals thereof are not shown.

Note that a structure of one embodiment of the present invention is not limited to the configuration of the offset circuit 111 in FIG. 2. Depending on circumstances or conditions or as needed, the structure of the offset circuit 111 can be changed.

[Constant Current Circuits CI and $CI_{ref}$]

Next, an example of internal structures of the constant current circuit CI and the constant current circuit $CI_{ref}$ is described.

Figure 3:
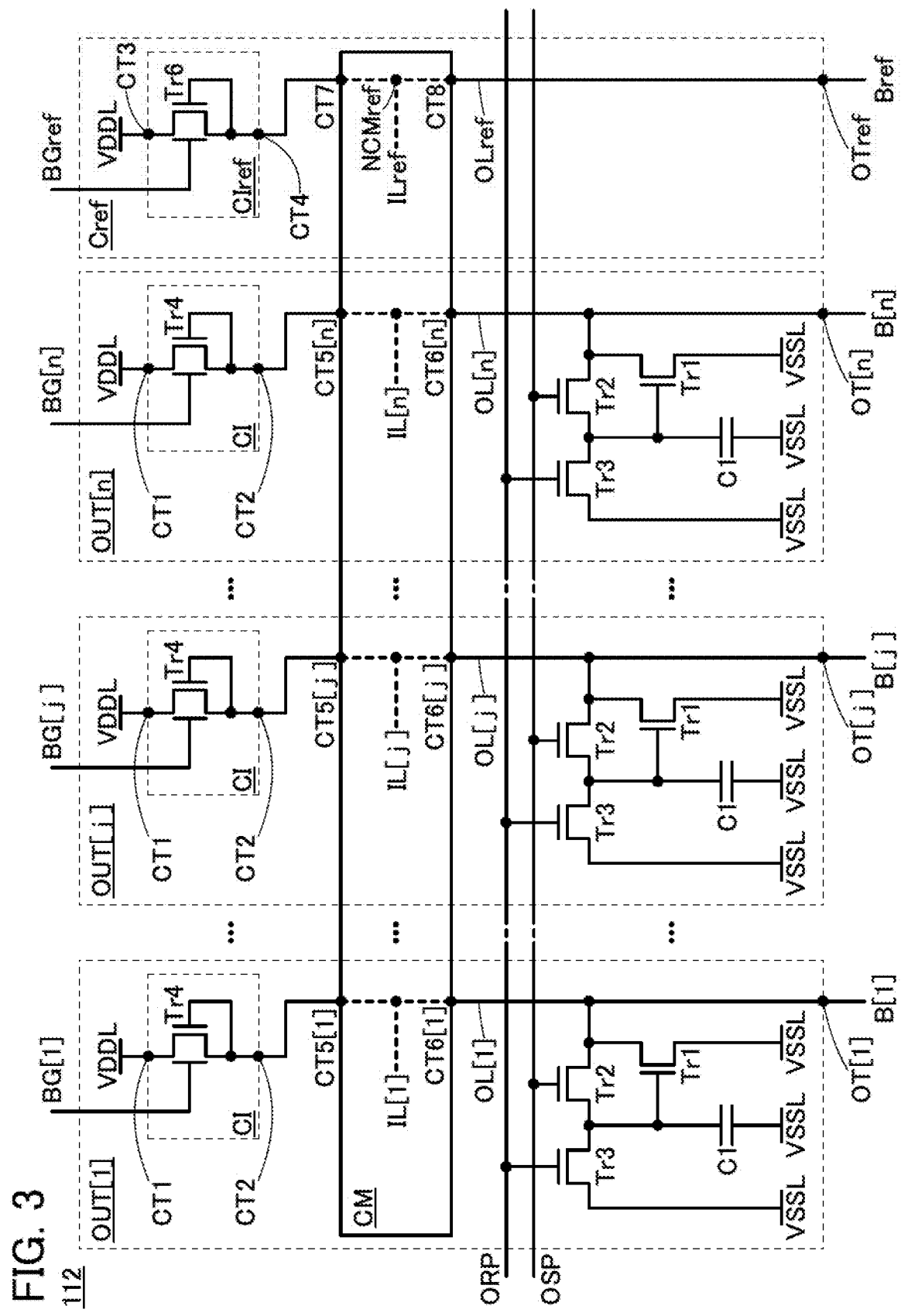
FIG. 3 is a circuit diagram showing an example of an offset circuit in the semiconductor device of FIG. 1.

An offset circuit 112 shown in FIG. 3 is a circuit diagram showing an example of internal structures of the constant current circuit CI and the constant current circuit $CI_{ref}$ included in the offset circuit 111 shown in FIG. 2.

In the column output circuit OUT[j], the constant current circuit CI includes a transistor Tr4. The transistor Tr4 has a dual gate structure including a first gate and a second gate.

Note that in this specification, the first gate in the transistor having a dual gate structure indicates a front gate, and a term "first gate" can be replaced with a simple term "gate". Besides, the second gate in the transistor having a dual gate structure indicates a back gate, and a term "second gate" can be replaced with a term "back gate".

A first terminal of the transistor Tr4 is electrically connected to the terminal CT1 of the constant current circuit CI. A second terminal of the transistor Tr4 is electrically connected to the terminal CT2 of the constant current circuit CI. A gate of the transistor Tr4 is electrically connected to the terminal CT2 of the constant current circuit CI. A back gate of the transistor Tr4 is electrically connected to a wiring BG[j].

In the reference column output circuit $C_{ref}$, the constant current circuit $CI_{ref}$ includes a transistor Tr6. The transistor Tr6 has a dual gate structure including a gate and a back gate.

A first terminal of the transistor Tr6 is electrically connected to the terminal CT3 of the constant current circuit $CI_{ref}$. A second terminal of the transistor Tr6 is electrically connected to the terminal CT4 of the constant current circuit $CI_{ref}$. The gate of the transistor Tr6 is electrically connected to the terminal CT4 of the constant current circuit $CI_{ref}$. The back gate of the transistor Tr6 is electrically connected to a wiring $BG_{ref}$.

In the above connection structure, the threshold voltages of the transistor Tr4 and the transistor Tr6 can be controlled when a potential is applied to the wiring BG[j] and the wiring $BG_{ref}$.

Each of the transistor Tr4 and the transistor Tr6 is preferably an OS transistor. In addition, each channel formation region in the transistors Tr4 and Tr6 is preferably formed using an oxide containing at least one of indium, the element M, and zinc. It is further preferable that the transistors Tr4 and Tr6 have a structure of a transistor described in Embodiment 5.

With use of the OS transistors as the transistors Tr4 and Tr6, the leakage current of each of the transistors Tr4 and Tr6 can be suppressed, which enables a product-sum operation circuit with high calculation accuracy to be achieved in some cases.

In the offset circuit 112 shown in FIG. 3, only the following components are shown: the column output circuit OUT[1]; the column output circuit OUT[j]; the column output circuit OUT[n]; the reference column output circuit $C_{ref}$; the constant current circuit CI; the constant current circuit $CI_{ref}$; the current mirror circuit CM; the output terminal OT[1]; the output terminal OT[L]; the output terminal OT[n]; the output terminal $OT_{ref}$; the terminal CT1; the terminal CT2; the terminal CT3; the terminal CT4; the terminal CT5[1]; the terminal CT5[j]; the terminal CT5[n]; the terminal CT6[1]; the terminal CT6[j]; the terminal CT6[n]; the terminal CT7; the terminal CT8; the transistor Tr1; the transistor Tr2; the transistor Tr3; the transistor Tr4; the transistor Tr6; the capacitor C1; the wiring OL[1]; the wiring OL[j]; the wiring OL[n]; the wiring OL$_{ref}$; the wiring ORP; the wiring OSP; the wiring B[1]; the wiring B[j]; the wiring B[n]; the wiring B$_{ref}$; a wiring BG[1]; the wiring BG[j]; a wiring BG[n]; the wiring BG$_{ref}$; the wiring IL[1]; the wiring IL[j]; the wiring IL[n]; the wiring IL$_{ref}$; the node NCM$_{ref}$; the wiring VDDL; and the wiring VSSL. Other circuits, wirings, elements, and reference numerals thereof are not shown.

[Current Mirror Circuit CM]

Next, an internal structure example of the current mirror circuit CM will be described.

Figure 4:
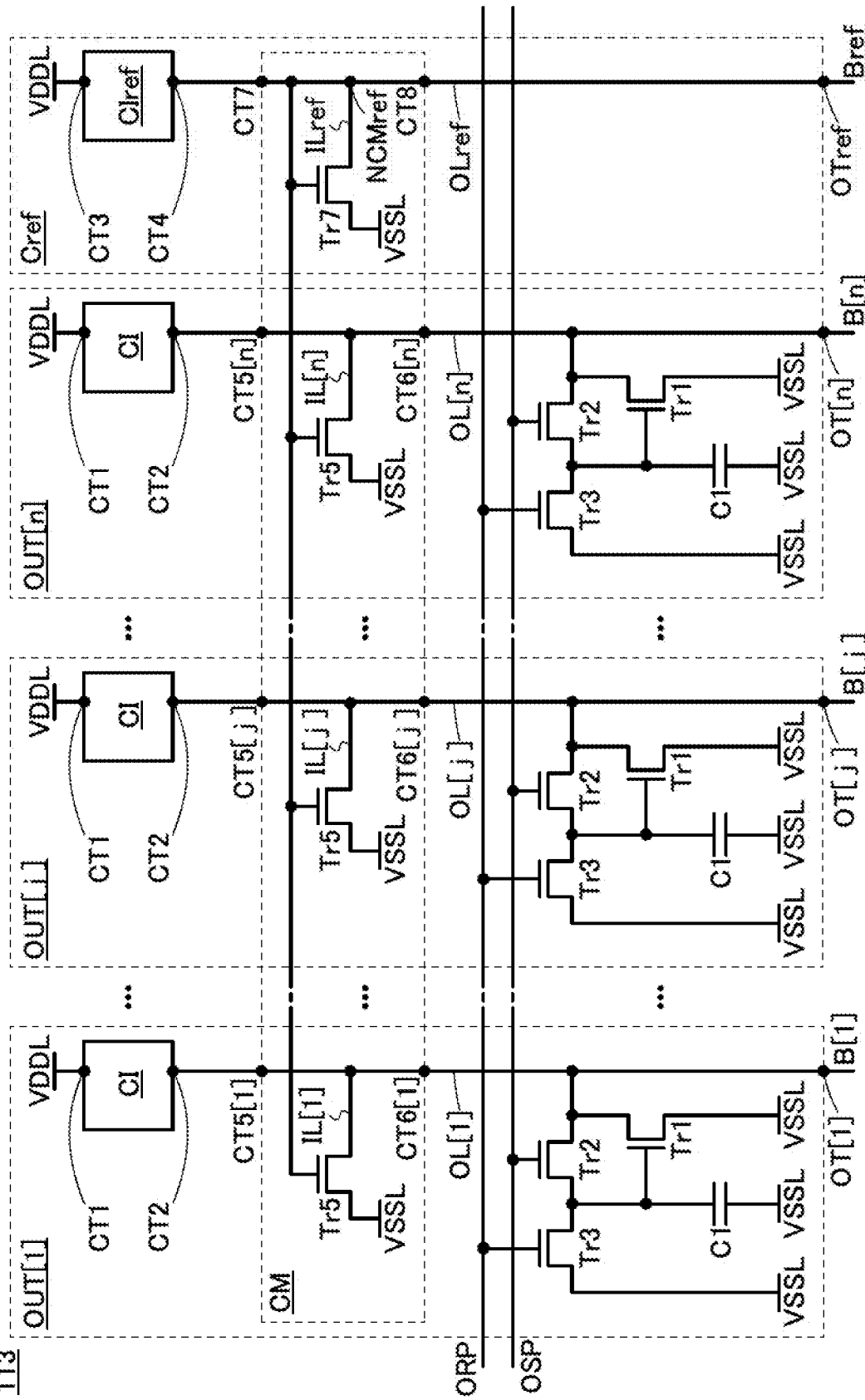
FIG. 4 is a circuit diagram showing an example of an offset circuit in the semiconductor device of FIG. 1.

An offset circuit 113 shown in FIG. 4 is a circuit diagram of an internal structure example of the current mirror circuit CM included in the offset circuit 111 shown in FIG. 2.

In the current mirror circuit CM, each of the column output circuits OUT[1] to OUT[n] includes a transistor Try, and the reference column output circuit C$_{ref}$ includes a transistor Tr7.

A first terminal of the transistor Tr5 in the column output circuit OUT[j] is electrically connected to the terminal CT5[j] and the terminal CT6[j] of the current mirror circuit CM. A second terminal of the transistor Tr5 in the column output circuit OUT[j] is electrically connected to the wiring VS SL. A gate of the transistor Tr5 in the column output circuit OUT[j] is electrically connected to the terminal CT7 and the terminal CT8 in the current mirror circuit CM.

A first terminal of the transistor Tr7 in the reference column output circuit C$_{ref}$ is electrically connected to the terminal CT7 and the terminal CT8 of the current mirror circuit CM. A second terminal of the transistor Tr7 in the reference column output circuit C$_{ref}$ is electrically connected to the wiring VSSL. A gate of the transistor Tr7 in the reference column output circuit C$_{ref}$ is electrically connected to the terminal CT7 and the terminal CT8 of the current mirror circuit CM.

In the above connection structure, a potential of the node NCM$_{ref}$ can be applied to the gate of the transistor Tr5 in each of the column output circuits OUT[1] to OUT[n], and the amount of current flowing between a source and a drain of the transistor Tr7 can be equalized to the amount of current flowing between a source and a drain of the transistor Tr5 in each of the column output circuits OUT[1] to OUT [n].

Each of the transistor Tr5 and the transistor Tr7 is preferably an OS transistor. In addition, each channel formation region in the transistors Tr5 and Tr7 is preferably formed using an oxide containing at least one of indium, the element M, and zinc. It is further preferable that the transistors Tr5 and Tr7 have a structure of a transistor described in Embodiment 5.

With use of the OS transistors as the transistors Tr5 and Tr7, the leakage current of each of the transistors Tr5 and Tr7 can be suppressed, which enables a product-sum operation circuit with high calculation accuracy to be achieved in some cases.

In the offset circuit 113 shown in FIG. 4, only the following components are shown: the column output circuit OUT[1]; the column output circuit OUT[j]; the column output circuit OUT[n]; the reference column output circuit C$_{ref}$; the constant current circuit CI; the constant current circuit CI$_{ref}$; the current mirror circuit CM; the output terminal OT[1]; the output terminal OT[j]; the output terminal OT[n]; the output terminal OT$_{ref}$; the terminal CT1; the terminal CT2; the terminal CT3; the terminal CT4; the terminal CT5[1]; the terminal CT5[j]; the terminal CT5[n]; the terminal CT6[1]; the terminal CT6[j]; the terminal CT6[n]; the terminal CT7; the terminal CT8; the transistor Tr1; the transistor Tr2; the transistor Tr3; the transistor Try; the transistor Tr7; the capacitor C1; the wiring OL[1]; the wiring OL[j]; the wiring OL[n]; the wiring OL$_{ref}$; the wiring ORP; the wiring OSP; the wiring B[1]; the wiring B[j]; the wiring B[n]; the wiring B$_{ref}$; the wiring IL[1]; the wiring IL[j]; the wiring IL[n]; the wiring IL$_{ref}$; the node NCM$_{ref}$; the wiring VDDL; and the wiring VSSL. Other circuits, wirings, elements, and reference numerals thereof are not shown.

<<Memory Cell Array 120>>

Figure 5:
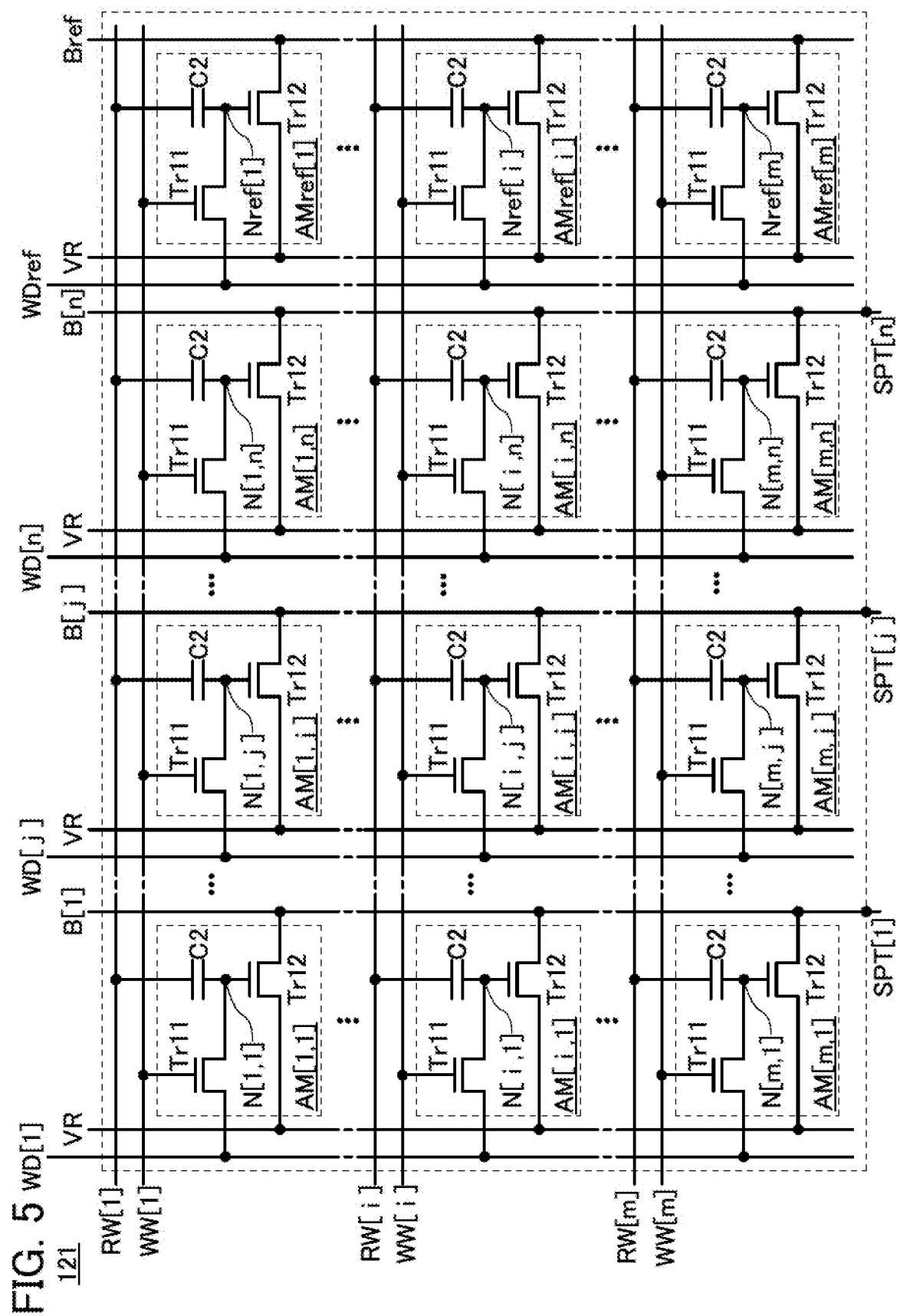
FIG. 5 is a circuit diagram showing an example of a memory cell array in the semiconductor device of FIG. 1.

Next, a circuit configuration example that can be employed in the memory cell array 120 is described. FIG. 5 shows a memory cell array 121 as an example of the memory cell array 120.

The memory cell array 121 includes the memory cells AM and the memory cells AM$_{ref}$. Each of the memory cells AM included in the memory cell array 121 includes a transistor Tr11, a transistor Tr12, and a capacitor C2. The memory cells AM$_{ref}$[1] to AM$_{ref}$[m] each include the transistor Tr11, the transistor Tr12, and the capacitor C2.

For the connection structure in the memory cell array 121, the explanation is made with a focus on the memory cell AM[i,j]. A first terminal of the transistor Tr11 is electrically connected to a gate of the transistor Tr12 and a first terminal of the capacitor C2. A second terminal of the transistor Tr11 is electrically connected to the wiring WD[j]. A gate of the transistor Tr11 is electrically connected to the wiring WW[i]. A first terminal of the transistor Tr12 is electrically connected to the wiring B[j], and a second terminal of the transistor Tr12 is electrically connected to the wiring VR. A second terminal of the capacitor C2 is electrically connected to the wiring RW[i].

In the memory cell AM[i,j], a connection portion of the first terminal of the transistor Tr11, the gate of the transistor Tr12, and the first terminal of the capacitor C2 is a node N[i,j]. In one embodiment of the present invention, a potential corresponding to the first analog data is retained at the node N[i,j].

Next, the explanation is made with a focus on the memory cell AM$_{ref}$[i]. The first terminal of the transistor Tr11 is electrically connected to the gate of the transistor Tr12 and the first terminal of the capacitor C2. A second terminal of the transistor Tr11 is electrically connected to the wiring WD$_{ref}$. A gate of the transistor Tr11 is electrically connected to the wiring WW[i]. A first terminal of the transistor Tr12 is electrically connected to the wiring B$_{ref}$. A second terminal of the transistor Tr12 is electrically connected to the wiring VR. A second terminal of the capacitor C2 is electrically connected to the wiring RW[i].

In the memory cell AM$_{ref}$[i], a connection portion of the first terminal of the transistor Tr11, the gate of the transistor Tr12, and the first terminal of the capacitor C2 is a node N$_{ref}$[i].

Note that each of the transistor Tr11 and the transistor Tr12 is preferably an OS transistor. In addition, each channel formation region in the transistors Tr11 and Tr12 is preferably formed using an oxide containing at least one of indium, the element M, and zinc. It is further preferable that the transistors Tr11 and Tr12 have a structure of a transistor described in Embodiment 5.

With use of the OS transistors as the transistors Tr11 and Tr12, the leakage current of each of the transistors Tr11 and Tr12 can be suppressed, which enables a product-sum operation circuit with high calculation accuracy to be achieved in some cases. Furthermore, with use of the OS transistor as the transistor Tr11, the amount of leakage current from a retention node to a writing word line can be extremely small when the transistor Tr11 is in an off state. In other words, frequencies of refresh operation at the retention node can be reduced; thus, power consumption of a semiconductor device can be reduced.

Furthermore, when all of the above-described transistors Tr1 to Tr7, Tr11, and Tr12 are OS transistors, a manufacturing process of the semiconductor device can be shortened. Thus, a time needed for manufacturing semiconductor devices can be shortened, and the number of devices manufactured in a certain time period can be increased.

Note that the transistor Tr1, the transistors Tr4 to Tr7, and the transistor Tr12 operate in a saturation region unless otherwise specified. In other words, the gate voltage, source voltage, and drain voltage of each of the transistor Tr1, the transistors Tr4 to Tr7, and the transistor Tr12 are appropriately biased so that the transistors operate in the saturation region. Note that even when the operations of the transistor Tr1, the transistors Tr4 to Tr7, and the transistor Tr12 are deviated from ideal operation in a saturation region, the gate voltage, source voltage, and drain voltage of each of the transistors are regarded as being appropriately biased as long as the accuracy of output data is within a desired range.

In the memory cell array 121 shown in FIG. 5, only the following components are shown: the memory cell AM[1,1]; the memory cell AM[i,1]; the memory cell AM[m, 1]; the memory cell AM[1,j]; the memory cell AM[i,j]; the memory cell AM[m,j]; the memory cell AM[1,n]; the memory cell AM[i,n]; the memory cell AM[m,n]; the memory cell $AM_{ref}$[1]; the memory cell $AM_{ref}$[i]; the memory cell $AM_{ref}$[m]; the wiring RW[1]; the wiring RW[i]; the wiring RW[m]; the wiring WW[1]; the wiring WW[i]; the wiring WW[m]; the wiring WD[1]; the wiring WD[j]; the wiring WD[n]; the wiring $WD_{ref}$; the wiring B[1]; the wiring B[j]; the wiring B[n]; the wiring $B_{ref}$; the wiring VR; the output terminal SPT[1]; the output terminal SPT[j]; the output terminal SPT[n]; a node N[1,1]; a node N[i,1]; a node N[m,1]; a node N[1,j]; the node N[i,j]; a node N[m,j]; a node N[1,n]; a node N[i,n]; a node N[m,n]; a node $N_{ref}$[1]; the node $N_{ref}$[i]; a node $N_{ref}$[m]; the transistor Tr11; the transistor Tr12; and the capacitor C2. Other circuits, wirings, elements, and reference numerals thereof are not shown.

Depending on circumstances or conditions or as needed, the semiconductor device of one embodiment of the present invention may have a combined structure of the above structure examples.

<Operation example>

An example of operation of the semiconductor device 100 of one embodiment of the present invention is described. Note that the semiconductor device 100 described in this operation example includes an offset circuit 150 shown in FIG. 6 as the offset circuit 110 and a memory cell array 160 shown in FIG. 7 as the memory cell array 120 of the semiconductor device 100.

Figure 6:
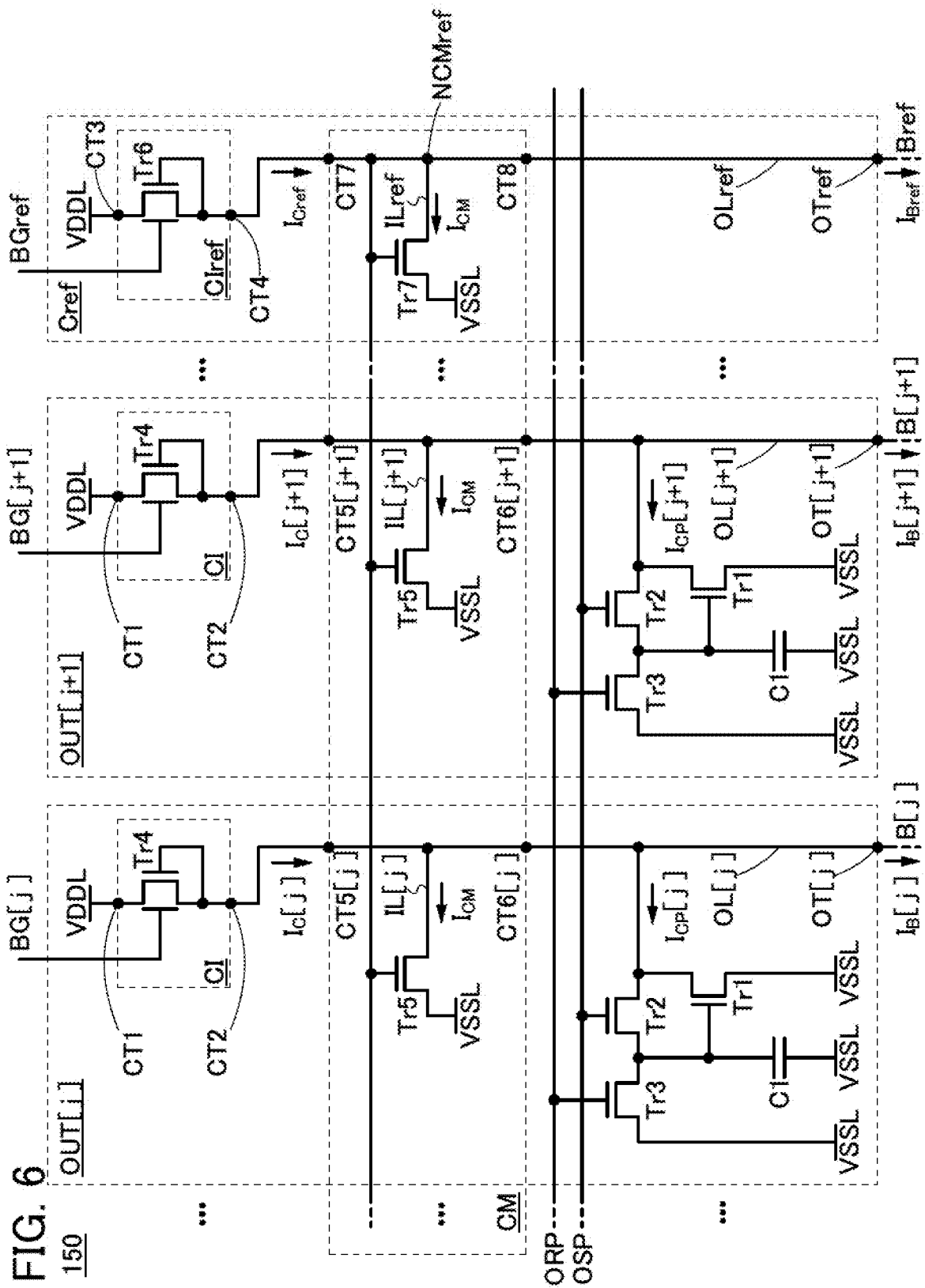
FIG. 6 is a circuit diagram showing an example of an offset circuit in the semiconductor device of FIG. 1.

The offset circuit 150 shown in FIG. 6 has a circuit configuration where the constant current circuit CI and the constant current circuit Chef of the offset circuit 112 in FIG. 3 and the current mirror circuit CM of the offset circuit 113 in FIG. 4 are used. With use of the structure as shown in FIG. 6, all of the transistors in the offset circuit 150 can have the same polarity. For the description of this operation example, FIG. 6 shows the column output circuit OUT[j], a column output circuit OUT[j+1], and the reference column output circuit $C_{ref}$.

In FIG. 6, Ic[j] denotes a current flowing from the first to second terminal of the transistor Tr4 in the constant current circuit CI of the column output circuit OUT[j], Ic[j+1] denotes a current flowing from the first to second terminal of the transistor Tr4 in the constant current circuit CI of the column output circuit OUT[j+1], and $I_{Cref}$ denotes a current flowing from the first to second terminal of the transistor Tr6 in the constant current circuit $CI_{ref}$ of the reference column output circuit $C_{ref}$. In the current mirror circuit CM, $I_{CM}$ collectively denotes a current flowing to the first terminal of the transistor Tr5 through the wiring IL[j] in the column output circuit OUT[j], a current flowing to the first terminal of the transistor Tr5 through a wiring IL[+1] in the column output circuit OUT[j+1], and a current flowing in the transistor Tr7 through the wiring $IL_{ref}$ in the reference column output circuit $C_{ref}$. Furthermore, $I_{CP}$[j] denotes a current flowing from the wiring OL[j] to the first terminal of the transistor Tr1 or Tr2 in the column output circuit OUT[j], and $I_{CP}$[j+1], denotes a current flowing from a wiring OL[j+1] to the first terminal of the transistor Tr1 or Tr2 in the column output circuit OUT[j+1]. Moreover, $I_B$[l] denotes a current outputted from the output terminal OT[j] of the column output circuit OUT[j] to the wiring B[j], $I_B$[+1] denotes a current outputted from an output terminal OT[j+1] of the column output circuit OUT[j+1] to a wiring B[+1], and $I_{Bref}$ denotes a current outputted from the output terminal $OT_{ref}$ of the reference column output circuit $C_{ref}$ to the wiring $B_{ref}$.

Figure 7:
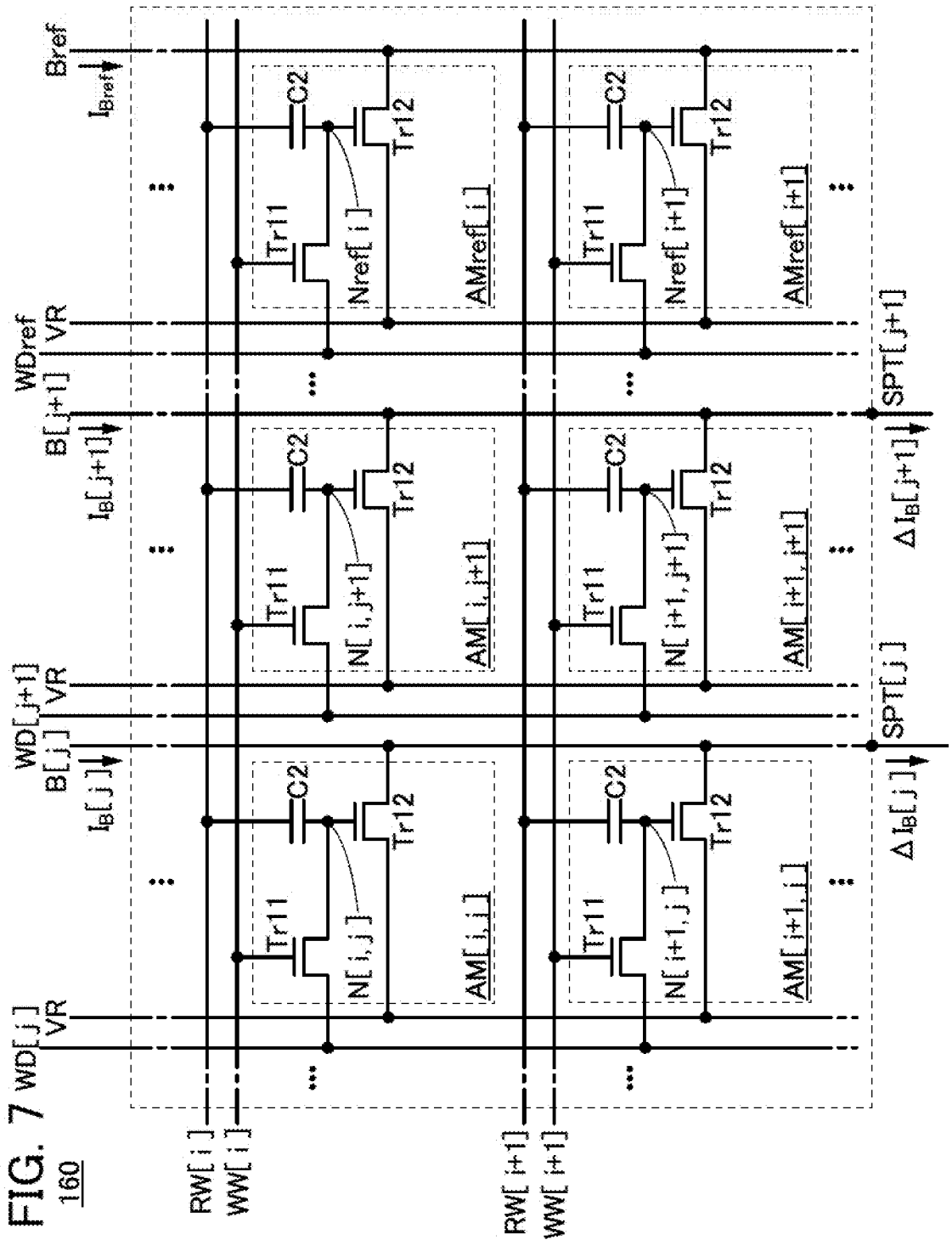
FIG. 7 is a circuit diagram showing an example of a memory cell array in the semiconductor device of FIG. 1.

The memory cell array 160 shown in FIG. 7 has a structure similar to that of the memory cell array 121 shown in FIG. 5. For the description of this operation example, FIG. 7 shows the memory cell AM[i,j], a memory cell AM[i+1], a memory cell AM[i,j+1], a memory cell AM[i+1,j+1], the memory cell $AM_{ref}$[i], and a memory cell $AM_{ref}$[i+1].

In FIG. 7, $I_B$[j] denotes a current inputted from the wiring B[j], $I_B$[j+1] denotes a current inputted from the wiring B[j+1], and $I_{Bref}$ denotes a current inputted from the wiring $B_{ref}$. In addition, $\Delta I_B$[j] denotes a current outputted from the output terminal SPT[j] that is electrically connected to the wiring B[j], and $\Delta I_B$[j+1] denotes a current outputted from an output terminal SPT[j+1] that is electrically connected to the wiring B[j+1].

Figure 8:
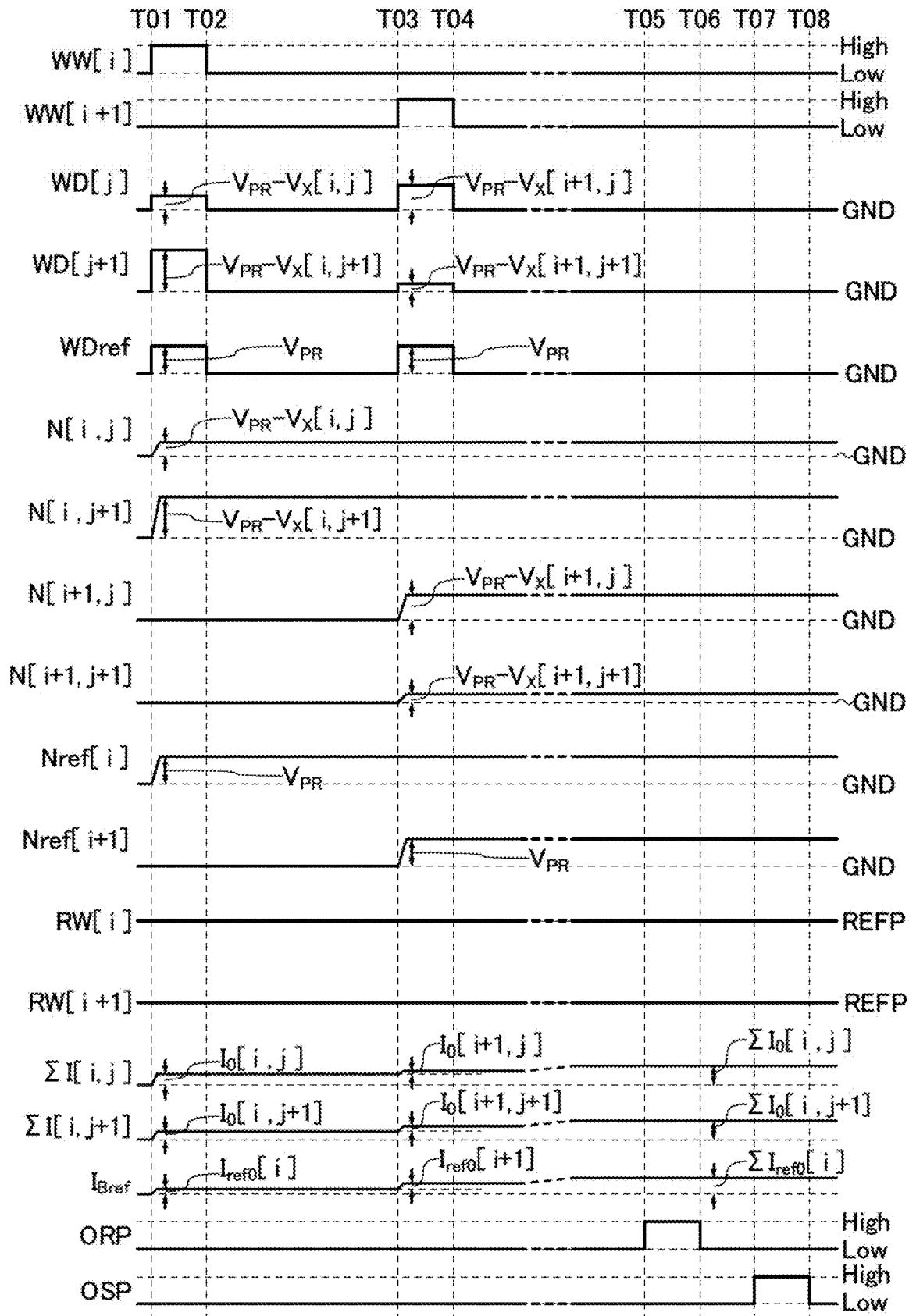
FIG. 8 is a timing chart showing an operation example of a semiconductor device.
Figure 9:
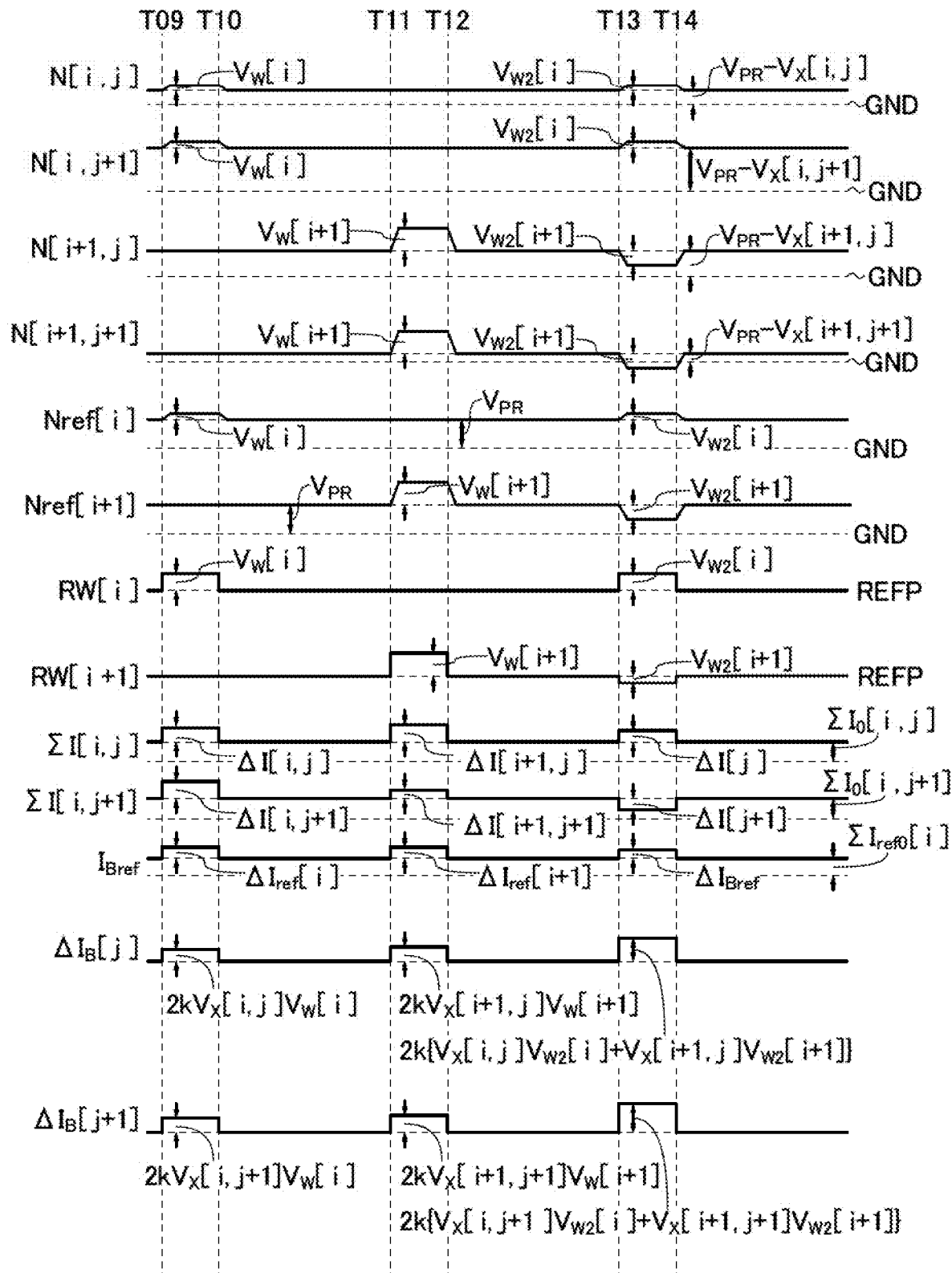
FIG. 9 is a timing chart showing an operation example of a semiconductor device.

FIG. 8 and FIG. 9 are timing charts showing the operation example of the semiconductor device 100. The timing chart in FIG. 8 shows changes in potentials from Time T01 to Time T08 of the wiring WW[i], a wiring WW[i+1], the wiring WD[j], a wiring WD[j+1], the wiring $WD_{ref}$, the node N[i,j], a node N[i,j+1], a node N[i+1,j], a node N[i+1,j+1], the node $N_{ref}$[i], a node $N_{ref}$[i+1], the wiring RW[i], a wiring RW[i+1], the wiring OSP, and the wiring ORP. This timing chart also shows the amount of changes in a current $\Sigma I$[i,j], a current $\Sigma I$[i,j+1], and a current $I_{Bref}$ from Time T01 to Time T08. Note that the current $\Sigma I$[i,j] is a value of current flowing in the transistor Tr12 of the memory cell AM[i,j], which is obtained by summing over i from 1 to m, and the current $\Sigma I$[i,j+1] is the sum of the amounts of a value of current flowing in the transistor Tr12 of the memory cell AM[i,j+1], which is obtained by summing over i from 1 to m. The operation example from Time T09 to Time T14 is shown in FIG. 9 as the rest of the operation shown in the timing chart in FIG. 8. At and after fter Time T09, the potentials of the wiring WW[i], the wiring WW[i+1], the wiring ORP, and the wiring OSP are kept at a low level without any change, and potentials of the wiring WD[j], the wiring WD[j+1], and the wiring WD$_{ref}$ are kept at a ground potential without any change. Thus, in the timing chart in FIG. 9, the changes in potentials of the wiring WW[i], the wiring WW[i+1], the wiring WD[j], the wiring WD[j+1], the wiring WD$_{ref}$, the wiring ORP, and the wiring OSP are not shown. Furthermore, the timing chart in FIG. 9 shows variations in the amount of current $\Delta I_B[j]$ and the amount of current $\Delta I_{B[j+1]}$ described later.

<<Period from Time T01 to Time T02>>

During a period from Time T01 to Time T02, a high-level potential (denoted by High in FIG. 8) is applied to the wiring WW[i], and a low-level potential (denoted by Low in FIG. 8) is applied to the wiring WW[i+1]. Furthermore, a potential higher than the ground potential (denoted by GND in FIG. 8) by $V_{PR}-V_x[i,j]$ is applied to the wiring WD[j], the potential higher than the ground potential by $V_{PR}-V_x[i,j+1]$ is applied to the wiring WD[j+1], and a potential higher than the ground potential by $V_{PR}$ is applied to the wiring WD$_{ref}$. Moreover, a reference potential (denoted by REFP in FIG. 8) is applied to the wiring RW[i] and the wiring RW[i+1].

The potential $V_x[i,j]$ and the potential $V_x[i,j+1]$ each correspond to the first analog data. The potential VPR corresponds to the reference analog data.

In this period, a high-level potential is applied to the gates of the transistors Tr11 in the memory cell AM[i,j], the memory cell AM[i,j+1], and the memory cell AM$_{ref}$[i]; accordingly, the transistors Tr11 in the memory cell AM[i,j], the memory cell AM[i,j+1], and the memory cell AM$_{ref}$[i] are turned on. Thus, in the memory cell AM[i,j], the wiring WD[j] and the node N[i,j] are electrically connected to each other, and the potential of the node N[i,j] is $V_{PR}-V_x[i,j]$. In the memory cell AM[i,j+1], the wiring WD[j+1] and the node N[i,j+1] are electrically connected to each other, and the potential of the node N[i,j+1] is $V_{PR}-V_x[i,j+1]$. In the memory cell AM$_{ref}$[i], the wiring WD$_{ref}$ and the node N$_{ref}$[i] are electrically connected to each other, and the potential of the node N$_{ref}$[i] is $V_{PR}$. A current flowing from the first to second terminal of the transistor Tr12 in each of the memory cell AM[i,j], the memory cell AM[i,j+1], and the memory cell AM$_{ref}$[i] is considered. The current $I_0[i,j]$ flowing from the wiring B[j] to the second terminal through the first terminal of the transistor Tr12 in the memory cell AM[i,j] can be expressed by the following formula.

$$I_0[i,j]=k(V_{PR}-V_x[i,j]-V_{th})^2 \quad (E1)$$

In the formula, k is a constant determined by the channel length, the channel width, the mobility, the capacitance of a gate insulating film, and the like of the transistor Tr12. Furthermore, $V_{th}$ is a threshold voltage of the transistor Tr12.

At this time, the current flowing from the wiring B[j] to the second terminal through the first terminal of the transistor Tr12 in the memory cell AM[i,j] is $I_0[i,j]$.

The current $I_0[i,j+1]$ flowing from the wiring B[j+1] to the second terminal through the first terminal of the transistor Tr12 in the memory cell AM[i,j+1] can be expressed by the following formula.

$$I_0[i,j+1]=k(V_{PR}-V_x[i,j+1]-V_{th})^2$$

At this time, the current flowing from the wiring B[j+1] to the second terminal through the first terminal of the transistor Tr12 in the memory cell AM[i,j 30 1] is $I_0[i,j+1]$.

The current $I_{ref0}[i]$ flowing from the wiring B$_{ref}$ to the second terminal through the first terminal of the transistor Tr12 in the memory cell AM$_{ref}$[i] can be expressed by the following formula.

$$I_{ref0}[i]=k(V_{PR}-V_{th})^2 \quad (E2)$$

At this time, the current flowing from the wiring B$_{ref}$ to the second terminal through the first terminal of the transistor Tr12 in the memory cell AM$_{ref}$[i] is $I_{ref0}[i]$.

Note that since the low-level potential is applied to the gates of the transistors Tr11 in the memory cell AM[i+1,j], the memory cell AM[i+1,j+1], and the memory cell AM$_{ref}$[i+1], the transistors Tr11 in the memory cell AM[i+1,j], the memory cell AM[i+1,j+1], the memory cell AM$_{ref}$[i+1] are turned off. Thus, the potentials are not retained at the node N[i+1,j], the node N[i+1, j+1], and the node N$_{ref}$[i+1].

<<Period from Time T02 to Time T03>>

During a period from Time T02 to Time T03, the low-level potential is applied to the wiring WW[i]. At this time, the low-level potential is applied to the gates of the transistors Tr11 in the memory cell AM[i,j], the memory cell AM[i,j+1], and the memory cell AM$_{ref}$[i], and accordingly, the transistors Tr11 in the memory cells AM[i,j], AM[i,j+1], and AM$_{ref}$[i] are turned off.

The low-level potential has been applied to the wiring WW[i+1] continuously since before Time T02. Thus, the transistors Tr11 in the memory cell AM[i+11], the memory cell AM[i+11+1], and the memory cell AM$_{ref}$[i+1] have been kept in an off state since before Time T02.

Since the transistors Tr11 in the memory cell AM[i,j], the memory cell AM[i,j1+], the memory cell AM[i+1], the memory cell AM[i+1,j+1], the memory cell AM$_{ref}$[i], and the memory cell AM$_{ref}$[i+1] are each in an off state as described above, the potentials at the node the node N[i,j], the node N[i,j+1], the node N[i+1, j+1], the node N$_{ref}$[i], and the node N$_{ref}$[i+1] are retained in a period from Time T02 to Time T03.

In particular, when an OS transistor is used as each of the transistors Tr11 in the memory cell AM[i,j], the memory cell AM[i,j+1], the memory cell AM[i+11], the memory cell AM[i+1,j+1], the memory cell AM$_{ref}$[i], and the memory cell AM$_{ref}$[i+1] as described in the circuit configuration of the semiconductor device 100, the amount of leakage current flowing between the sources and the drains of the transistors Tr11 can be made small, which makes it possible to retain the potentials at the nodes for a long time.

During the period from Time T02 to Time T03, the ground potential is applied to the wiring WD[j], the wiring WD[j+1], and the wiring WD$_{ref}$. Since the transistors Tr11 in the memory cell AM[i,j], the memory cell AM[i,j1+], the memory cell AM[i+1,j], the memory cell AM[i+1,j+1], the memory cell AM$_{ref}$[i], and the memory cell AM$_{ref}$[i+1] are each in an off state, the potentials retained at the nodes in the memory cell AM[i,j], the memory cell AM[i,j+1], the memory cell AM[i+1,j], the memory cell AM[i+1,j+1], the memory cell AM$_{ref}$[i], and the memory cell AM$_{ref}$[i+1] are not rewritten by application of potentials from the wiring WD[j], the wiring WD[j+1], and the wiring WD$_{ref}$.

<<Period from Time T03 to Time T04>>

During a period from Time T03 to Time T04, the low-level potential is applied to the wiring WW[i], and a high-level potential is applied to the wiring WW[i+1]. Furthermore, the potential higher than the ground potential by $V_{PR}-V_x[i+1,j]$ is applied to the wiring WD[j], the potential higher than the ground potential by $V_{PR}-V_x[i+1,j+1]$ is applied to the wiring WD[j+1,] and the potential higher than the ground potential by $V_{PR}$ is applied to the wiring WD$_{ref}$. Moreover, the reference potential is continuously being applied to the wiring RW[i] and the wiring RW[i+1] continuously since Time T02.

Note that the potential $V_x[i+1,j]$ and the potential $V_x[i+1,j+1]$ are each a potential corresponding to the first analog data.

In this period, the high-level potential is applied to the gates of the transistors Tr11 in the memory cell AM[i+1,j] the memory cell AM[i+1,j+1], and the memory cell AM$_{ref}$[i+1], and accordingly, the transistors Tr11 in the memory cell AM[i+1,j], the memory cell AM[i+1,j+1], and the memory cell AM$_{ref}$[i+1] are each brought into an on state. Thus, the node N[i+1,j] in the memory cell AM[i+1,j] is electrically connected to the wiring WD[j], and the potential of the node N[i+1,j+1] becomes $V_{PR}-V_x[i+1,k+1]$. In the memory cell AM[i+1,j+1], the wiring WD[j+1] and the node N[i+1,j+1] are electrically connected to each other, and the potential of the node N[i+1,j+1] becomes $V_{PR}-V_x[i+1,j+1]$. In the memory cell AM$_{ref}$[i+1], the wiring WD$_{ref}$ and the node N$_{ref}$[i+1] are electrically connected to each other, and the potential of the node N$_{ref}$[i+1] becomes VPR.

The current flowing from the first to second terminal of the transistor Tr12 in each of the memory cell AM[i+1,j], the memory cell AM[i+1,j+1], and the memory cell AM$_{ref}$[i+1] is considered. The current $I_0[i+1,j]$ flowing from the wiring B[j] to the second terminal through the first terminal of the transistor Tr12 in the memory cell AM[i+1,j] can be expressed by the following formula.

$$I_0[i+1,j]=k(V_{PR}-V_x[i+1,j]-V_{th})^2$$

At this time, the current flowing from the wiring B[j] to the second terminal through the first terminal of the transistor Tr12 in the memory cell AM[i+1,j] is $I_0[i,j]+I_0[i+1,j]$.

The current $I_0[i+1,j+1]$ flowing from the wiring B[j+1] to the second terminal through the first terminal of the transistor Tr12 in the memory cell AM[i+1,j+1] can be expressed by the following formula.

$$I_0[i+1,j+1]=k(V_{PR}-V_x[i+1,j+1]-V_{th})^2$$

At this time, the current flowing from the wiring B[j+1] to the second terminal through the first terminal of the transistor Tr12 in the memory cell AM[i+1,j+1] is $I_0[i,j+1]+I_0[i+1,j+1]$.

The current $I_{ref0}[i+1]$ flowing from the wiring B$_{ref}$ to the second terminal through the first terminal of the transistor Tr12 in the memory cell AM$_{ref}$[i+1] can be expressed by the following formula.

$$I_{ref0}[i+1]=k(V_{PR}-V_{th})^2$$

At this time, the current flowing from the output terminal OT$_{ref}$ of the reference column output circuit C$_{ref}$ to the wiring B$_{ref}$ is $I_{ref0}[i]+I_{ref0}[i+1]$.

<<Period from Time T04 to Time T05>>

During a period from Time T04 to Time T0S, the potential corresponding to the first analog data is written to the rest of the memory cells AM, and the potential $V_{PR}$ is written to the rest of memory cells AM$_{ref}$, in a manner similar to that of the operation during the period from Time T01 to Time T02 and that of the operation during the period from Time T03 to Time T04. Thus, the total amount of currents flowing in the transistors Tr12 in all of the memory cells AM corresponds to the amount of current flowing from the output terminal OT[j] of the column output circuit OUT[j] to the wiring B[j] which is denoted by $\Sigma I_0[i,j]$ ($\Sigma$ represents the current obtained by summing over i from 1 to m).

Here, the reference column output circuit C$_{ref}$ is focused on. The total amount of current flowing through the transistors Tr12 in the memory cells AM$_{ref}$[1] to AM$_{ref}$[m] flows into the wiring B$_{ref}$ of the reference column output circuit C$_{ref}$. In other words, the current $I_{Bref}\Sigma I_{ref0}[i]$ ($\Sigma$ represents the current obtained by summing over i from 1 to m) flows into the wiring B$_{ref}$.

Although the current flowing in the wiring IL$_{ref}$ is denoted by $I_{CM}$ in FIG. 6, the current flowing in the wiring IL$_{ref}$ before Time T09 is denoted by $I_{CM0}$ in this specification.

The current $I_{Cref}$ is outputted from the terminal CT4 of the constant current circuit CI$_{ref}$. Thus, $I_{CM0}$ is determined by setting the potential of the gate of the transistor Tr7 (potential of the node NCM$_{ref}$) so that the following formula is satisfied.

$$I_{Cref} - I_{CM0} = \sum_i I_{ref0}[i] \qquad (E3)$$

Note that since the potential of the gate of the transistor Tr7 (potential of the node NCM$_{ref}$) is used as a reference in the current mirror circuit CM, the current $I_{CM0}$ also flows in the wirings IL[1] to IL[n] of the column output circuits OUT[1] to OUT[n].

<<Period from Time T0 to Time T06>>

During a period from Time T5 to Time T06, the wiring ORP is set at the high-level potential. At this time, the high-level potential is applied to the gates of the transistors Tr3 in the column output circuits OUT[1] to OUT[n], so that the transistors Tr3 are brought into an on state. Concurrently, the low-level potential is applied to the first terminals of the capacitors C1 in the column output circuits OUT[1] to OUT[n], and thus the potentials of the capacitors C1 are initialized. When Time T06 starts, the low-level potential is applied to the wiring ORP, so that the transistors Tr3 in the column output circuits OUT[1] to OUT[n] are brought into an off state.

<<Period from Time T06 to Time T07>>

During a period from Time T06 to Time T07, the wiring ORP is set to the low-level potential. In the above manner, the low-level potential is applied to the gates of the transistors Tr3 in the column output circuits OUT[1] to OUT[n], so that the transistors Tr3 are brought into an off state.

<<Period from Time T07 to Time T08>>

During a period from Time T07 to Time T08, the wiring OSP is set at the high-level potential. In the above manner, the high-level potential is applied to the gates of the transistors Tr2 in the column output circuits OUT[1] to OUT[n], so that the transistors Tr2 are brought into an on state. At this time, the current flows into the first terminals of the capacitors C1 from the first terminals of the transistors Tr2 through the second terminals of the transistors Tr2, and the potentials are retained in the capacitors C1. Thus, the potentials of the gates of the transistors Tr1 are retained, so that the current corresponding to the potentials of the gates of the transistors Tr1 flows between the sources and the drains of the transistors Tr1.

When Time T08 starts, the low-level potential is applied to the wiring OSP, so that the transistors Tr2 in the column output circuits OUT[1] to OUT[n] are brought into an off state. The potentials of the gates of the transistors Tr1 are retained in the capacitors C1, so that even after Time T08, the same amount of current keeps flowing between the sources and the drains of the transistors Tr1.

Here, the column output circuit OUT[j] is focused on. In the column output circuit OUT[j], the current flowing between the source and the drain of the transistor Tr1 is denoted by $I_{cp}[j]$, and the current flowing between the source and the drain of the transistor Tr4 of the constant current circuit CI is denoted by $I_C[j]$. The current flowing between the source and the drain of the transistor Tr5 through the current mirror circuit CM is $I_{CM0}$. On the assumption that the current is not outputted from the output terminal SPT[j] from Time T1 to Time T8, the sum of the amounts of current flowing through each of the transistors Tr12 in the memory cells AM[1] to AM[n] flows in the wiring B[j] of the column output circuit OUT[j]. In other words, the current $\Sigma I_0[i,j]$ ($\Sigma$ represents the current obtained by summing over i from 1 to m) flows in the wiring B[j]. Thus, the above satisfies the following formula.

$$I_C[j] - I_{CM0} - I_{CP}[j] = \sum_i I_0[i,j] \tag{E4}$$

<<Period from Time T09 to Time T10>>

The operation from Time T is described with reference to FIG. 9. During a period from Time T09 to Time T10, a potential higher than the reference potential (denoted by REFP in FIG. 9) by $V_w[i]$ is applied to the wiring RW[i]. At this time, the potential $V_w[i]$ is applied to the second terminals of the capacitors C2 in the memory cells AM[i,1] to AM[i,n] and the memory cell $AM_{ref}[i]$, so that the potentials of the gates of the transistors Tr12 increase.

Note that the potential $V_w[i]$ is a potential corresponding to the second analog data.

An increase in the potential of the gate of the transistor Tr12 corresponds to the potential obtained by multiplying a change in potential of the wiring RW[i] by a capacitive coupling coefficient determined by the memory cell structure. The capacitive coupling coefficient is calculated on the basis of the capacitance of the capacitor C2, the gate capacitance of the transistor Tr2, and the parasitic capacitance. In this operation example, to avoid complexity of description, an increase in potential of the wiring RW[i] is equal to an increase in potential of the gate of the transistor Tr12, which corresponds to a case where the capacitive coupling coefficient in each of the memory cells AM and the memory cell $AM_{ref}$ is set to 1.

When the potential $V_w[i]$ is applied to the second terminals of the capacitors C2 in the memory cell AM[i,j], the memory cell AM[i,j+1], and the memory cell $AM_{ref}[i]$ on the assumption that the capacitive coupling coefficient is 1, the potentials of the node N[i,j], the node N[i,j+1], and the node $N_{ref}[i]$ each increase by $V_w[i]$.

The current flowing from the first to second terminal of the transistor Tr12 in each of the memory cell AM[i,j], the memory cell AM[i,j+1], and the memory cell $AM_{ref}[i]$ is described. The current I[i,j] flowing from the wiring B[j] to the second terminal through the first terminal of the transistor Tr12 in the memory cell AM[i,j] can be expressed by the following formula.

$$I[i,j] = k(V_{PR} - V_X[i,j] + V_W[i] - V_{th})^2 \tag{E5}$$

other words, by application of the potential $V_W[i]$ to the wiring RW[i], the current flowing from the wiring B[j] to the second terminal through the first terminal of the transistor Tr12 in the memory cell AM[i,j] increases by I[i,j]−I₀[i,j] (denoted by $\Delta[i,j]$ in FIG. 9).

The current I[i,j+1] flowing from the wiring B[j+1] to the second terminal through the first terminal of the transistor Tr12 in the memory cell AM[i,j+1] can be expressed by the following formula.

$$I[i,j+1] = k(V_{PR} - V_X[i,j+1] + V_W[i] - V_{th})^2$$

In other words, by application of the potential $V_W[i]$ to the wiring RW[i], the current flowing from the wiring B[j+1] to the second terminal through the first terminal of the transistor Tr12 in the memory cell AM[i,j+1] increases by I[i,j+1]−I₀[i,j+1] (denoted by $\Delta I[i,j+1]$ in FIG. 9).

Furthermore, the current $I_{ref}[i]$ flowing from the wiring $B_{ref}$ to the second terminal through the first terminal of the transistor Tr12 in the memory cell $AM_{ref}[i]$ can be expressed by the following formula.

$$I_{ref}[i] = k(V_{PR} + V_W[i] - V_{th})^2 \tag{E6}$$

In other words, by application of the potential $V_W[i]$ to the wiring RW[i], the current flowing from the wiring $B_{ref}$ to the second terminal through the first terminal of the transistor Tr12 in the memory cell $AM_{ref}[i]$ increases by $I_{ref}[i] - I_{ref0}[i]$ (denoted by $\Delta I_{ref}[i]$ in FIG. 9).

Here, the reference column output circuit $C_{ref}$ is focused on. The total amount of current flowing through the transistors Tr12 in the memory cells $AM_{ref}[1]$ to $AM_{ref}[M]$ flows into the wiring $B_{ref}$ of the reference column output circuit $C_{ref}$. In other words, the current $I_{Bref} = \Sigma I_{ref0}[i]$ flows into the wiring $B_{ref}$.

The current $I_{Cref}$ is outputted from the terminal CT4 in the constant current circuit $CI_{ref}$. Thus, $I_{CM}$ is determined by setting the potential of the gate of the transistor Tr7 (potential of the node $NCM_{ref}$) so that the following formula is satisfied.

$$I_{Cref} - I_{CM} = \sum_i I_{ref}[i] \tag{E7}$$

Here, the current $\Delta I_B[j]$ outputted from the wiring B[j] is focused on. From Time T08 to Time T09, Formula (E4) is satisfied, and the current $\Delta I_B[j]$ is not outputted from the wiring B[j].

During the period from Time T09 to Time T10, a potential higher than the reference potential by $V_W[i]$ is applied to the wiring RW[i], and the current flowing between the source and the drain of the transistor Tr12 in the memory cell AM[i,j] changes. Then, the current $\Delta I_B[j]$ is outputted from the output terminal SPT[j] that is electrically connected to the wiring B[j]. Specifically, in the column output circuit OUT[j], the current $I_C[j]$ is outputted from the terminal CT2 of the constant current circuit CI, the current $I_{CM}$ flows between the source and the drain of the transistor Tr5, and the current $I_{CP}[j]$ flows between the source and the drain of the transistor Tr1. Thus, the current $\Delta I_B[j]$ can be expressed by the following formula using $\Sigma I[i,j]$ where the current flowing between the source and the drain of the transistor Tr12 in the memory cell AM[i,j] is calculated by summing over i from 1 to m.

$$\Delta I_B[j] = (I_C[j] - I_{CM} - I_{CP}[j]) - \sum_i I[i,j] \tag{E8}$$

Formulae (E1) to (E7) are applied to Formula (E8), so that the following formula can be obtained.

$$\Delta I_B[j] = 2k \sum_i (V_X[i,j] V_W[i]) \tag{E9}$$

According to Formula (E9), the current $\Delta I_B[j]$ is a value corresponding to the sum of products of the potential $V_X[i,j]$ that is the first analog data and the potential $V_W[i]$ that is the second analog data. Thus, when the current $\Delta I_B[j]$ is calculated, the value of the sum of products of the first analog data and the second analog data can be obtained.

During the period from Time T09 to Time T10, when all of the wirings RW[1] to RW[m] except the wiring RW[i] are set to have a reference potential, the relation, $V_W[g]=0$ (g is an integer that is greater than or equal to 1 and less than or equal to m and not i), is satisfied. Thus, according to Formula (E9), $\Delta I_B[j]=2kV_X[i,j]V_W[i]$ is outputted. In other words, the data corresponding to the product of the first analog data stored in the memory cell AM[i,j] and the second analog data corresponding to a selection signal supplied to the wiring RW[i] is outputted from the output terminal SPT[j] that is electrically connected to the wiring B[j].

Furthermore, a differential current outputted from the output terminal SPT[j+1] that is electrically connected to the wiring B[j+1] is expressed as $\Delta I_B[j+1]=2kV_X[i,j+1]V_W[i]$. The data corresponding to the product of the first analog data stored in the memory cell AM[i,j+1] and the second analog data corresponding to a selection signal supplied to the wiring RW[i] is outputted from the output terminal SPT[j+1] that is electrically connected to the wiring B[j+1].

<<Period from Time T10 to Time T11>>

During a period from Time T10 to Time T11, the ground potential is applied to the wiring RW[i]. The ground potential is applied to the second terminals of the capacitors C2 in the memory cells AM[i,1] to AM[i,n] and the memory cell $AM_{ref}[i]$. Thus, the potentials of the nodes N[i,1] to N[i,n] and the node $N_{ref}[i]$ return to the potentials during the period from Time T08 to Time T09.

<<Period from Time T11 to Time T12>>

During a period from Time T11 to Time T12, the wirings RW[1] to RW[m] except the wiring RW[i+1] are set to have the reference potential, and a potential higher than the reference potential by $V_W[i+1]$ is applied to the wiring RW[i+1]. At this time, as in the operation during the period from Time T09 to Time T10, the potential $V_W[i+1]$ is applied to the second terminals of the capacitors C2 in the memory cells AM[i+1,1] to AM[i+1,n] and the memory cell $AM_{ref}[i+1]$, so that the potentials of the gates of the transistors Tr12 increase.

The potential $V_{W[i+}1]$ corresponds to the second analog data.

As described above, the capacitive coupling coefficients of the memory cells AM and the memory cell $AM_{ref}$ are each 1. When the potential $V_W[i+1]$ is applied to the second terminals of the capacitors C2 in the memory cell AM[i+1,j], the memory cell AM[i+1,j+1], and the memory cell $AM_{ref}[i+1,]$, the potentials of the node N[i+1,j,] the node N[i+1,j+1], and the node $N_{ref}[i+1]$ each increase by $V_W[i+1]$.

When the potentials of the node N[i+1,j], the node N[i+1,j+1], and the node $N_{ref}[i+1]$ increase by $V_W[i+1]$, the amount of current flowing in each of the transistors Tr12 in the memory cell AM[i+1,j], the memory cell AM[i+1,j+1], and the memory cell $AM_{ref}[i+1]$ increases. When the current flowing in the transistor Tr12 in the memory cell AM[i+1,j] is denoted by I[i+1,j], the current flowing from the output terminal OT[j] of the column output circuit OUT[j] to the wiring B[j] increases by $I[i+1,j]-I_0[i+1,j]$ (denoted by $\Delta I[i+1,j]$ in FIG. 9). When the current flowing in the transistor Tr12 in the memory cell AM[i+1,j] is denoted by I[i+1,j+1],the current flowing from the output terminal OT[j+1] of the column output circuit OUT[j+1] to the wiring B[j+1] increases by $I[i+1,j+1]-I_0[i+1,j+1]$ (denoted by $\Delta I[i+1,j+1]$ in FIG. 9). When the current flowing in the transistor Tr12 in the memory cell $AM_{ref}[i+1]$ is denoted by $I_{ref}[i+1]$, the current flowing from the output terminal $OT_{ref}$ of the reference column output circuit $C_{ref}$ to the wiring $B_{ref}$ increases by $I_{ref}[i+1]-I_{ref0}[i+1]$ (denoted by $\Delta I_{ref}[i+1]$ in FIG. 9).

The operation during the period from Time T11 to Time T12 can be similar to the operation during the period from Time T09 to Time T10. Thus, when Formula (E9) is applied to the operation during the period from Time T11 to Time T12, the differential current outputted from the wiring B[j] is expressed as $\Delta I_B[j]=2kV_x[i+1,j]V_W[i+1]$. In other words, the data corresponding to the product of the first analog data stored in the memory cell AM[i+1,j] and the second analog data corresponding to a selection signal applied to the wiring RW[i+1] is outputted from the output terminal SPT[j] that is electrically connected to the wiring B[j].

Furthermore, the differential current outputted from the wiring B[j+1] is expressed as $\Delta I_B[j+1]=2kV_x[i+1,j+1]V_W[i+1]$. The data corresponding to the product of the first analog data stored in the memory cell AM[i+1,j+1] and the second analog data corresponding to a selection signal applied to the wiring RW[i+1] is outputted from the output terminal SPT[j+1] that is electrically connected to the wiring B[j+1].

<<Period from Time T12 to Time T13>>

During a period from Time T12 to Time T13, the ground potential is applied to the wiring RW[i+1]. In this period, the ground potential is applied to the second terminals of the capacitors C2 in the memory cells AM[i+1,1] to AM[i+1,n] and the memory cell $AM_{ref}[i+1]$, and the potentials of nodes N[i+1,1] to N[i+1,n] and the node $N_{ref}[i+1]$ return to the potentials in the period from Time T10 to Time T11.

<<Period from Time T13 to Time T14>>

During a period from Time T13 to Time T14, the wirings RW[1] to RW[m] except the wiring RW[i] and the wiring RW[i+1] are set to have the reference potential, a potential higher than the reference potential by $V_{W2}[i]$ is applied to the wiring RW[i], and a potential lower than the reference potential by $V_{W2}[i+1]$ is applied to the wiring RW[i+1]. At this time, as in the operation during the period from Time T09 to Time T10, the potential $V_{W2}[i]$ is applied to the second terminals of the capacitors C2 in the memory cells AM[i,1] to AM[i,n] and the memory cell $AM_{ref}[i]$, so that potentials of the gates of the transistors Tr12 in the memory cells AM[i,1] and the memory cell AM[i,n] increase. Concurrently, the potential $-V_{W2}[i+1]$ is applied to the second terminals of the capacitors C2 in the memory cells AM[i+1,1] to AM[i+1,n] and the memory cell $AM_{ref}[i+1]$, so that the potentials of the gates of the transistors Tr12 in the memory cells AM[i+1,1] to AM[i+1,n] and the memory cell $AM_{ref}[i+1]$ decrease.

The potential $V_{W2}[i]$ and the potential $V_{W2}[i+1]$ are potentials each corresponding to the second analog data.

Note that the capacitive coupling coefficients of the memory cell AM and the memory cell $AM_{ref}$ are each 1. When the potential $V_{W2}[i]$ is applied to the second terminals of the capacitors C2 in the memory cell AM[i,j], the memory cell AM[i,j+1], and the memory cell $AM_{ref}[i]$, the potentials of the node N[i,j], the node N[i,j+1], and the node $N_{ref}[i]$ each increase by $V_{W2}[i]$. When the potential $-V_{W2}[i+1]$ is applied to the second terminals of the capacitors C2 in the memory cell AM[i+1,j], the memory cell AM[i+1,j+1], and the memory cell $AM_{ref}[i+1]$, the potentials of the node N[i+1,j], the node N[i+1, j+1], and the node $N_{ref}[i+1]$ each decrease by $V_{W2}[i+1]$.

When each of the potentials of the node N[i,j], the node N[i,j+1], and the node $N_{ref}[i]$ increases by $V_{W2}[i]$, the amount of current flowing in each of the transistors Tr12 in the memory cell AM[i,j], the memory cell AM[i,j+1], and the memory cell $AM_{ref}[i]$ increases. Here, the current flowing in the transistor Tr12 in the memory cell AM[i,j] is denoted by $I[i,j]$, the current flowing in the transistor Tr12 in the memory cell $AM[i,j+1]$ is denoted by $I[i,j+1]$, and the current flowing in the transistor Tr12 in the memory cell $AM_{ref}[i]$ is denoted by $I_{ref[i]}$.

When the potentials of the node $N[i+1, j]$, the node $N[i+1,j+1]$, and the node $N_{ref}[i+1]$ each decrease by $V_{W2}[i+1]$, the amount of current flowing in each of the transistors Tr12 in the memory cell $AM[i+1,j]$, the memory cell $AM[i+1,j+1]$, and the memory cell $AM_{ref}[i+1]$ decreases. Here, the current flowing in the transistor Tr12 in the memory cell $AM[i+1,j]$ is denoted by $I_2[i,j]$, the current flowing in the transistor Tr12 in the memory cell $AM[i+1,j+1]$ is denoted by $I_2[i,j+1]$, and the current flowing in the transistor Tr12 in the memory cell $AM_{ref}[i+1]$ is denoted by $I_{2ref}[i+1]$.

At this time, the current flowing from the output terminal OT[j] of the column output circuit OUT[j] to the wiring B[j] increases by $(I_2[i,j]-31\ I_0[i,j])+(I_2[i+1,j]-I_0[i+1,j])$ (denoted by $\Delta I[j]$ in FIG. 9). The current flowing from the output terminal OT[j+1] of the column output circuit OUT[j+1] to the wiring B[j+1] increases by $(I_2[i,j+1]-I_0[i,j+1])+(I_2[i+1,j+1]-I_0[i+1,j+1])$ (denoted by $\Delta I[j+1]$ in FIG. 9, which is a negative current). The current flowing from the output terminal $OT_{ref}$ of the reference column output circuit $C_{ref}$ to the wiring $B_{ref}$ increases by $(I_{2ref}[i,j]-I_{ref0}[i,j])+(I_{2ref}[i+1,j]-I_{ref0}[i+1,j])$ (denoted by $\Delta I_{Bref}$ in FIG. 9).

The operation during the period from Time T13 to Time T14 can be similar to that operation during the period from Time T09 to Time T10. When Formula (E9) is applied to the operation during the period from Time T13 to Time T14, the differential current outputted from the wiring B[j] is expressed as $\Delta I_B[j]=2k\{V_X[i,j]V_{W2}[i]-V_x[i+1,j]V_{W2}[i+1]\}$. Thus, the data corresponding to the sum of products of the first analog data stored in each of the memory cell $AM[i,j]$ and the memory cell $AM[i+1,j]$ and the second analog data corresponding to a selection signal applied to each of the wiring RW[i] and the wiring RW[i+1] is outputted from the output terminal SPT[j] that is electrically connected from the wiring B[j].

The differential current outputted from the wiring B[j+1] is expressed as $\Delta IB[j+1]=2k\{V_X[i,j+1]V_{W2}[i]-V_x[i+1,j+1]V_{W2}[i+1]\}$. The data corresponding to the product of the first analog data stored in each of the memory cell $AM[i,j+1]$ and the memory cell $AM[i+1,j+1]$ and the second analog data corresponding to a selection signal applied to each of the wiring RW[i] and the wiring RW[i+1] is outputted from the output terminal SPT[j+1] that is electrically connected to the wiring B[j+1].

<<After Time T14>>

From and after Time T14, the ground potential is applied to the wiring RW[i] and the wiring RW[i+1]. At this time, the ground potential is applied to the second terminals of the capacitors C2 in the memory cells $AM[i,1]$ to $AM[i,n]$, the memory cells $AM[i+1,1]$ to $AM[i+1,n]$, the memory cell $AM_{ref}[i]$, and the memory cell $AM_{ref}[i+1]$. Thus, the potentials of the nodes $N[i,1]$ to $N[i,n]$, the nodes $N[i+1,1]$ to $N[i+1,n]$, the node $N_{ref}[i]$, and the node $N_{ref}[i+1]$ return to the potentials in the period from Time T12 to Time T13.

With the circuit configuration of FIG. 1, a plurality of product-sum operations can be executed concurrently. Thus, a semiconductor device enabling high-speed product-sum operation can be provided.

Note that this embodiment can be combined with any of the other embodiments in this specification as appropriate.

Embodiment 2

In this embodiment, application examples of the semiconductor device described in the above embodiment to electronic devices will be described with reference to FIGS. 10A to 10E.

<Electronic Component>

Figure 10C:
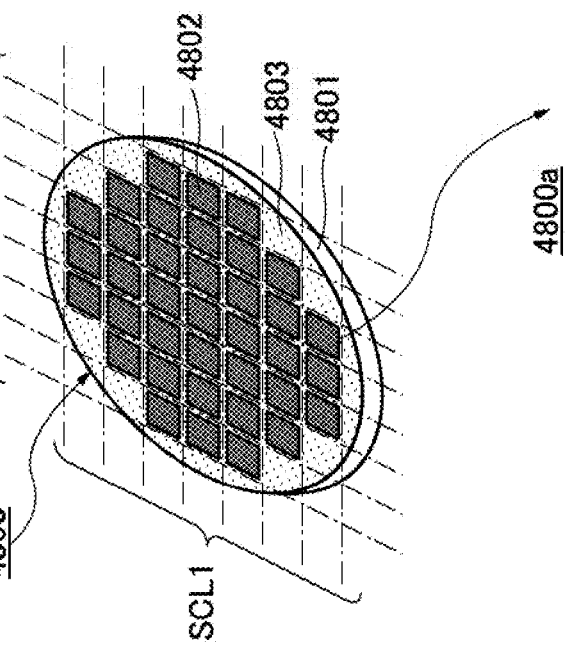
FIGS. 10A to 10E are a flow chart, a perspective view of an electronic component, and perspective views of a semiconductor wafer.
Figure 10D:
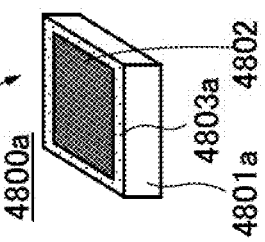
Figure 10B:
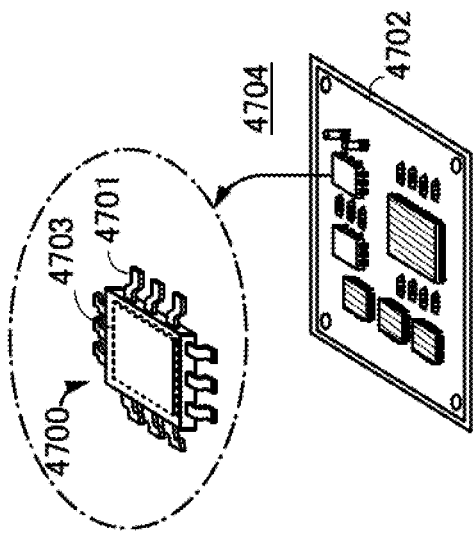
Figure 10E:
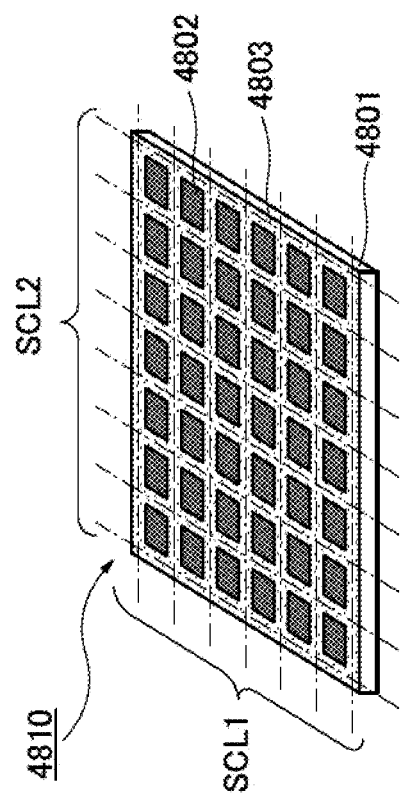
Figure 10A:
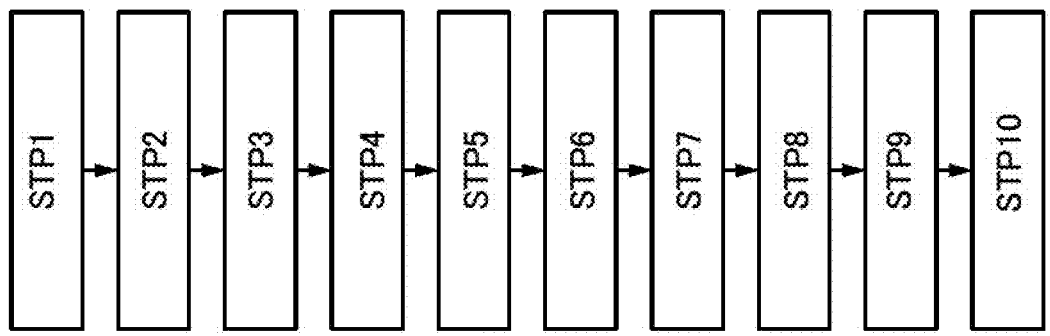

FIG. 10A illustrates an example where the semiconductor device described in the foregoing embodiment is used as a memory device in an electronic component. Note that the electronic component is also referred to as a semiconductor package or an IC package. This electronic component has a plurality of standards and names depending on a terminal extraction direction and a terminal shape. Thus, examples of the electronic component are described in this embodiment.

A semiconductor device including the transistors described in Embodiment 1 is completed through an assembly process (post-process) of integrating detachable components on a printed circuit board.

The post-process can be completed through steps in FIG. 10A. Specifically, after an element substrate obtained in the proceeding process is completed (Step STP1), a rear surface of the substrate is ground (Step STP2). The substrate is thinned in this step to reduce warpage or the like of the substrate in the proceeding process and to reduce the size of the component itself.

After the rear surface of the substrate is ground, a dicing step is performed to divide the substrate into a plurality of chips (Step STP3). Then, the divided chips are separately picked up, placed on a lead frame, and bonded thereto in a die bonding step (Step STP4).

In this die bonding step, the chip is bonded to the lead frame by an appropriate method depending on a product, for example, bonding with a resin or a tape. Note that in the die bonding step, the chip may be mounted on an interposer to be bonded.

Note that in this embodiment, when an element is formed on a surface of a substrate, the other surface is referred to as a rear surface (a surface on which the element is not formed).

Next, wire bonding for electrically connecting a lead of the lead frame and an electrode on a chip through a metal wire is performed (Step STP5). A silver line or a gold line can be used as the metal fine line. Ball bonding or wedge bonding can be used as the wire bonding.

A wire-bonded chip is subjected to a molding step of sealing the chip with an epoxy resin or the like (Step STP6). With the molding step, the inside of the electronic component is filled with a resin, thereby reducing damage to the circuit portion and the wire embedded in the component caused by external mechanical force as well as reducing deterioration of characteristics due to moisture or dust.

Next, plate processing is performed on the lead of the lead frame. Then, the lead is cut and processed into a predetermined shape (Step STP7). This plate processing prevents rust of the lead and facilitates soldering at the time of mounting the chip on a printed circuit board in a later step.

Next, printing (marking) is performed on a surface of the package (Step STP8). After a final testing step (Step STP9), the electronic component is completed (Step STP10).

The above electronic component can include the semiconductor device described in the above embodiment. Thus, a highly reliable electronic component can be obtained.

FIG. 10B is a schematic perspective diagram of the completed electronic component. FIG. 10B is a schematic perspective diagram of a quad flat package (QFP) as an example of the electronic component. An electronic component 4700 in FIG. 10B includes a lead 4701 and a circuit portion 4703. The electronic component 4700 in FIG. 10B is mounted on a printed circuit board 4702, for example. A plurality of electronic components 4700 which are combined and electrically connected to each other over the printed circuit board 4702 can be mounted on an electronic device. A completed circuit board 4704 is provided in an electronic device or the like.

One embodiment of the present invention is not limited to the shape of the electronic component 4700, and the element substrate fabricated in Step STP1 is included. In addition, the element substrate of one embodiment of the present invention includes an element substrate that has been subjected to Step STP2 where the rear surface of the substrate is ground. In addition, the element substrate of one embodiment of the present invention includes an element substrate that has been subjected to Step STP3 where the dicing step is performed. For example, a semiconductor wafer 4800 shown in FIG. 10C or the like corresponds to the element substrate. In the semiconductor wafer 4800, a plurality of circuit portions 4802 are formed on a top surface of a wafer 4801. A part without the circuit portions 4802 on the top surface of the wafer 4801 is a spacing 4803 that is a region for dicing.

The dicing is carried out along scribe lines SCL1 and scribe lines SCL2 (referred to as dicing line or cutting line in some cases) indicated by dashed-dotted lines. For performing the dicing step easily, the spacing 4803 is preferably provided such that a plurality of scribe lines SCL1 are parallel to each other, a plurality of scribe lines SCL2 are parallel to each other, and the scribe lines SCL1 and the scribe lines SCL2 are intersected perpendicularly with each other.

With the dicing step, a chip 4800a as shown in FIG. 10D can be cut out from the semiconductor wafer 4800. The chip 4800a includes a wafer 4801a, the circuit portion 4802, and a spacing 4803a. Note that it is preferable to provide the spacing 4803a to be made as small as possible. In this case, it is preferable that the width of the spacing 4803 between adjacent circuit portions 4802 be substantially the same as a length of margin for cutting of the scribe line SCL1 or the scribe line SCL2.

The shape of the element substrate of one embodiment of the present invention is not limited to the shape of the semiconductor wafer 4800 shown in FIG. 10C. For example, a rectangular semiconductor wafer 4810 shown in FIG. 10E can be employed. The shape of the element substrate can be changed as appropriate, depending on a process for fabricating an element and an apparatus for fabricating an element.

Note that this embodiment can be combined with any of the other embodiments in this specification as appropriate.

Embodiment 3

In this embodiment, application examples of the semiconductor device described in Embodiment 1 will be described.

Since the semiconductor device 100 functions as a product-sum operation circuit, the semiconductor device 100 can be used as one of components of an artificial neural network in some cases. The artificial neural network is an information processing system modeled on a biological neural network and enables the characteristics of a brain function to be expressed on a computer.

The artificial neural network has a configuration where units resembling neurons are connected to each other through units resembling synapses. It is considered that when the connection strength is changed, the artificial neural network learns about a variety of input patterns and comes to enable pattern recognition, associative storage, and data mining to be executed at high speed. In particular, a novel electronic device utilizing pattern recognition of sound, voice, music, images, videos, or the like can be achieved in some cases with the artificial neural network.

In the semiconductor device described in Embodiment 1, the first analog data serves as weight coefficients, and the second analog data corresponds to neuron outputs, whereby the weighting calculation of neuron outputs can be conducted concurrently. Thus, data corresponding to results of the weighting calculation, that is, synapse inputs can be obtained as the output signals.

<Electronic Device>

Here, electronic devices or systems utilizing the artificial neural network are described.

Figure 11A:
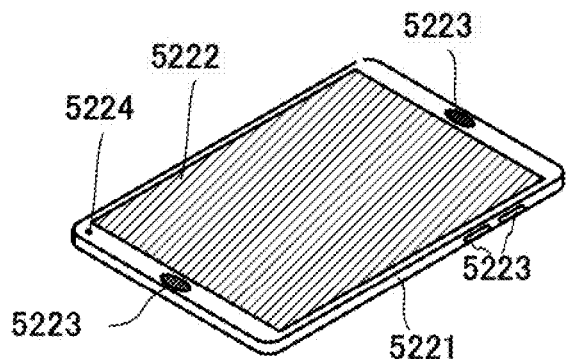
FIGS. 11A to 11D are perspective views illustrating examples of electronic devices.

FIG. 11A illustrates a tablet information terminal, which includes a housing 5221, a display portion 5222, operation buttons 5223, and a speaker 5224. A display device with a position input function may be used for a display portion 5222. Note that the position input function can be added by provision of a touch panel in a display device. Alternatively, the position input function can be added by providing a photoelectric conversion element called a photosensor in a pixel area of a display device. As the operation buttons 5223, any one of a power switch for starting the information terminal, a button for operating an application of the information terminal, a volume control button, a switch for turning on or off the display portion 5222, and the like can be provided. Although the number of the operation buttons 5223 is four in the information terminal illustrated in FIG. 11A, the number and position of operation buttons included in the information terminal is not limited to this example. Although not illustrated, the information terminal illustrated in FIG. 11A may be provided with a camera. Although not illustrated, the information terminal illustrated in FIG. 11A may include a light-emitting device for use as a flashlight or a lighting device. Although not illustrated, the information terminal illustrated in FIG. 11A may include a sensor (which measures force, displacement, position, speed, acceleration, angular velocity, rotational frequency, distance, light, liquid, magnetism, temperature, a chemical substance, a sound, time, hardness, electric field, current, voltage, electric power, radiation, flow rate, humidity, gradient, oscillation, smell, infrared rays, or the like) inside the housing 5221. In particular, when a sensing device including a sensor for detecting inclination, such as a gyroscope or acceleration sensor is provided, display on the screen of the display portion 5222 can be automatically changed in accordance with the orientation of the information terminal illustrated in FIG. 11A by determining the orientation of the information terminal (the orientation of the information terminal with respect to the vertical direction). In the case where a device for obtaining biological information of fingerprints, veins, iris, voice prints, or the like is provided, an information terminal having a function of biometric authentication can be obtained. In particular, the artificial neural network is used for the biometric authentication, whereby a high-accuracy authentication system can be formed in some cases. Furthermore, the application of the artificial neural network in the information terminal is not limited only to the authentication system. For example, in the information terminal utilizing the artificial neural network, speech interpretation can be performed in some cases. With the speech interpretation function, the information terminal can have a function of operating the tablet information terminal by speech recognition, a function of interpreting a speech or a conversation and creating a summary of the speech or the conversation, and the like. Thus, the tablet information terminal can be used as a text for learning foreign languages, for example. Alternatively, the tablet information terminal can be utilized to create meeting minutes or the like, for example.

Figure 11B:
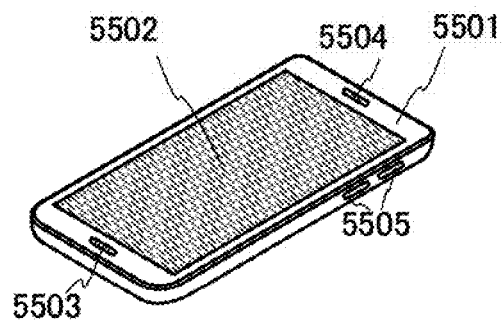

Note that without limitation to the tablet information terminal illustrated in FIG. 11A, one embodiment of the present invention may be a mode of a mobile phone (smartphone) as illustrated in FIG. 11B, which includes the small-sized information terminal illustrated in FIG. 11A and has a telephone function. The mobile phone illustrated in FIG. 11B includes a housing 5501, a display portion 5502, a microphone 5503, a speaker 5504, and operation buttons 5505. When a device for obtaining biological information of fingerprints, veins, iris, voice prints, or the like is provided for the mobile phone like the information terminal illustrated in FIG. 11A, an information terminal having a biometric authentication function utilizing the artificial neural network can be achieved in some cases. Furthermore, like the information terminal illustrated in FIG. 11A, the mobile phone may have a speech interpretation function utilizing the artificial neural network.

Figure 11C:
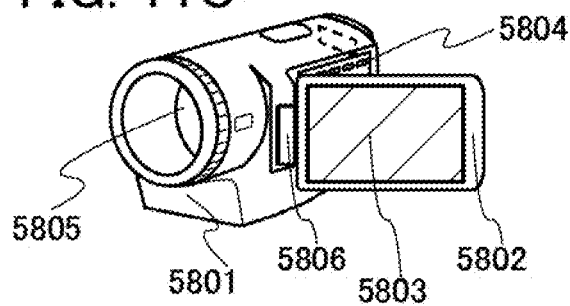

FIG. 11C illustrates a video camera including a first housing 5801, a second housing 5802, a display portion 5803, operation keys 5804, a lens 5805, a joint 5806, and the like. The semiconductor device of one embodiment of the present invention can be used for a variety of integrated circuits included in video cameras. The operation keys 5804 and the lens 5805 are provided in the first housing 5801, and the display portion 5803 is provided in the second housing 5802. The first housing 5801 and the second housing 5802 are connected to each other with the joint 5806, and the angle between the first housing 5801 and the second housing 5802 can be changed with the joint 5806. Images displayed on the display portion 5803 may be switched in accordance with the angle at the joint 5806 between the first housing 5801 and the second housing 5802.

When images taken by a video camera are recorded, the images need to be encoded in accordance with a data recording format. In encoding of the images, the pattern recognition of the artificial neural network is utilized to calculate a difference between the image data taken at the previous time and image data taken this time, so that the data can be compressed.

Figure 11D:
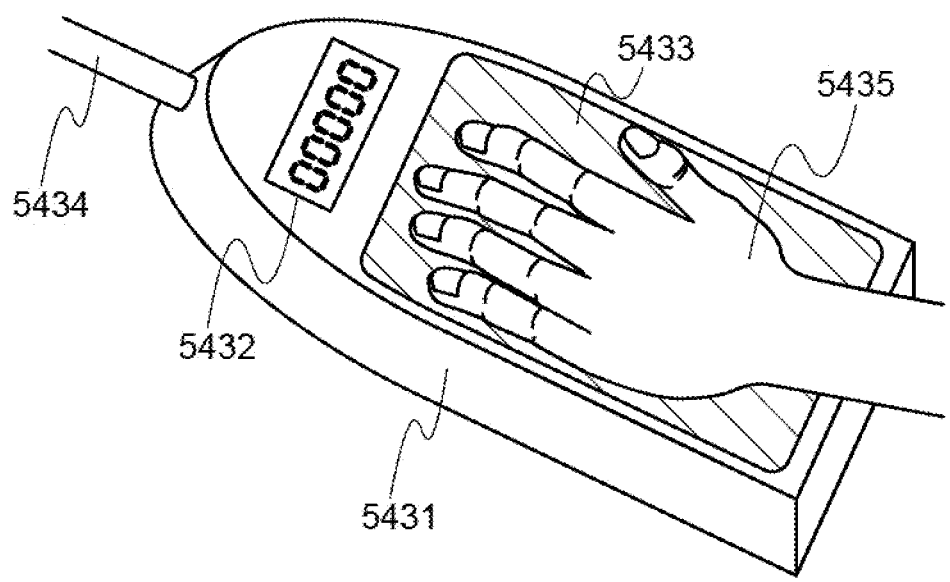

FIG. 11D illustrates a palm print authentication device, which includes a housing 5431, a display portion 5432, a palm print reading portion 5433, and a wiring 5434. Also, FIG. 11D illustrates a situation where a palm print of a hand 5435 is obtained. Without limitation to the palm print authentication device, one embodiment of the present invention may be a device for obtaining biological information of fingerprints, veins, faces, iris, voice prints, genes, or the like.

Figure 12:
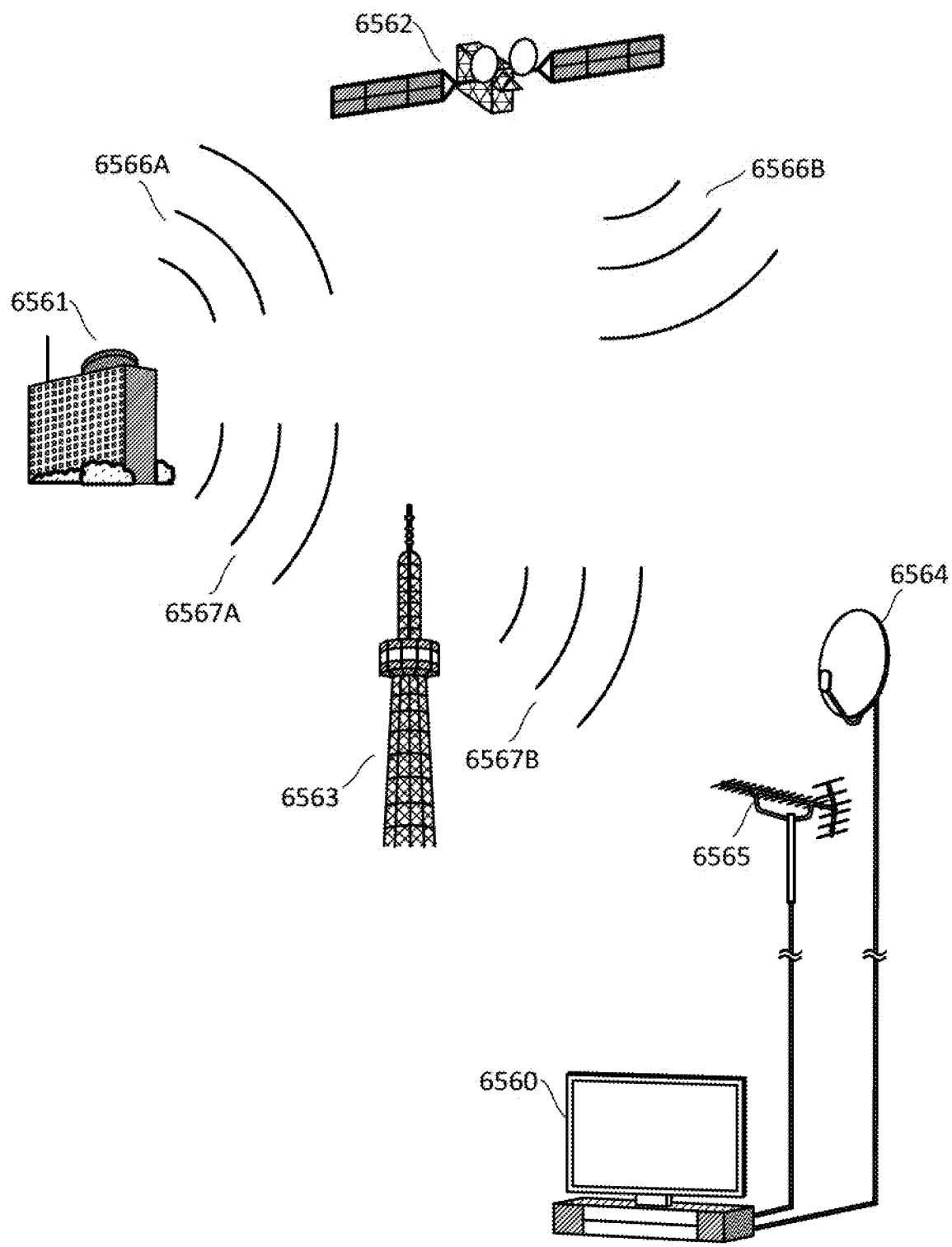
FIG. 12 is a schematic view illustrating data transmission in a broadcast system.

FIG. 12 schematically illustrates data transmission in the broadcast system. FIG. 12 illustrates a path in which a radio wave (a broadcast signal) transmitted from a broadcast station 6561 is delivered to a television receiver (TV) 6560 of every household. The TV 6560 is provided with a receiver and a display device. As examples of an artificial satellite 6562, a communication satellite (CS) and a broadcast satellite (BS) can be given. As examples of an antenna 6564, a BS•110° CS antenna and a CS antenna can be given. Examples of the antenna 6565 include an ultra-high frequency (UHF) antenna.

Radio waves 6566A and 6566B are broadcast signals for a satellite broadcast. When the artificial satellite 6562 receives the radio wave 6566A, the artificial satellite 6562 transmits the radio wave 6566B to the ground. The antenna 6564 of every household receives the radio wave 6566B, and a satellite TV broadcast can be watched on the TV 6560.

Alternatively, the radio wave 6566B is received by an antenna of another broadcast station, and a receiver in the broadcast station processes the radio wave 6566B into a signal that can be transmitted to an optical cable. The broadcast station transmits the broadcast signal to the TV 6560 of every household using an optical cable network. Radio waves 6567A and 6567B are broadcast signals for a terrestrial broadcast. A radio wave tower 6563 amplifies the received radio wave 6567A and transmits it as the radio wave 6567B. A terrestrial TV broadcast can be watched on the TV 6560 of every household when the antenna 6565 receives the radio wave 6567B.

Before the radio wave 6566A or the radio wave 6567A is transmitted from the broadcast station 6561, the encoding processing of the image data is conducted by an electronic device in the broadcast station 6561. At this time, the pattern recognition of the artificial neural network is utilized to calculate a difference between the image data taken at the previous time and the image data taken this time, so that the data can be compressed.

A video distribution system of this embodiment is not limited to a system for a TV broadcast. Video data to be distributed may be either moving image data or still image data.

Figure 13:
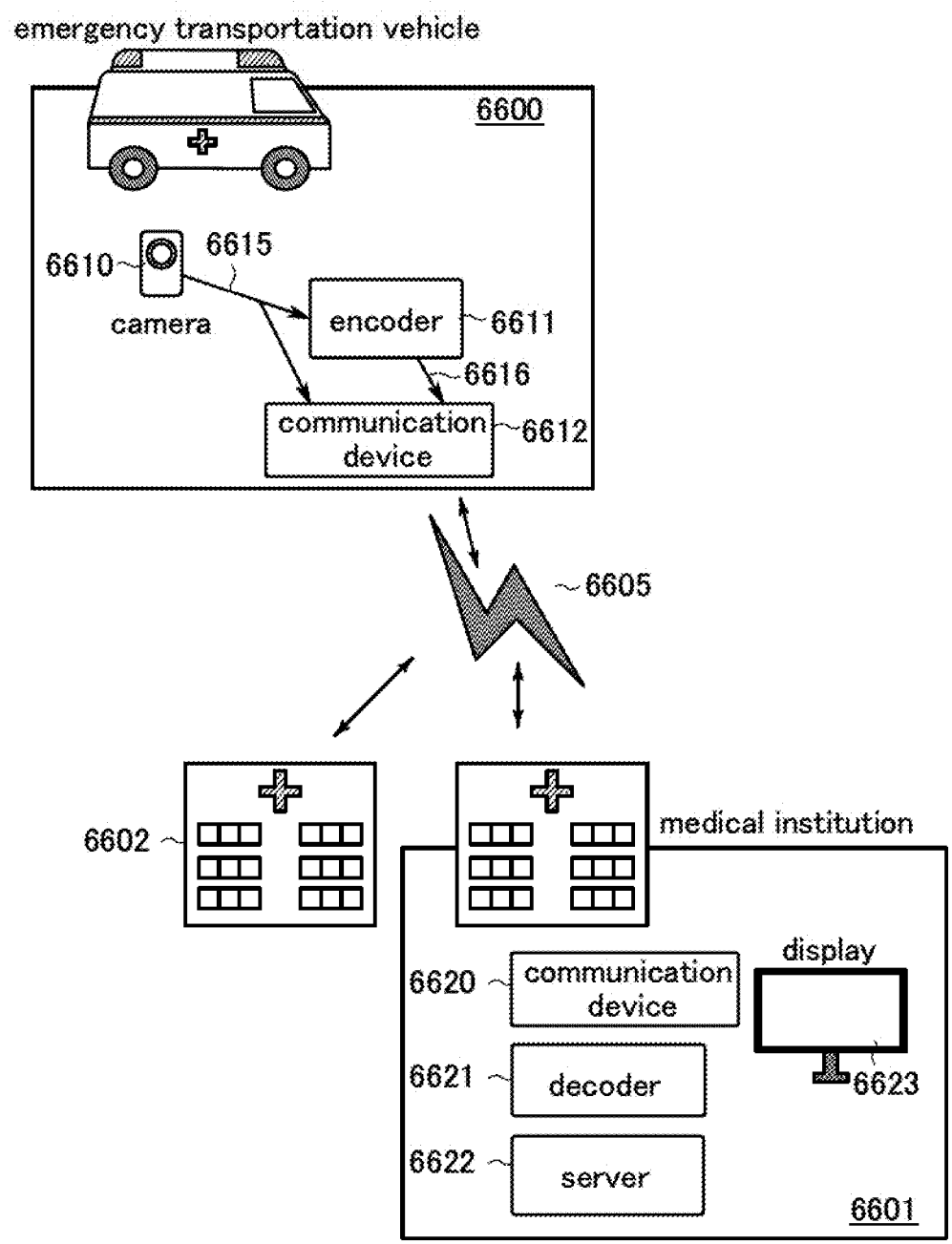
FIG. 13 illustrates a structure example of a video distribution system in a medical field.

For example, video data of a camera may be distributed via a high-speed IP network. The distribution system of the video data can be used in, for example, the medical field for remote diagnosis and remote treatment. Images with higher resolution are demanded for accurate image diagnoses and medical care; images with high resolution, such as 8K, 4K, and 2K images, are thus demanded for images for medical use. FIG. 13 schematically illustrates an emergency medical system that utilizes the video data distribution system.

A high-speed network 6605 performs communication between an emergency transportation vehicle (an ambulance) 6600 and a medical institution 6601 and between the medical institution 6601 and a medical institution 6602. The ambulance 6600 is equipped with a camera 6610, an encoder 6611, and a communication device 6612.

A patient taken to the medical institution 6601 is photographed with the camera 6610. Video data 6615 obtained by the camera 6610 may be transmitted without compression by the communication device 6612. This enables the transmission of the high-resolution video data 6615 to the medical institution 6601 with little delay. In the case where the high-speed network 6605 cannot be used for the communication between the ambulance 6600 and the medical institution 6601, the video data can be encoded with the encoder 6611 and encoded video data 6616 can be transmitted. At this time, the pattern recognition of the artificial neural network is utilized, whereby the video data can be compressed in a manner similar to that of the above television system.

In the medical institution 6601, a communication device 6620 receives the video data transmitted from the ambulance 6600. When the received video data is uncompressed data, the data is transmitted via the communication device 6620 and displayed on a display device 6623. When the video data is compressed data, the data is decompressed with a decoder 6621 and then transmitted to a server 6622 and the display device 6623. Judging from the image on the display device 6623, doctors give instructions to crews of the ambulance 6600 or staff members in the medical institution 6601 who treat the patient. The doctors can check the condition of the patient in detail in the medical institution 6601 while the patient is taken by the ambulance because the distribution system in FIG. 13 can transmit a high-definition image.

Therefore, the doctors can instruct the ambulance crews or the staff members appropriately in a short time, resulting in improvement of a lifesaving rate of patients.

The communication of video data between the medical institution 6601 and the medical institution 6602 can be performed in the same way. A medical image obtained from an image diagnostic device (such as CT or MRI) of the medical institution 6601 can be transmitted to the medical institution 6602. Here, the ambulance 6600 is given as an example of the means to transport patients; however, an aircraft such as a helicopter or a vessel may be used.

The electronic device or system described in this embodiment can be combined with any other electronic devices or systems as appropriate.

This embodiment can be combined with any of the other embodiments in this specification as appropriate.

Embodiment 4

In this embodiment, an input/output device that can be provided for the tablet terminal in FIG. 11A or the mobile phone in FIG. 11B described in Embodiment 3 will be described.

Figure 14A:
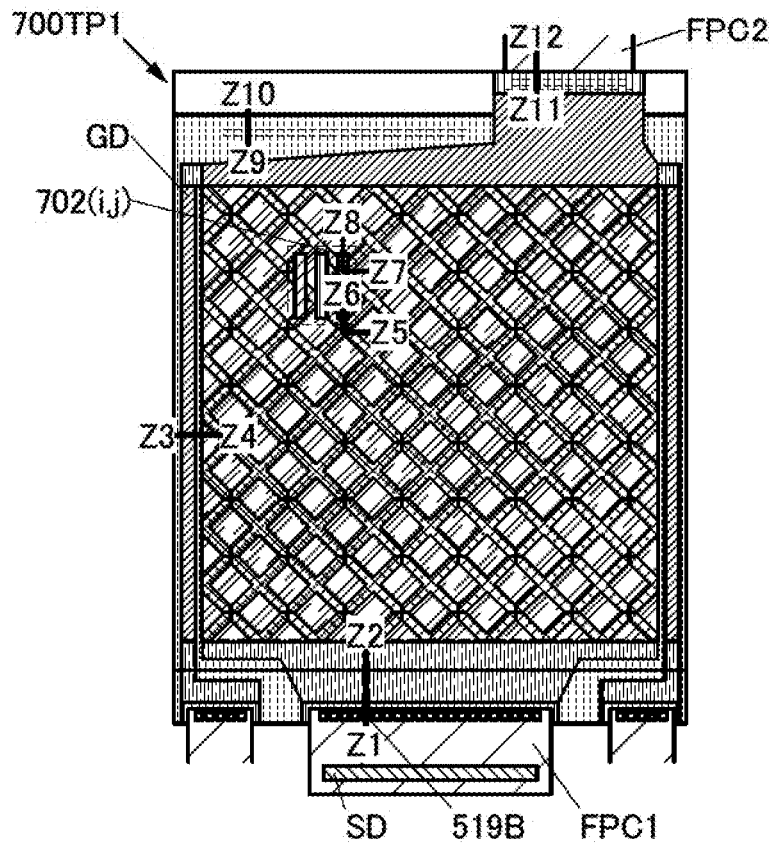
FIGS. 14A to 14C illustrate an example of a structure of a touch panel.
Figures 1, 14B:
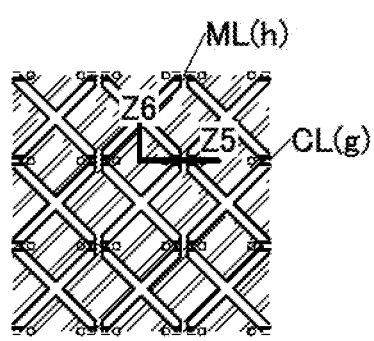
Figures 2, 14B:
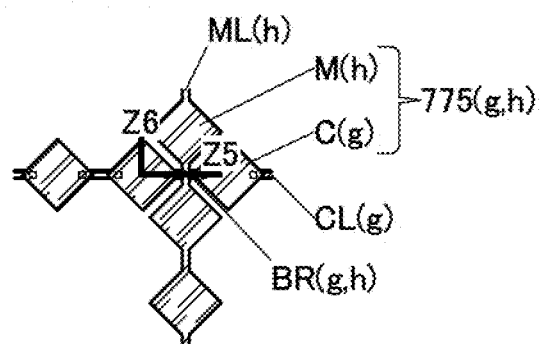
Figure 14C:
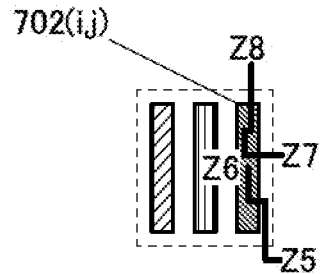

FIGS. 14A, 14B-1, 14B-2, and 14C illustrate a structure of a touch panel 700TP1 that can be used for an input/output device. FIG. 14A is a top view of the touch panel. FIG. 14B-1 is a schematic view illustrating part of an input portion of the touch panel. FIG. 14B-2 is a schematic view illustrating part of the structure of FIG. 14B-1. FIG. 14C is a schematic view illustrating part of a display portion included in the touch panel.

Figure 15A:
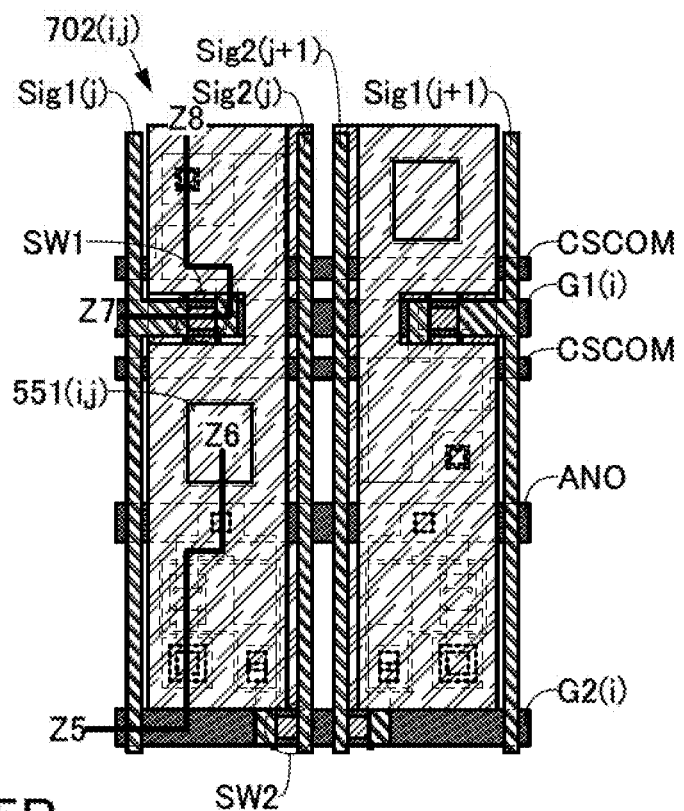
FIGS. 15A and 15B illustrate a structure example of a pixel in a display panel of a touch panel.
Figure 15B:
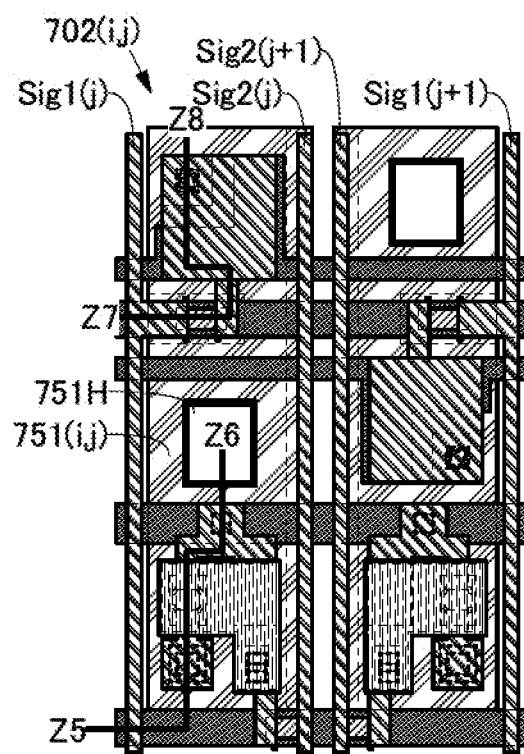

FIG. 15A is a bottom view illustrating part of the structure of a pixel in the touch panel in FIG. 14C. FIG. 15B is a bottom view illustrating part of the structure in FIG. 15A in which some components are omitted.

Figure 16A:
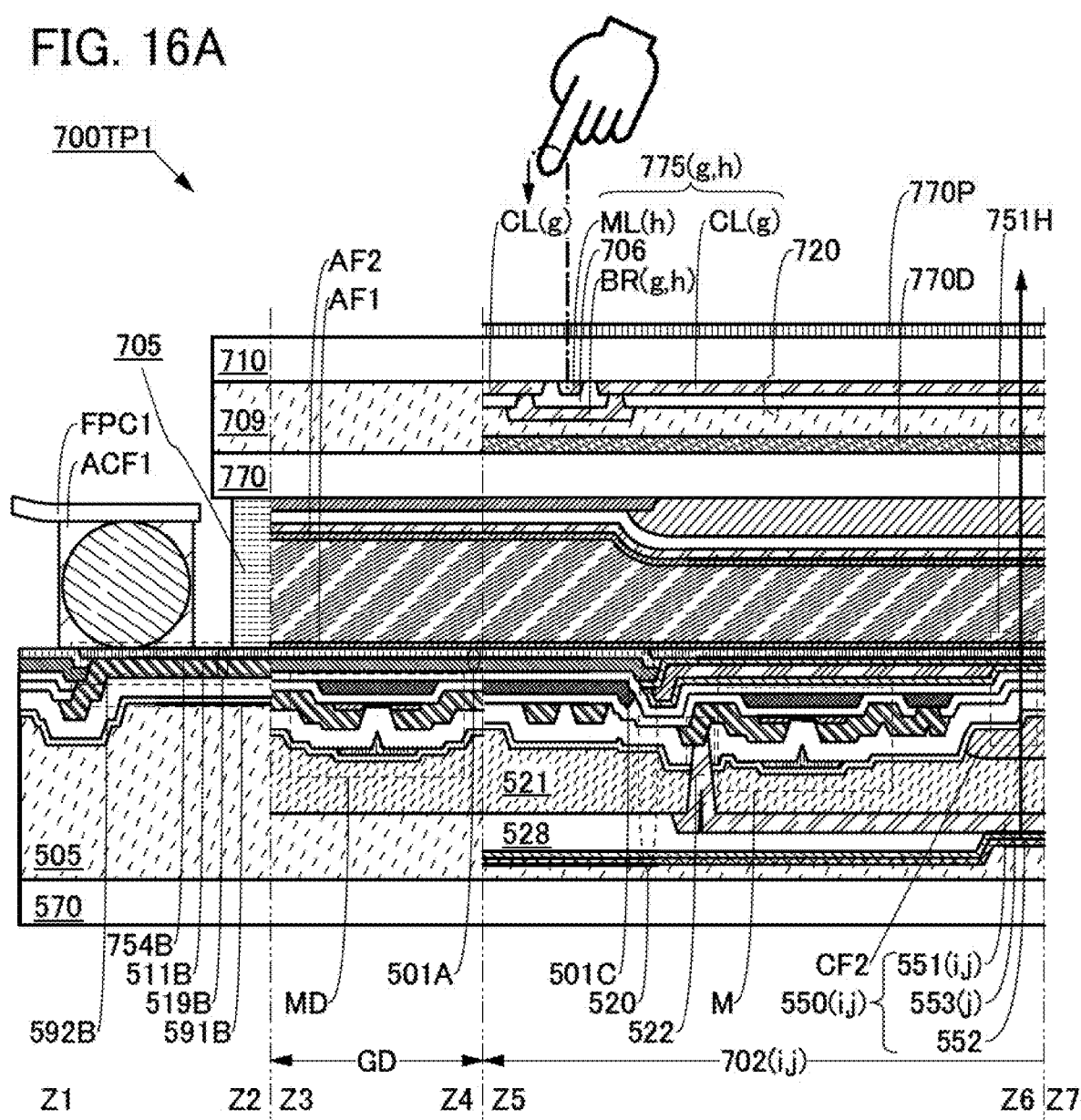
FIGS. 16A and 16B are cross-sectional views illustrating a structure example of a touch panel.
Figure 16B:
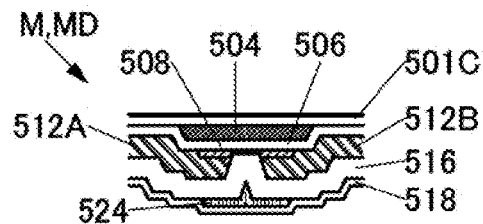

FIGS. 16A and 16B and FIGS. 17A and 17B are cross-sectional views illustrating the structure of the touch panel. FIG. 16A is a cross-sectional view taken along bold lines Z1-Z2, Z3-Z4, and Z5-Z6 in FIG. 14A. FIG. 16B illustrates part of FIG. 16A.

Figure 17A:
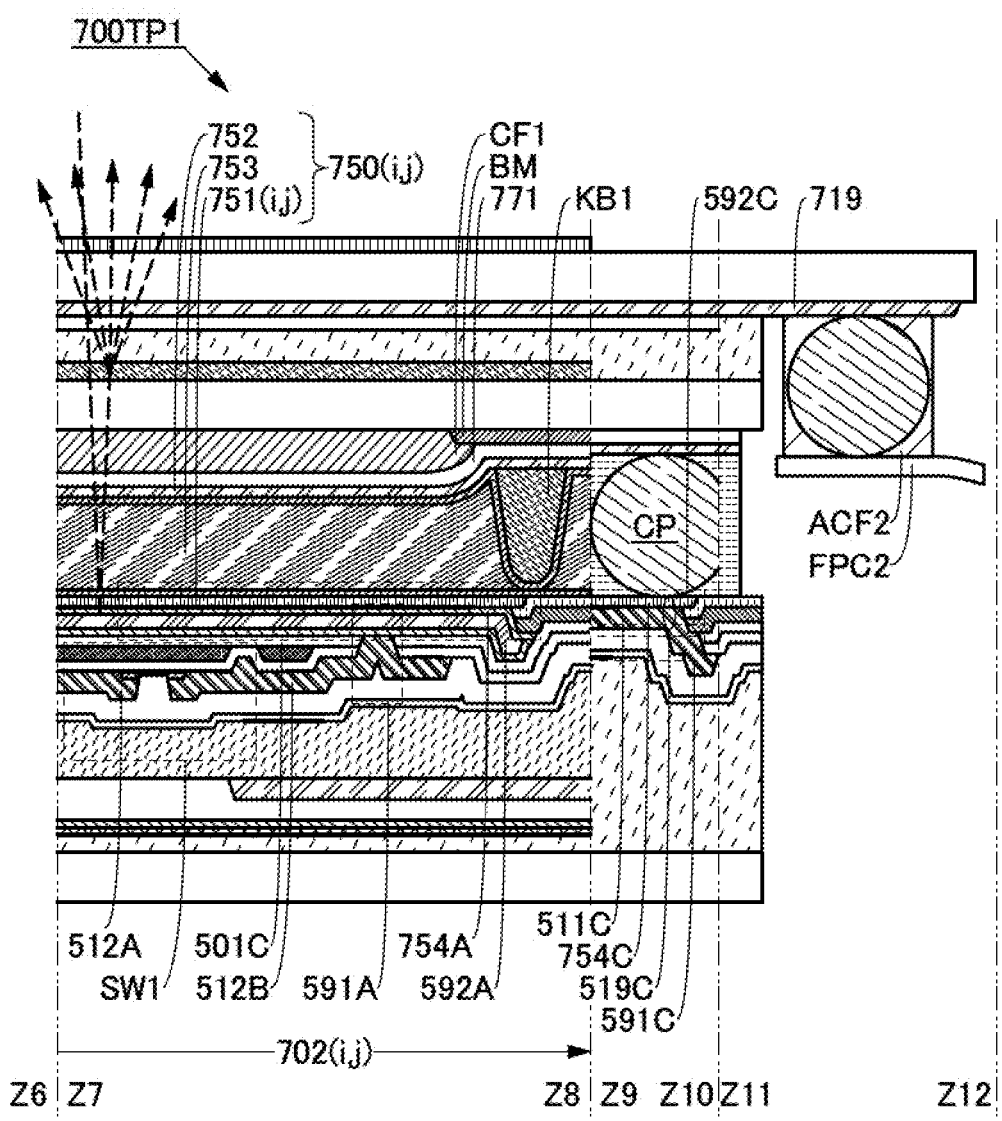
FIGS. 17A and 17B are cross-sectional views illustrating a structure example of a touch panel.
Figure 17B:
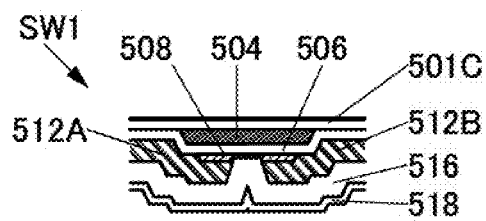

FIG. 17A is a cross-sectional view taken along bold lines Z7-Z8, Z9-Z10, and Z11-Z12 in FIG. 14A. FIG. 17B illustrates part of FIG. 17A.

Figure 18A:
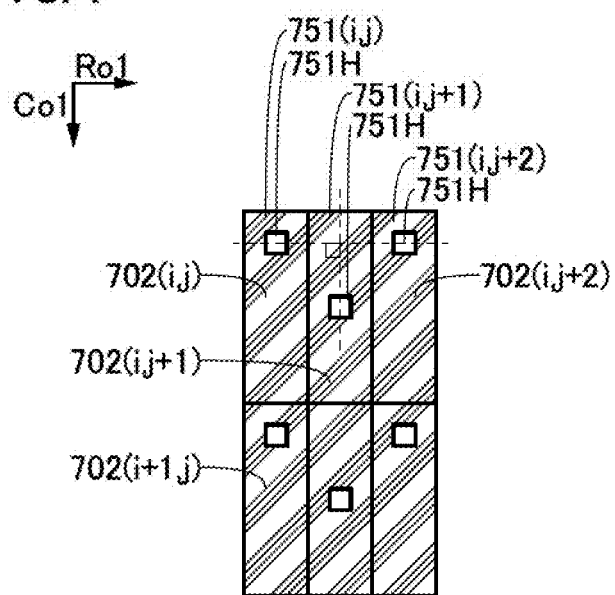
FIGS. 18A to 18C are schematic views illustrating an example of a shape of a reflective film of a display panel.
Figure 18B:
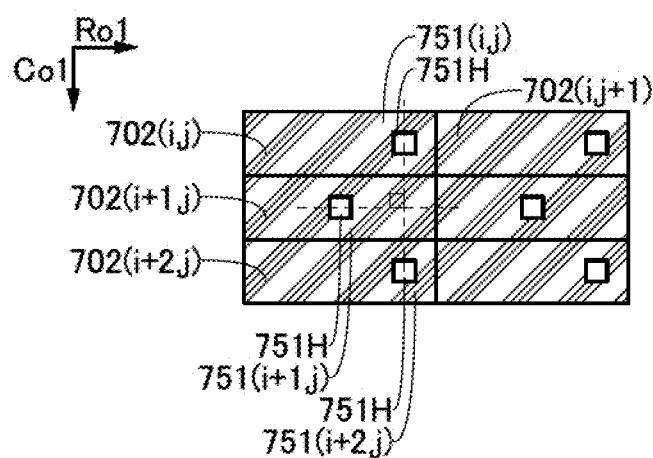
Figure 18C:
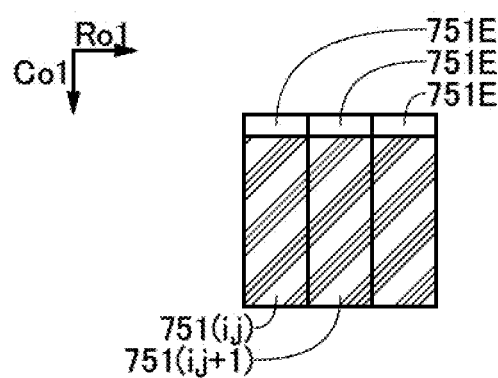

FIGS. 18A to 18C are schematic views each illustrating the shape of a reflective film that can be used in a pixel of the touch panel.

Figure 19:
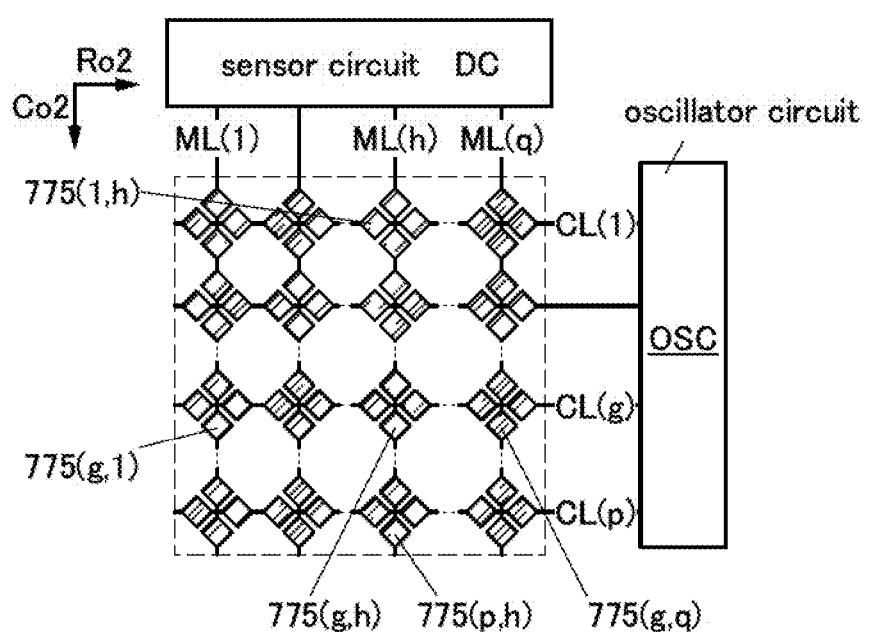
FIG. 19 is a block diagram illustrating a structure example of an input portion.

FIG. 19 is a block diagram illustrating the structure of the input portion of the touch panel.

Figure 20:
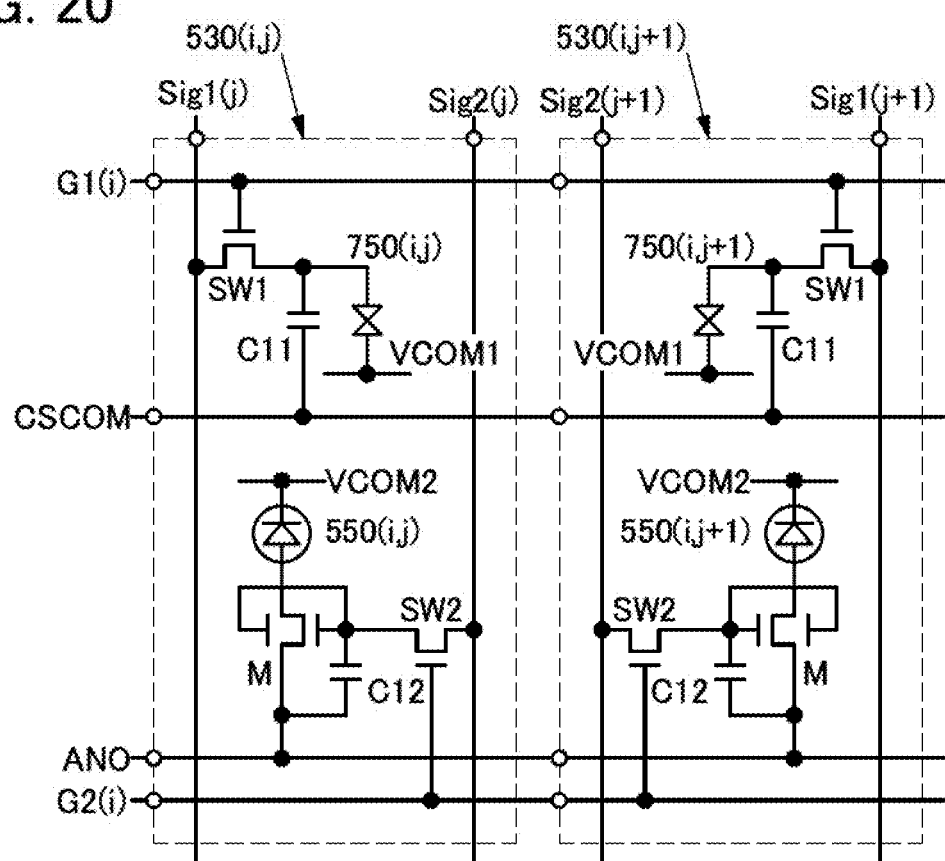
FIG. 20 is a circuit diagram showing a pixel of a display portion.

FIG. 20 is a circuit diagram illustrating a configuration of a pixel circuit included in the input/output device.

<Structure Example of Input/Output Device>

The input/output device described in this embodiment includes the touch panel 700TP1 (see FIG. 14A). Note that the touch panel includes the display portion and the input portion.

<<Structure Example of Display Portion>>

The display portion includes a display panel, and the display panel includes a pixel 702(0.

The pixel 702(i,j) includes a second conductive film, a first conductive film, a second insulating film 501C, and a first display element 750(i,j) (see FIG. 17A).

The second conductive film is electrically connected to a pixel circuit 530(i,j). For example, a conductive film 512B which functions as a source electrode or a drain electrode of a transistor used as a switch SW1 of the pixel circuit 530(i,j) can be used as the second conductive film (see FIG. 17A and FIG. 20).

The first conductive film includes a region overlapping with the second conductive film. For example, the first conductive film can be used for a first electrode 751(0 of the first display element 750(i,j).

The second insulating film 501C includes a region sandwiched between the second conductive film and the first conductive film. The second insulating film 501C has an opening 591A in the region sandwiched between the first conductive film and the second conductive film. Furthermore, the second insulating film 501C includes a region sandwiched between a first insulating film 501A and a conductive film 511B. Moreover, the second insulating film 501C has an opening 591B in the region sandwiched between the first insulating film 501A and the conductive film 511B. The second insulating film 501C has an opening 591C in a region sandwiched between the first insulating film 501A and a conductive film 511C (see FIG. 16A and FIG. 17A).

The first conductive film is electrically connected to the second conductive film in the opening 591A. For example, the first electrode 751(i,j) is electrically connected to the conductive film 512B. The first conductive film electrically connected to the second conductive film through the opening 591A provided in the second insulating film 501C can be referred to as a through electrode.

The first display element 750(i,j) is electrically connected to the first conductive film.

The first display element 750(i,j) includes a reflective film and has a function of controlling the intensity of light reflected by the reflective film. For example, the first conductive film, the first electrode 751(i,j), or the like can be used as the reflective film of the first display element 750(i,j). Similarly, the first conductive film, a first electrode 751(i,j+1), or the like can be used as a reflective film of a first display element 750(i,j+1), and the first conductive film, a first electrode 751(i,j+2), or the like can be used as a reflective film of a first display element 750(i,j+2) (see FIG. 18A). Note that also in FIG. 18B described later, the first electrode 751(i,j), a first electrode 751(i+1,j), and a first electrode 751(i+2,j) are illustrated as the reflective film.

The second display element 550(i,j) has a function of emitting light toward the second insulating film 501C (see FIG. 16A).

The reflective film has a shape including a region that does not block light emitted from the second display element 550(i,j).

The reflective film included in the pixel 702(i,j) of the display panel described in this embodiment includes one or a plurality of openings 751H (see FIGS. 18A to 18C).

The second display element 550(i,j) has a function of emitting light toward the opening 751H. Note that the opening 751H transmits light emitted from the second display element 550(i,j).

The opening 751H of the pixel 702(11+1), which is adjacent to the pixel 702(11), is not provided on a line that extends in the row direction (the direction indicated by an arrow Ro1 in the drawing) through the opening 751H of the pixel 702(i,j) (see FIG. 18A). Alternatively, for example, the opening 751H of the pixel 702(i+1,j), which is adjacent to the pixel 702(i,j), is not provided on a line that extends in the column direction (the direction indicated by an arrow Co1 in the drawing) through the opening 751H of the pixel 702(i,j) (see FIG. 18B).

For example, the opening 751H of the pixel 702(i,j+2) is provided on a line that extends in the row direction through the opening 751H of the pixel 702(i,j) (see FIG. 18A). In addition, the opening 751H of the pixel 702(i,j+1) is provided on a line that is perpendicular to the above-mentioned line between the opening 751H of the pixel 702(i,j) and the opening 751H of the pixel 702(i,j+2).

Alternatively, for example, the opening 751H of the pixel 702(i+2,j) is provided on a line that extends in the column direction through the opening 751H of the pixel 702(i,j) (see FIG. 18B). In addition, for example, the opening 751H of the pixel 702(i+1,j) is provided on a line that is perpendicular to the above-mentioned line between the opening 751H of the pixel 702(i,j) and the opening 751H of the pixel 702(i+2,j).

Thus, a third display element that displays a color different from that displayed by the second display element can be provided easily near the second display element. As a result, a display panel with high convenience or high reliability can be provided.

For example, the reflective film can be formed using a material having a shape in which an end portion is cut off so as to form a region 751E that does not block light emitted from the second display element 550(i,j) (see FIG. 18C). Specifically, the first electrode 751(i,j) whose end portion is cut off so as to be shorter in the column direction (the direction indicated by the arrow Co1 in the drawing) can be used as the reflective film. Note that the first electrode 751(i,j+1) is illustrated in FIG. 18C in addition to the first electrode 751(i,j).

Thus, the first display element and the second display element that displays an image using a method different from that of the first display element can be driven using pixel circuits that can be formed in the same process. Specifically, a reflective display element is used as the first display element, whereby the power consumption can be reduced. In addition, an image with high contrast can be favorably displayed in an environment with bright external light. In addition, the second display element that emits light is used, whereby an image can be favorably displayed in a dark environment. Furthermore, using the second insulating film, impurity diffusion between the first display element and the second display element or between the first display element and the pixel circuit can be suppressed. Moreover, part of light emitted from the second display element to which a voltage controlled on the basis of the control data is supplied is not blocked by the reflective film included in the first display element. As a result, a display device with high convenience or high reliability can be provided.

The second display element 550(i,j) included in the pixel of the input/output device described in this embodiment is provided so as to be seen in part of a range from which display using the first display element 750(i,j) can be seen. For example, dashed arrows shown in FIG. 17A denote the directions in which external light is incident on and reflected by the first display element 750(i,j) that performs display by controlling the intensity of external light reflection. In addition, a solid arrow shown in FIG. 16A denotes the direction in which the second display element 550(i,j) emits light to the part of the region from which the display using the first display element 750(i,j) can be seen.

Accordingly, display using the second display element can be seen from part of the region where the display using the first display element can be seen. Alternatively, a user can see the display without changing the attitude or the like of the display panel. As a result, a display panel with high convenience or high reliability can be provided.

The pixel circuit 530(i,j) is electrically connected to the signal line Sig1(j). Note that the conductive film 512A is electrically connected to the signal line Sig1(j) (see FIG. 17A and FIG. 20). Furthermore, for example, the transistor in which the second conductive film is used as the conductive film 512B serving as a source electrode or a drain electrode can be used as the switch SW1 of the pixel circuit 530(i,j).

The display panel described in this embodiment includes the first insulating film 501A (see FIG. 16A).

The first insulating film 501A has a first opening 592A, a second opening 592B, and an opening 592C (see FIG. 16A or FIG. 17A).

The first opening 592A includes a region overlapping with a first intermediate film 754A and the first electrode 751(i,j) or a region overlapping with the first intermediate film 754A and the second insulating film 501C.

The second opening 592B includes a region overlapping with a second intermediate film 754B and the conductive film 511B. Furthermore, the opening 592C includes a region overlapping with an intermediate film 754C and the conductive film 511C.

The first insulating film 501A includes a region that is along an outer edge of the first opening 592A and is between the first intermediate film 754A and the second insulating film 501C. The first insulating film 501A also includes a region that is along an outer edge of the second opening 592B and is between the second intermediate film 754B and the conductive film 511B.

The display panel described in this embodiment includes a scan line G2(i), a wiring CSCOM, a third conductive film ANO, and a signal line Sig2(j) (see FIG. 20).

The second display element 550(i,j) of the display panel described in this embodiment includes a third electrode 551(i,j), a fourth electrode 552, and a layer 553(j) containing a light-emitting material (see FIG. 16A). Note that the third electrode 551(i,j) and the fourth electrode 552 are electrically connected to the third conductive film ANO and a fourth conductive film VCOM2, respectively (see FIG. 20).

The fourth electrode 552 includes a region overlapping with the third electrode 551(i,j).

The layer 553(j) containing a light-emitting material includes a region sandwiched between the third electrode 551(i,j) and the fourth electrode 552.

The third electrode 551(i,j) is electrically connected to the pixel circuit 530(i,j) at a connection portion 522.

The first display element 750(i,j) of the display panel described in this embodiment includes a layer 753 containing a liquid crystal material, the first electrode 751(i,j), and a second electrode 752. The second electrode 752 is positioned such that an electric field that controls the alignment of the liquid crystal material is generated between the second electrode 752 and the first electrode 751(i,j) (see FIG. 16A and FIG. 17A).

The display panel described in this embodiment includes an alignment film AF1 and an alignment film AF2. The alignment film AF2 is provided such that the layer 753 containing a liquid crystal material is interposed between the alignment film AF1 and the alignment film AF2.

The display panel described in this embodiment includes the first intermediate film 754A and the second intermediate film 754B.

The first intermediate film 754A includes a region which overlaps with the second insulating film 501C with the first conductive film interposed therebetween, and the first intermediate film 754A includes a region in contact with the first electrode 751(i,j). The second intermediate film 754B includes a region in contact with the conductive film 511B.

The display panel described in this embodiment includes a light-blocking film BM, an insulating film 771, a functional film 770P, a functional film 770D, a coloring film CF1, and a coloring film CF2.

The light-blocking film BM has an opening in a region overlapping with the first display element 750($i,j$). The coloring film CF2 is provided between the second insulating film 501C and the second display element 550($i,j$) and includes a region overlapping with the opening 751H (see FIG. 16A).

The insulating film 771 includes a region sandwiched between the coloring film CF1 and the layer 753 containing a liquid crystal material or between the light-blocking film BM and the layer 753 containing a liquid crystal material. The insulating film 771 can reduce unevenness due to the thickness of the coloring film CF1. Alternatively, impurities can be prevented from being diffused from the light-blocking film BM, the coloring film CF1, or the like to the layer 753 containing a liquid crystal material.

The functional film 770P includes a region overlapping with the first display element 750($i,j$).

The functional film 770D includes a region overlapping with the first display element 750($i,j$). The functional film 770D is provided such that a substrate 770 is interposed between the functional film 770D and the first display element 750($i,j$). Thus, for example, light reflected by the first display element 750($i,j$) can be diffused.

The display panel described in this embodiment includes a substrate 570, the substrate 770, and a functional layer 520.

The substrate 770 includes a region overlapping with the substrate 570.

The functional layer 520 includes a region sandwiched between the substrate 570 and the substrate 770. The functional layer 520 includes the pixel circuit 530($i,j$), the second display element 550($i,j$), an insulating film 521, and an insulating film 528. Furthermore, the functional layer 520 includes an insulating film 518 and an insulating film 516 (see FIGS. 16A and 16B).

The insulating film 521 includes a region sandwiched between the pixel circuit 530($i,j$) and the second display element 550($i,j$).

The insulating film 528 is provided between the insulating film 521 and the substrate 570 and has an opening in a region overlapping with the second display element 550($i,j$).

The insulating film 528 formed along an edge of the third electrode 551($i,j$) can prevent a short circuit between the third electrode 551(i,j) and the fourth electrode.

The insulating film 518 includes a region sandwiched between the insulating film 521 and the pixel circuit 530($i,j$). The insulating film 516 includes a region sandwiched between the insulating film 518 and the pixel circuit 530($i,j$).

The display panel described in this embodiment includes a bonding layer 505, a sealing material 705, and a structure body KB1.

The bonding layer 505 includes a region sandwiched between the functional layer 520 and the substrate 570, and has a function of bonding the functional layer 520 and the substrate 570 together.

The sealing material 705 includes a region sandwiched between the functional layer 520 and the substrate 770, and has a function of bonding the functional layer 520 and the substrate 770 together.

The structure body KB1 has a function of providing a certain space between the functional layer 520 and the substrate 770.

The display panel described in this embodiment includes a terminal 519B and a terminal 519C.

The terminal 519B includes the conductive film 511B and the intermediate film 754B, and the intermediate film 754B includes a region in contact with the conductive film 511B. The terminal 519B is electrically connected to the signal line Sig1($j$), for example.

The terminal 519B can be electrically connected to a flexible printed circuit FPC1 using a conductive material ACF1.

The terminal 519C includes the conductive film 511C and the intermediate film 754C, and the intermediate film 754C includes a region in contact with the conductive film 511C. The conductive film 511C is electrically connected to the wiring VCOM1, for example.

A conductive material CP is sandwiched between the terminal 519C and the second electrode 752, and has a function of electrically connecting the terminal 519C and the second electrode 752. For example, a conductive particle can be used as the conductive material CP.

The display panel described in this embodiment includes a driver circuit GD and a driver circuit SD (see FIG. 14A).

The driver circuit GD is electrically connected to the scan line G1($i$). The driver circuit GD includes a transistor MD, for example (see FIG. 16A). Specifically, a transistor including a semiconductor film that can be formed in the same process as the transistor included in the pixel circuit 530($i,j$) can be used as the transistor MD.

The driver circuit SD is electrically connected to the signal line Sig1($j$). The driver circuit SD is electrically connected to the terminal 519B, for example.

<<Structure Example of Input Portion>>

The input portion includes a region overlapping with the display panel (see FIGS. 14A, 14B-1, 14B-2, and 14C, FIG. 16A, or FIG. 17A).

The input portion includes the substrate 710, a functional layer 720, a bonding layer 709, and a terminal 719 (see FIG. 16A and FIG. 17A).

The input portion includes a control line CL(g), a sensor signal line ML(h), and a sensing element 775($g,h$) (see FIG. 14B-2).

The functional layer 720 includes a region sandwiched between the substrate 770 and the substrate 710. The functional layer 720 includes the sensing element 775($g,h$) and an insulating film 706.

The bonding layer 709 is provided between the functional layer 720 and the substrate 770 and has a function of bonding the functional layer 720 and the substrate 770 together.

The sensing element 775($g,h$) is electrically connected to the control line CL(g) and the sensor signal line ML(h).

The control line CL(g) has a function of supplying a control signal.

The sensing element 775($g,h$) receives the control signal and has a function of supplying the control signal and a sensor signal which changes in accordance with a distance between the sensing element 775($g,h$) and an object approaching a region overlapping with the display panel.

The sensor signal line ML(h) has a function of receiving the sensor signal.

The sensing element 775($g,h$) has a light-transmitting property.

The sensing element 775($g,h$) includes an electrode C(g) and an electrode M(h).

The electrode C(g) is electrically connected to the control line CL(g).

The electrode M(h) is electrically connected to the sensor signal line ML(h) and is provided so that an electric field part of which is blocked by an object approaching a region overlapping with the display panel is generated between the electrode M(h) and the electrode C(g).

Thus, the object approaching the region overlapping with the display panel can be sensed while the image data is displayed on the display panel.

The input portion described in this embodiment includes the substrate 710 and the bonding layer 709 (see FIG. 16A and FIG. 17A).

The substrate 710 is provided so that the sensing element 775($g,h$) is sandwiched between the substrate 710 and the substrate 770.

The bonding layer 709 is provided between the substrate 770 and the sensing element 775($g,h$) and has a function of bonding the substrate 770 and the sensing element 775($g,h$) together.

The functional film 770P is provided so that the sensing element 775($g,h$) is interposed between the functional film 770P and the first display element 750($i,j$). Thus, the intensity of light reflected by the sensing element 775($g,h$) can be reduced, for example.

The input portion described in this embodiment includes one group of sensing elements 775($g,1$) to 775($g,q$) and another group of sensing elements 775($1,h$) to 775($p,h$) (see FIG. 19). Note that g is an integer greater than or equal to 1 and less than or equal to p, h is an integer greater than or equal to 1 and less than or equal to q, and each of p and q is an integer greater than or equal to 1.

The one group of the sensing elements 775($g,1$) to 775($g,q$) includes the sensing element 775($g,h$) and is provided in the row direction (indicated by an arrow Ro2 in the drawing).

The another group of sensing elements 775($1,h$) to 775($p,h$) includes the sensing element 775($g,h$) and is provided in the column direction (the direction indicated by an arrow Co2 in the drawing) that intersects the row direction.

The one group of sensing elements 775($g,1$) to 775($g,q$) provided in the row direction includes the electrode C(g) that is electrically connected to the control line CL(g).

The another group of sensing elements 775($1,h$) to 775($p,h$) provided in the column direction includes the electrode M(h) that is electrically connected to the sensor signal line ML(h).

The control line CL(g) of the touch panel described in this embodiment includes a conductive film BR(g,h) (see FIG. 16A). The conductive film BR(g,h) includes a region overlapping with the sensor signal line ML(h).

The insulating film 706 includes a region sandwiched between the sensor signal line ML(h) and the conductive film BR(g,h). Thus, a short circuit between the sensor signal line ML(h) and the conductive film BR(g,h) can be prevented.

The touch panel described in this embodiment includes an oscillator circuit OSC and a detection circuit DC (see FIG. 19).

The oscillator circuit OSC is electrically connected to the control line CL(g) and has a function of supplying a control signal. For example, a rectangular wave, a sawtooth wave, a triangular wave, or the like can be used as the control signal.

The detection circuit DC is electrically connected to the sensor signal line ML(h) and has a function of supplying a sensor signal on the basis of a change in the potential of the sensor signal line ML(h).

Components of the touch panel are described below. Note that these components cannot be clearly distinguished and one component may also serve as another component or include part of another component.

For example, the first conductive film can be used as the first electrode 751($i,j$). The first conductive film can be used as a reflective film.

In addition, the second conductive film can be used as the conductive film 512B serving as a source electrode or a drain electrode of a transistor.

The terminal 719 can be electrically connected to a flexible printed circuit FPC2 using a conductive material ACF2, for example. In addition, the terminal 719 is electrically connected to the sensing element 775($g,h$).

<<Configuration Example of Pixel Circuit>>

A configuration example of a pixel circuit is described with reference to FIG. 20. The pixel circuit 530($i,j$) is electrically connected to the signal line Sig1($j$), the signal line sig2($j$), the scan line G1($i$), the scan line G2($i$), the wiring CSCOM, and the third conductive film ANO. Similarly, the pixel circuit 530($i,j$+1) is electrically connected to a signal line Sig1($j$+1), a signal line Sig2($j$+1), a scan line G1($i$), a scan line G2($i$), the wiring CSCOM, and the third conductive film ANO.

The pixel circuit 530($0$ and the pixel circuit 530($i,j$+1) each include the switch SW1 and a capacitor C11.

The pixel circuit 530($i,j$) and the pixel circuit 530($i,j$+1) each include a switch SW2, a transistor M, and a capacitor C12.

For example, a transistor including a gate electrode electrically connected to the scan line G1($i$) and a first electrode electrically connected to the signal line Sig1($j$) can be used as the switch SW1.

The capacitor C11 includes a first electrode electrically connected to a second electrode of the transistor used as the switch SW1 and a second electrode electrically connected to the wiring CSCOM.

For example, a transistor including a gate electrode electrically connected to the scan line G2($i$) and a first electrode electrically connected to the signal line Sig2($j$) can be used as the switch SW2.

The transistor M includes a gate electrode electrically connected to a second electrode of the transistor used as the switch SW2 and a first electrode electrically connected to the third conductive film ANO.

Note that a transistor including a conductive film provided such that a semiconductor film is interposed between a gate electrode and the conductive film can be used as the transistor M. For example, as the conductive film, a conductive film electrically connected to a wiring that can supply the same potential as that of the gate electrode of the transistor M can be used.

The capacitor C12 includes a first electrode electrically connected to the second electrode of the transistor used as the switch SW2 and a second electrode electrically connected to the first electrode of the transistor M.

Note that in the pixel circuit 530($i,j$), the first electrode and the second electrode of the first display element 750($i,j$) are electrically connected to the second electrode of the transistor used as the switch SW1 and the wiring VCOM1, respectively. This enables the first display element 750 to be driven. Similarly, in the pixel circuit 530($i,j$+1), a first electrode and a second electrode of the first display element 750($i,j$+1) are electrically connected to the second electrode of the transistor used as the switch SW1 and the wiring VCOM1, respectively. This enables the first display element 750 to be driven.

Furthermore, in the pixel circuit 530($i,j$), the first electrode and the second electrode of the second display element 550($i,j$) are electrically connected to the second electrode of the transistor M and the fourth conductive film VCOM2, respectively. This enables the second display element 550 (i,j) to be driven. Similarly, in the pixel circuit 530(i,j+1), the first electrode and the second electrode of the second display element 550(i,j+1) are electrically connected to the second electrode of the transistor M and the fourth conductive film VCOM2, respectively. This enables the second display element 550(i,j+1) to be driven.

<<Transistor Structure Example>>

A bottom-gate transistor, a top-gate transistor, or the like can be used as the switch SW1, the transistor M, and the transistor MD.

For example, a transistor including a semiconductor containing an element belonging to Group 14 can be used. Specifically, a semiconductor containing silicon can be used for a semiconductor film. For example, a transistor including single crystal silicon, polysilicon, microcrystalline silicon, amorphous silicon, or the like in a semiconductor film can be used.

For example, a transistor including an oxide semiconductor in a semiconductor film can be used. Specifically, an oxide semiconductor containing indium or an oxide semiconductor containing indium, gallium, and zinc can be used for a semiconductor film.

For example, a transistor whose leakage current in an off state is smaller than that of a transistor including amorphous silicon in a semiconductor film can be used as the switch SW1, the transistor M, the transistor MD, or the like. Specifically, a transistor including an oxide semiconductor in a semiconductor film 508 can be used as the switch SW1, the transistor M, the transistor MD, or the like.

Thus, a pixel circuit can hold an image signal for a longer time than a pixel circuit including a transistor that uses amorphous silicon for a semiconductor film. Specifically, the selection signal can be supplied at a frequency of lower than 30 Hz, preferably lower than 1 Hz, further preferably less than once per minute while flickering is suppressed. Consequently, eyestrain on a user of the information processing device can be reduced, and power consumption for driving can be reduced.

The transistor including an oxide semiconductor in a semiconductor film will be described in detail in Embodiment 5.

The transistor that can be used as the switch SW1 includes the semiconductor film 508 and a conductive film 504 including a region overlapping with the semiconductor film 508 (see FIG. 17B). The transistor that can be used as the switch SW1 includes the conductive film 512A and the conductive film 512B, which are electrically connected to the semiconductor film 508.

Note that the conductive film 504 and the insulating film 506 serve as a gate electrode and a gate insulating film, respectively. The conductive film 512A has one of a function as a source electrode and a function as a drain electrode, and the conductive film 512B has the other.

A transistor in which the semiconductor film 508 is provided between the conductive film 504 and a conductive film 524 can be used as the transistor M (see FIG. 16B).

The above-described input/output device is used for the tablet terminal in FIG. 11A, the mobile phone in FIG. 11B, and the like which are described in Embodiment 3, whereby an electronic device that is highly visible, convenient, or reliable can be obtained.

This embodiment can be combined with any of the other embodiments in this specification as appropriate.

Embodiment 5

In this embodiment, one embodiment of a semiconductor device is described with reference to FIGS. 21A to 21C, FIGS. 22A to 22C, FIGS. 23A to 23C, FIGS. 24A to 24C, FIGS. 25A to 25C, FIGS. 26A to 26C, and FIGS. 27A to 27C.

Transistors of one embodiment of the present invention each preferably include an nc-OS or a CAAC-OS, which are described in Embodiment 6.

<Transistor Structure 1>

Figure 21A:
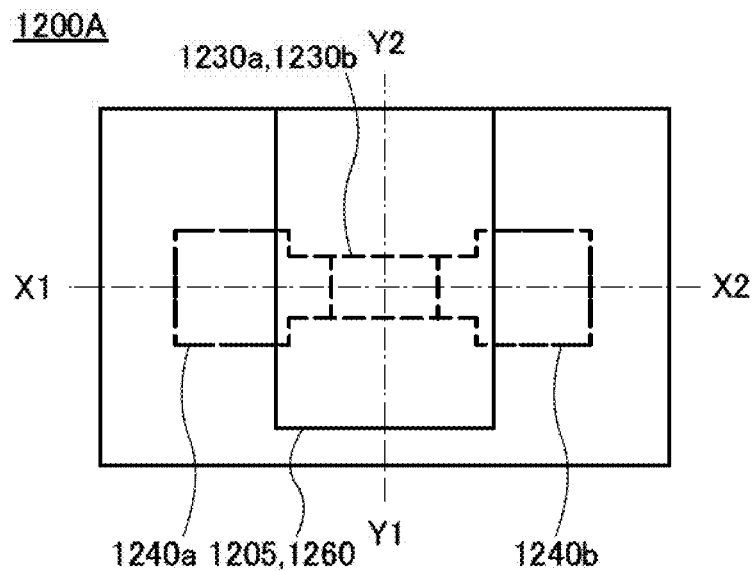
FIGS. 21A to 21C are a top view and cross-sectional views illustrating a structure example of a transistor.
Figure 21B:
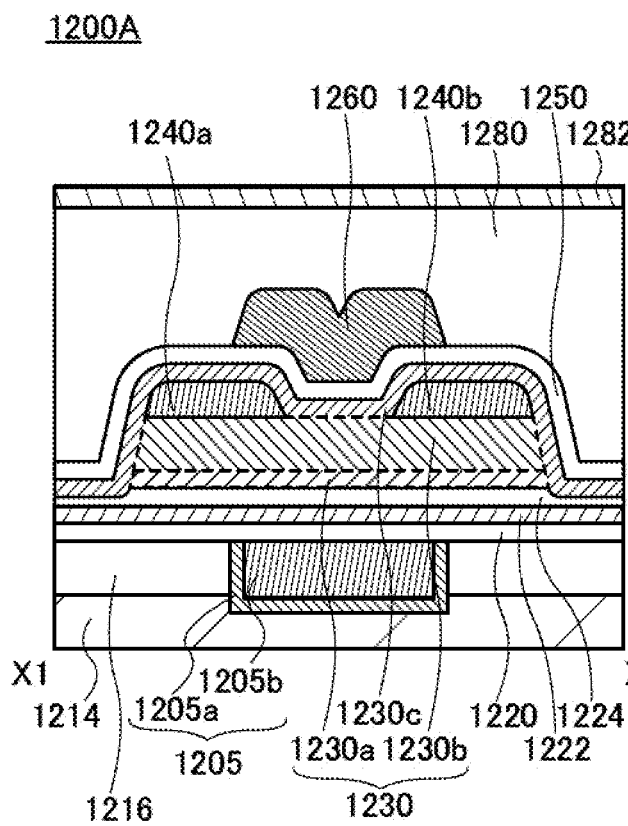
Figure 21C:
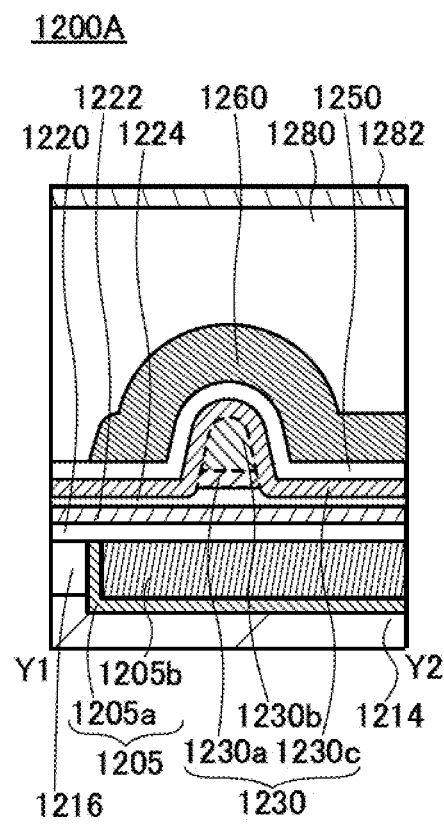

An example of a transistor of one embodiment of the present invention is described below. FIGS. 21A to 21C are a top view and cross-sectional views of the transistor of one embodiment of the present invention. FIG. 21A is a top view. FIG. 21B is a cross-sectional view taken along dashed-dotted line X1-X2 in FIG. 21A. FIG. 21C is a cross-sectional view taken along dashed-dotted line Y1-Y2 in FIG. 21A. Note that the direction of the dashed-dotted line X1-X2 may be called the channel length direction, and the direction of the dashed-dotted line Y1-Y2 may be called the channel width direction. Note that for simplification of the drawing, some components in the top view in FIG. 21A are not illustrated.

A transistor 1200A includes a conductor 1205 (a conductor 1205a and a conductor 1205b) functioning as a back gate electrode, a conductor 1260 functioning as a gate electrode, an insulator 1220 functioning as a gate insulating layer, an insulator 1222, an insulator 1224, an insulator 1250, an oxide 1230 having a region where a channel is formed (an oxide 1230a, an oxide 1230b, and an oxide 1230c), a conductor 1240a functioning as one of a source and a drain, a conductor 1240b functioning as the other of the source and the drain, and an insulator 1280 containing excess oxygen, and an insulator 1282 having a barrier property.

The oxide 1230 includes the oxide 1230a, the oxide 1230b over the oxide 1230a, and the oxide 1230c over the oxide 1230b. When the transistor 1200A is turned on, current flows (a channel is formed) mainly in the oxide 1230b. n contrast, although current might flow through a region in the vicinity of the interface (a mixed region in some cases) between the oxide 1230b and the oxides 1230a and 1230c, the rest of the oxides 1230a and 1230c might function as insulators at the other region.

As illustrated in FIGS. 21A to 21C, the oxide 1230c is preferably provided to cover side surfaces of the oxides 1230a and 1230b. The oxide 1230c, which is provided between the insulator 1280 and the oxide 1230b including the region where the channel is formed, can prevent impurities such as hydrogen, water, and halogen from diffusing from the insulator 1280 into the oxide 1230b.

A metal film containing an element selected from molybdenum, titanium, tantalum, tungsten, aluminum, copper, chromium, neodymium, and scandium; a metal nitride film containing any of the elements as its component (e.g., a tantalum nitride film, a titanium nitride film, a molybdenum nitride film, or a tungsten nitride film); or the like is used as the conductor 1205 functioning as a back gate electrode. In particular, a metal nitride film such as a tantalum nitride film is preferable because it has a barrier property against hydrogen or oxygen and is difficult to oxidize (has high oxidation resistance). Alternatively, a conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added can also be used.

For example, a conductor having a barrier property against hydrogen, e.g., tantalum nitride, may be used as the conductor 1205a, and tungsten, which has high conductivity, may be stacked thereover as the conductor 1205b. The use of the combination of the materials can prevent diffusion of hydrogen into the oxide 1230 while conductivity of a wiring is ensured. A two-layer structure of the conductor 1205a and the conductor 1205b is shown in FIGS. 21A to 21C, but the structure of the conductor 1205 is not limited thereto, and a single-layer structure or a layered structure of three or more layers may be used. For example, a structure where a conductor having a barrier property and a conductor which has high conductivity are provided with a conductor which is highly adhesive to the conductor having a barrier property and the conductor which has high conductivity located therebetween may be employed.

Each of the insulators 1220 and 1224 is preferably an insulator containing oxygen, such as a silicon oxide film or a silicon oxynitride film. In particular, the insulator 1224 is preferably an insulator containing excess oxygen (containing oxygen in excess of that in the stoichiometric composition). In the case where such an insulator containing excess oxygen is provided in contact with the oxide 1230 in the transistor 1200A, oxygen vacancies in the oxide 1230 can be compensated. Note that the insulators 1222 and 1224 are not necessarily formed of the same material.

The insulator 1222 is preferably formed to have a single-layer structure or a stacked-layer structure using, for example, an insulator containing a material such as silicon oxide, silicon oxynitride, silicon nitride oxide, aluminum oxide, hafnium oxide, tantalum oxide, zirconium oxide, lead zirconate titanate (PZT), strontium titanate ($SrTiO_3$), or $(Ba,Sr)TiO_3$ (BST). In particular, an insulating film having a barrier property against oxygen or hydrogen, e.g., an aluminum oxide film or a hafnium oxide film, is preferably used. The insulator 1222 formed of such a material functions as a layer that prevents release of oxygen from the metal oxide 1230 or entry of impurities such as hydrogen from the outside.

Alternatively, aluminum oxide, bismuth oxide, germanium oxide, niobium oxide, silicon oxide, titanium oxide, tungsten oxide, yttrium oxide, or zirconium oxide may be added to the insulator, for example. The insulator may be subjected to nitriding treatment. A layer of silicon oxide, silicon oxynitride, or silicon nitride may be stacked over the insulator.

Note that each of the insulators 1220, 1222, and 1224 may have a stacked-layer structure including two or more layers. In this case, the stacked layers are not necessarily formed of the same material but may be formed of different materials.

In the case where the insulator 1222 including a high-k material is provided between the insulator 1220 and the insulator 1224, electrons can be trapped in the insulator 1222 under specific conditions, and the threshold voltage can be increased. As a result, the insulator 1222 is negatively charged in some cases.

For example, in the case where the insulator 1220 and the insulator 1224 are formed using silicon oxide and the insulator 1222 is formed using a material having a lot of electron trap states such as hafnium oxide, aluminum oxide, or tantalum oxide, the state where the potential of the conductor 1205 is higher than the potential of the source electrode and the drain electrode is kept at a temperature higher than the operating temperature or the storage temperature of the semiconductor device (e.g., at a temperature higher than or equal to 125° C. and lower than or equal to 450° C., typically higher than or equal to 150° C. and lower than or equal to 300° C.) for 10 milliseconds or longer, typically one minute or longer. Thus, electrons are moved from the oxide 1230 in the transistor 1200A to the conductor 1205. At this time, some of the moving electrons are trapped by the electron trap states of the insulator 1222.

In the transistor in which a necessary amount of electrons is trapped by the electron trap states of the insulator 1222, the threshold voltage is shifted in the positive direction. By controlling the voltage of the conductor 1205, the amount of electrons to be trapped can be controlled, and thus the threshold voltage can be controlled. The transistor 1200A having the structure is a normally-off transistor which is in a non-conducting state (also referred to as an off state) even when the gate voltage is 0 V.

The treatment for trapping the electrons may be performed in the manufacturing process of the transistor. For example, the treatment is preferably performed at any step before factory shipment, such as after the formation of a conductor connected to a source conductor or a drain conductor of the transistor, after the preceding process (wafer processing), after a wafer-dicing step, or after packaging.

The threshold voltages can be controlled by appropriate adjustment of the thicknesses of the insulator 1220, the insulator 1222, and the insulator 1224. For example, when the total thickness of the insulator 1220, the insulator 1222, and the insulator 1224 is reduced, a voltage is efficiently applied from the conductor 1205, resulting in low power consumption of the transistor. The total thickness of the insulators 1220, 1222, and 1224 is less than or equal to 65 nm, preferably less than or equal to 20 nm.

Thus, a transistor having a low leakage current in an off state can be provided. A transistor with stable electrical characteristics can be provided. A transistor having high on-state current can be provided. A transistor having a small subthreshold swing value can be provided. A highly reliable transistor can be provided.

The oxide 1230a, the oxide 1230b, and the oxide 1230c are formed using a metal oxide such as an In-M-Zn oxide (M is Al, Ga, Y, or Sn). Alternatively, an In—Ga oxide or an In—Zn oxide may be used for the oxide 1230.

The oxide 1230 according to the present invention is described below.

An oxide used for the oxide 1230 preferably contains at least indium or zinc. In particular, indium and zinc are preferably contained. In addition, aluminum, gallium, yttrium, tin, or the like is preferably contained. Furthermore, one or more elements selected from boron, silicon, titanium, iron, nickel, germanium, zirconium, molybdenum, lanthanum, cerium, neodymium, hafnium, tantalum, tungsten, magnesium, or the like may be contained.

Here, the case where an oxide contains indium, an element M, and zinc is considered. The element M is aluminum, gallium, yttrium, tin, or the like. Other elements which can be used as the element M are boron, silicon, titanium, iron, nickel, germanium, yttrium, zirconium, molybdenum, lanthanum, cerium, neodymium, hafnium, tantalum, tungsten, magnesium, and the like. Note that two or more of the above elements may be used in combination as the element M.

Next, preferred ranges of atomic ratios of indium to the element M and zinc in the oxide of one embodiment of the present invention are described with reference to FIGS. 28A to 28C. Note that the proportion of oxygen atoms is not illustrated in FIGS. 28A to 28C. The terms of the atomic ratio of indium to the element M and zinc in the oxide are denoted by [In], [M], and [Zn], respectively.

Figure 28A:
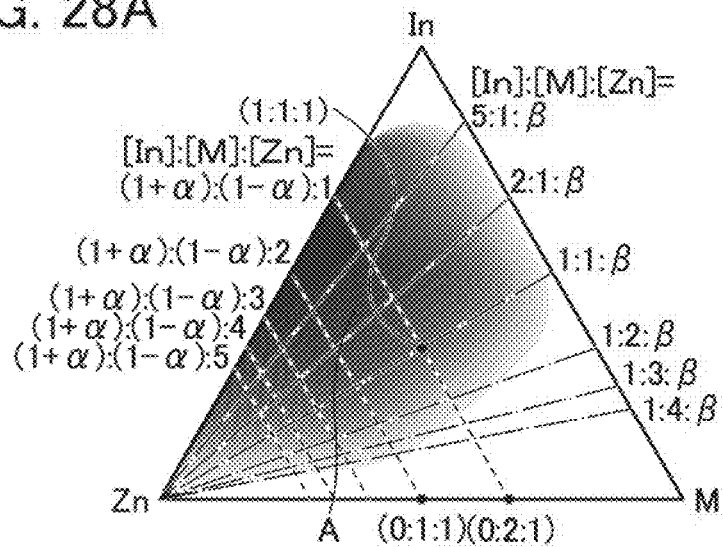
FIGS. 28A to 28C each illustrate an atomic ratio range of an oxide.
Figure 28B:
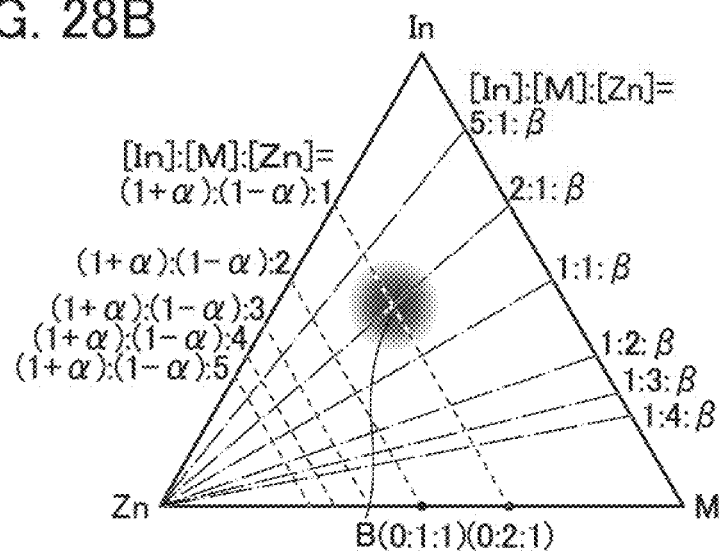
Figure 28C:
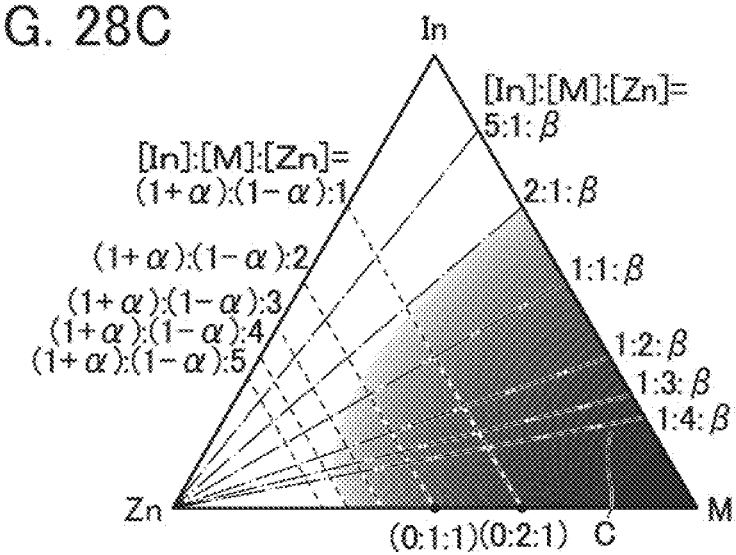

In FIGS. 28A to 28C, dashed lines indicate a line where the atomic ratio [In]:[M]:[Zn] is $(1+\alpha):(1-\alpha):1$ where $\alpha$ is a real number greater than or equal to −1 and less than or equal to 1, a line where the atomic ratio [In]:[M]:[Zn] is (1+α):(1−α):2, a line where the atomic ratio [In]:[M]:[Zn] is (1+α):(1−α):3, a line where the atomic ratio [In]:[M]:[Zn] is (1+α):(1−α):4, and a line where the atomic ratio [In]:[M]:[Zn] is (1+α):(1−α):5.

Dashed-dotted lines indicate a line where the atomic ratio [In]:[M]:[Zn] is 1:1:β, where β is a real number greater than or equal to 0, a line where the atomic ratio [In]:[M]:[Zn] is 1:2:β, a line where the atomic ratio [In]:[M]:[Zn] is 1:3:β, a line where the atomic ratio [In]:[M]:[Zn] is 1:4:β, a line where the atomic ratio [In]:[M]:[Zn] is 2:1:β, and a line where the atomic ratio [In]:[M]:[Zn] is 5:1:β.

The metal oxide in FIGS. 28A to 28C with an atomic ratio of [In]:[M]:[Zn]=0:2:1 or an atomic ratio that is in the neighborhood thereof is likely to have a spinel crystal structure.

FIGS. 28A and 28B illustrate examples of the preferred ranges of the atomic ratios of indium to the element M and zinc contained in an oxide of one embodiment of the present invention.

Figure 29:
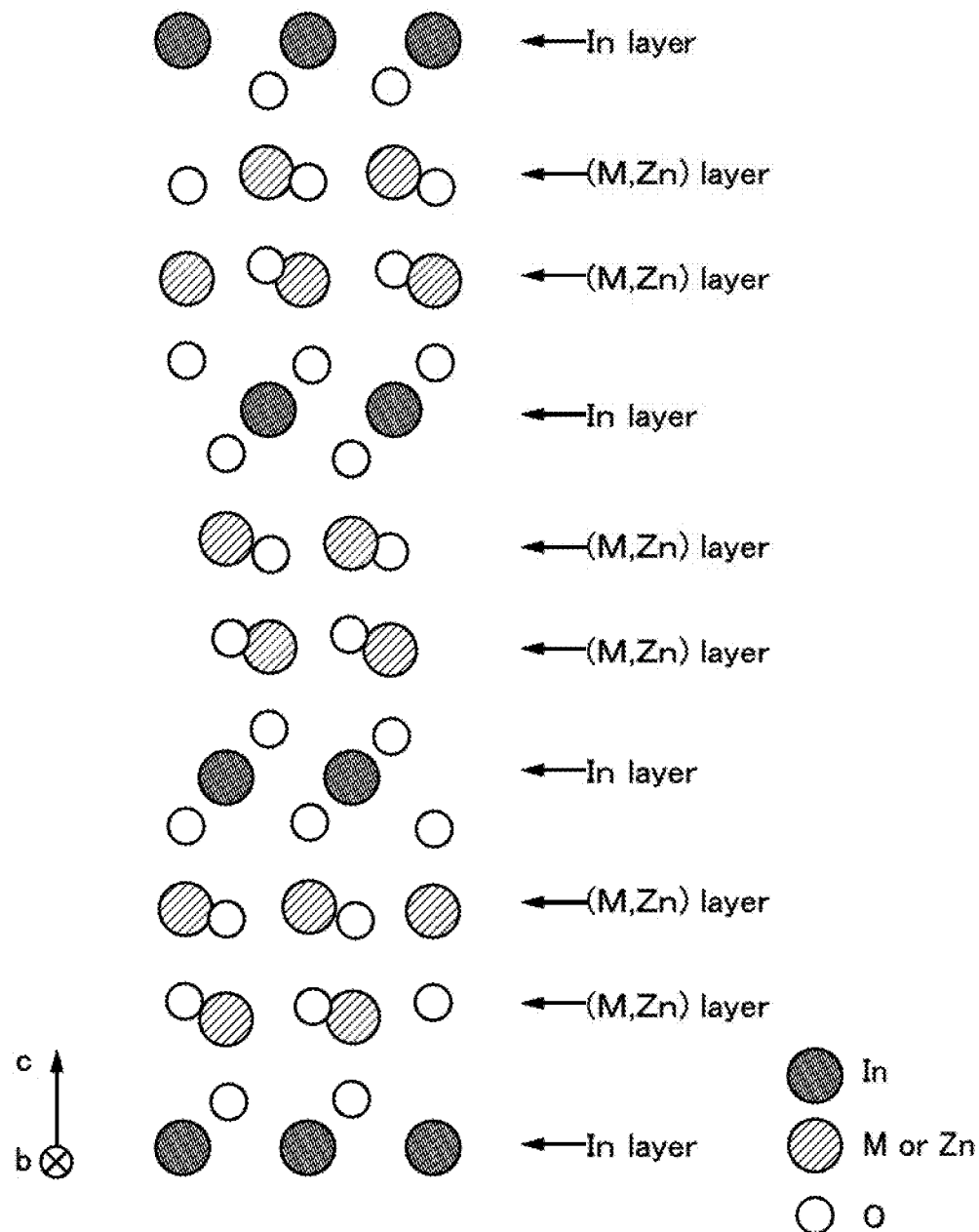
FIG. 29 illustrates an $InMZnO_4$ crystal.

As an example, FIG. 29 shows a crystal structure of $InMZnO_4$ whose atomic ratio [In]:[M]:[Zn] is 1:1:1. The crystal structure illustrated in FIG. 29 is $InMZnO_4$ observed from a direction parallel to a b-axis. Note that a metal element in a layer that contains M, Zn, and oxygen (hereinafter, this layer is referred to as an "(M,Zn) layer") in FIG. 29 represents the element M or zinc. In that case, the proportion of the element M is the same as the proportion of zinc. The element M and zinc can be replaced with each other, and their arrangement is random.

Note that $InMZnO_4$ has a layered crystal structure (also referred to as a layered structure) and includes one layer that contains indium and oxygen (hereinafter referred to as an In layer) for every two (M,Zn) layers that contain the element M, zinc, and oxygen, as illustrated in FIG. 29.

Indium and the element M can be replaced with each other. Therefore, when the element M in the (M,Zn) layer is replaced with indium, the layer can also be referred to as an (In,M,Zn) layer. In that case, a layered structure that contains one In layer for every two (In,M,Zn) layers is obtained.

An oxide whose atomic ratio [In]:[M]:[Zn] is 1:1:2 has a layered structure that includes three (M,Zn) layers with respect to one In layer. In other words, if [Zn] is larger than [In] and [M], the proportion of (M,Zn) layers to In layers becomes higher when the oxide is crystallized.

Note that in the case where the number of (M,Zn) layers with respect to one In layer is not an integer in the oxide, the oxide might have plural kinds of layered structures where the number of (M,Zn) layers with respect to one In layer is an integer. For example, in the case of [In]:[M]:[Zn]=1:1:1.5, the oxide might have the following layered structures: a layered structure of two (M,Zn) layers with respect to one In layer and a layered structure of three(M,Zn) layers with respect to one In layer.

For example, in the case where the oxide is deposited with a sputtering apparatus, a film having an atomic ratio deviated from the atomic ratio of a target is formed. In particular, [Zn] in the film might be lower than [Zn] in the target depending on the substrate temperature in deposition.

A plurality of phases (e.g., two phases or three phases) exists in the oxide in some cases. For example, with an atomic ratio [In]:[M]:[Zn] that is close to 0:2:1, two phases of a spinel crystal structure and a layered crystal structure are likely to exist. In addition, with an atomic ratio [In]:[M]:[Zn] that is close to 1:0:0, two phases of a bixbyite crystal structure and a layered crystal structure are likely to exist. In the case where a plurality of phases exists in the oxide, a grain boundary might be formed between different crystal structures.

In addition, the oxide containing indium in a higher proportion can have a higher carrier mobility (electron mobility). This is because in an oxide containing indium, the element M, and zinc, the s orbital of heavy metal mainly contributes to carrier transfer, and when the indium content in the oxide is increased, overlaps of the s orbitals of indium atoms are increased; therefore, an oxide having a high content of indium has a higher carrier mobility than an oxide having a low content of indium.

In contrast, when the indium content and the zinc content in an oxide become lower, carrier mobility becomes lower. Thus, with atomic ratios of [In]:[M]:[Zn]=0:1:0 and the neighborhood thereof (e.g., a region C in FIG. 28C), insulation performance becomes better.

Accordingly, an oxide of one embodiment of the present invention preferably has an atomic ratio represented by a region A in FIG. 28A. With the atomic ratio, a layered structure with a high carrier mobility and a few grain boundaries is easily obtained.

A region B in FIG. 28B represents an atomic ratio of [In]:[M]:[Zn]=4:2:3 or 4:2:4.1 and the neighborhood thereof. The neighborhood includes an atomic ratio of [In]:[Zn]=5:3:4. An oxide with an atomic ratio represented by the region B is an excellent oxide that has particularly high crystallinity and high carrier mobility.

Note that the condition where an oxide forms a layered structure is not uniquely determined by an atomic ratio. There is a difference in the degree of difficulty in forming a layered structure among atomic ratios. Even with the same atomic ratio, whether a layered structure is formed or not depends on a formation condition. Therefore, the illustrated regions each represent an atomic ratio with which an oxide has a layered structure, and boundaries of the regions A to C are not clear.

Next, the case where the oxide is used for a transistor is described.

Note that when the oxide is used for a transistor, carrier scattering or the like at a grain boundary can be reduced; thus, the transistor can have high field-effect mobility. In addition, the transistor can have high reliability.

An oxide with a low carrier density is preferably used for the transistor. For example, an oxide whose carrier density is lower than $8 \times 10^{11}$ cm$^{-3}$, preferably lower than $1 \times 10^{11}$ cm$^{-3}$, further preferably lower than $1 \times 10^{10}$ cm$^{-3}$, and higher than or equal to $1 \times 10^{-9}$ cm$^{-3}$ is used.

Note that a highly purified intrinsic or substantially highly purified intrinsic metal oxide has few carrier generation sources, and thus has a low carrier density. A highly purified intrinsic or substantially highly purified intrinsic metal oxide has a low density of defect states and accordingly has low density of trap states in some cases.

Charge trapped by the trap states in the oxide takes a long time to be released and may behave like fixed charge. Thus, a transistor whose channel region is formed in an oxide having a high density of trap states has unstable electrical characteristics in some cases.

In order to obtain stable electrical characteristics of the transistor, it is effective to reduce the concentration of impurities in the oxide. In addition, in order to reduce the concentration of impurities in the oxide, the concentration of impurities in a film that is adjacent to the oxide is preferably reduced. As examples of the impurities, hydrogen, nitrogen, alkali metal, alkaline earth metal, iron, nickel, silicon, and the like are given.

Here, the influence of impurities in the oxide is described.

When silicon or carbon that is a Group 14 element is contained in the oxide, defect states are formed. Thus, the concentration of silicon or carbon (measured by secondary ion mass spectrometry (SIMS)) is set to be lower than or equal to $2 \times 10^{18}$ atoms/cm$^3$, preferably lower than or equal to $2 \times 10^{17}$ atoms/cm$^3$ in the oxide or around an interface with the oxide.

When the metal oxide contains alkali metal or alkaline earth metal, defect states are formed and carriers are generated, in some cases. Thus, a transistor including an oxide that contains alkali metal or alkaline earth metal is likely to be normally-on. Therefore, it is preferable to reduce the concentration of alkali metal or alkaline earth metal in the oxide. Specifically, the concentration of alkali metal or alkaline earth metal in the metal oxide, which is measured by SIMS, is lower than or equal to $1 \times 10^{18}$ atoms/cm$^3$, preferably lower than or equal to $2 \times 10^{16}$ atoms/cm$^3$.

When containing nitrogen, the oxide easily becomes n-type by generation of electrons serving as carriers and an increase of carrier density. Thus, a transistor whose semiconductor includes an oxide containing nitrogen is likely to be normally-on. For this reason, nitrogen in the oxide is preferably reduced as much as possible; for example, the concentration of nitrogen in the oxide measured by SIMS is set to be lower than $5 \times 10^{19}$ atoms/cm$^3$, preferably lower than or equal to $5 \times 10^{18}$ atoms/cm$^3$, further preferably lower than or equal to $1 \times 10^{18}$ atoms/cm$^3$, and still further preferably lower than or equal to $5 \times 10^{17}$ atoms/cm$^3$.

Hydrogen contained in an oxide reacts with oxygen bonded to a metal atom to be water, and thus causes an oxygen vacancy in some cases. Entry of hydrogen into the oxygen vacancy generates an electron serving as a carrier in some cases. Furthermore, in some cases, bonding of part of hydrogen to oxygen bonded to a metal atom causes generation of an electron serving as a carrier. Thus, a transistor including an oxide that contains hydrogen is likely to be normally-on. Accordingly, hydrogen in the oxide is preferably reduced as much as possible. Specifically, the concentration of hydrogen in the oxide measured by SIMS is set to be lower than $1 \times 10^{20}$ atoms/cm$^3$, preferably lower than $1 \times 10^{19}$ atoms/cm$^3$, further preferably lower than $5 \times 10^{18}$ atoms/cm$^3$, and still further preferably lower than $1 \times 10^{18}$ atoms/cm$^3$.

When an oxide with sufficiently reduced impurity concentration is used for a channel region in a transistor, the transistor can have stable electrical characteristics.

Next, the case where the oxide has a two-layer structure or a three-layer structure is described. A band diagram of a stacked-layer structure of an oxide S1, an oxide S2, and an oxide S3 and insulators that are in contact with the stacked-layer structure, a band diagram of a stacked-layer structure of the oxides S2 and S3 and insulators that are in contact with the stacked-layer structure, and a band diagram of a stacked-layer structure of the oxides S1 and S2 and insulators that are in contact with the stacked-layer structure are described with reference to FIGS. 30A to 30C.

Figure 30A:
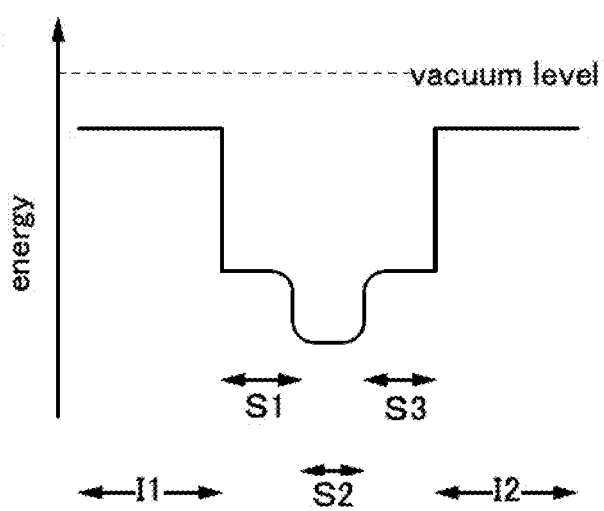
FIGS. 30A to 30C are each a band diagram of a stacked structure in an oxide.
Figure 30B:
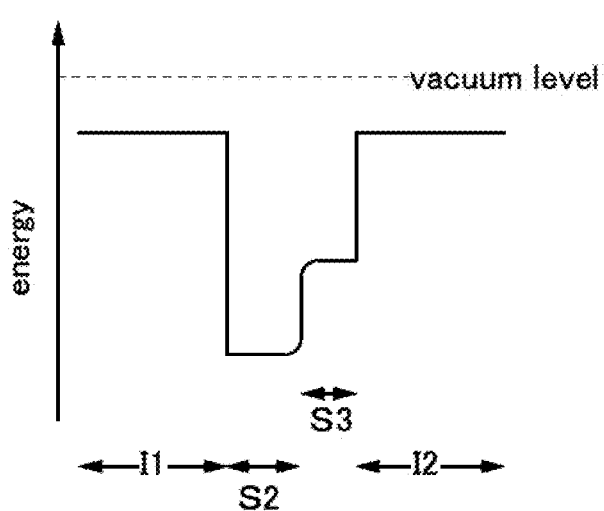
Figure 30C:
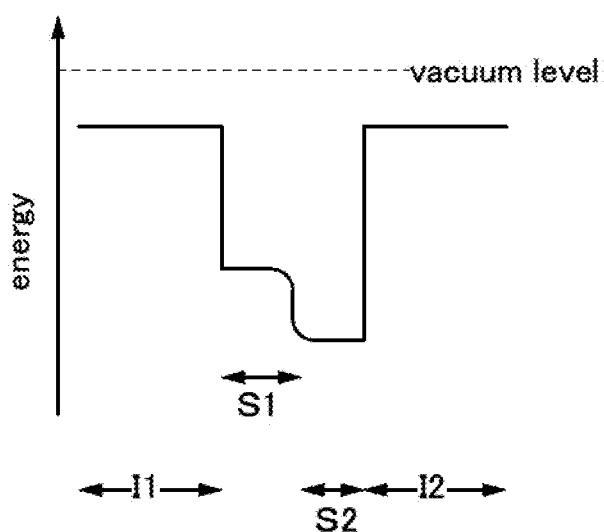

FIG. 30A is an example of a band diagram of a stacked structure including an insulator I1, the oxide S1, the oxide S2, the oxide S3, and an insulator I2 in a thickness direction. FIG. 30B is an example of a band diagram of a stacked structure including the insulator I1, the oxide S2, the oxide S3, and the insulator I2 in a thickness direction. FIG. 30C is an example of a band diagram of a stacked structure including the insulator I1, the oxide semiconductor S1, the oxide semiconductor S2, and the insulator I2 in a thickness direction. Note that for easy understanding, the band diagrams show the energy level of the conduction band minimum (Ec) of each of the insulator I1, the oxide S1, the oxide S2, the oxide S3, and the insulator I2.

The energy level of the conduction band minimum of each of the oxides S1 and S3 is closer to the vacuum level than that of the oxide S2 is. Typically, the conduction band minimum of the oxide S2 is lower than the conduction band minimum of each of the oxide S1 and the oxide S3. Specifically, a difference in the energy level between the conduction band minimum of the oxide S2 and the conduction band minimum of each of the oxides S1 and S3 is preferably greater than or equal to 0.15 eV and less than or equal to 2 eV, further preferably greater than or equal to 0.5 eV and less than or equal to 1 eV. That is, it is preferable that the electron affinity of the oxide S2 be higher than the electron affinity of each of the oxides S1 and S3, and the difference between the electron affinity of each of the oxides S1 and S3 and the electron affinity of the oxide S2 be greater than or equal to 0.15 eV and less than or equal to 2 eV, further preferably greater than or equal to 0.5 eV and less than or equal to 1 eV.

As shown in FIGS. 30A to 30C, the energy level of the conduction band minimum of each of the oxides S1 to S3 is gradually varied. In other words, the energy level of the conduction band minimum is continuously changed or continuously connected. In order to obtain such a band diagram, the density of defect states in a mixed layer formed at an interface between the oxide semiconductors S1 and S2 or an interface between the oxide semiconductors S2 and S3 is preferably made low.

Specifically, when the oxides S1 and S2 or the oxides S2 and S3 contain the same element (as a main component) in addition to oxygen, a mixed layer with a low density of defect states can be formed. For example, in the case where the oxide S2 is an In-Ga-Zn oxide, it is preferable to use an In-Ga-Zn oxide, a Ga-Zn oxide, gallium oxide, or the like as each of the oxides S1 and S3.

At this time, the oxide S2 serves as a main carrier path. Since the density of defect states at the interface between the oxide S1 and the oxide S2 and the interface between the oxide S2 and the oxide S3 can be made low, the influence of interface scattering on carrier conduction is small, and a high on-state current can be obtained.

When an electron is trapped in a trap state, the trapped electron behaves like fixed charge; thus, the threshold voltage of the transistor is shifted in a positive direction. The oxides S1 and S3 can make the trap state apart from the oxide S2. This structure can prevent the positive shift of the threshold voltage of the transistor.

A material whose conductivity is sufficiently lower than that of the oxide S2 is used for the oxides S1 and S3. In that case, the oxide S2, the interface between the oxide S1 and the oxide S2, and the interface between the oxide S2 and the oxide S3 mainly function as a channel region. For example, an oxide with high insulation performance and the atomic ratio represented by the region C in FIG. 28C may be used as each of the oxides S1 and S3. Note that the region C in FIG. 28C represents the atomic ratio of [In]:[M]:[Zn]=0:1:0 or the neighborhood thereof.

In the case where an oxide with the atomic ratio represented by the region A is used as the oxide S2, it is particularly preferable to use an oxide with an atomic ratio where [M]/[In] is greater than or equal to 1, preferably greater than or equal to 2, as each of the oxide S1 and the oxide S3. In addition, it is suitable to use an oxide with sufficiently high insulation performance and an atomic ratio where [M]/([Zn]+[In]) is greater than or equal to 1 as the oxide S3.

The insulator 1250 can have a single-layer structure or a stacked-layer structure using, for example, an insulator containing a so-called high-k material such as silicon oxide, silicon oxynitride, silicon nitride oxide, aluminum oxide, hafnium oxide, tantalum oxide, zirconium oxide, lead zirconate titanate (PZT), strontium titanate ($SrTiO_3$), or (Ba, Sr)$TiO_3$ (BST). Aluminum oxide, bismuth oxide, germanium oxide, niobium oxide, silicon oxide, titanium oxide, tungsten oxide, yttrium oxide, or zirconium oxide may be added to the insulator, for example. The insulator may be subjected to nitriding treatment. A layer of silicon oxide, silicon oxynitride, or silicon nitride may be stacked over the insulator.

As the insulator 1250, like the insulator 1224, an oxide insulator that contains oxygen in excess of that in the stoichiometric composition is preferably used. When such an insulator containing excess oxygen is provided in contact with the oxide 1230, oxygen vacancies in the oxide 1230 can be reduced.

As the insulator 1250, an insulating film formed of aluminum oxide, aluminum oxynitride, gallium oxide, gallium oxynitride, yttrium oxide, yttrium oxynitride, hafnium oxide, hafnium oxynitride, silicon nitride, or the like, which has barrier properties against oxygen and hydrogen, can be used. The insulator 1250 formed of such a material functions as a layer that prevents release of oxygen from the oxide 1230 or entry of impurities such as hydrogen from the outside.

Note that the insulator 1250 may have a stacked-layer structure similar to that of the insulator 1220, the insulator 1222, and the insulator 1224. When the insulator 1250 includes an insulator in which a necessary amount of electrons is trapped by electron trap states, the threshold voltage of the transistor 1200A can be shifted in the positive direction. The transistor 1200A having the structure is a normally-off transistor which is in a non-conducting state (also referred to as an off state) even when the gate voltage is 0 V.

In addition to the insulator 1250, a barrier film may be provided between the oxide 1230 and the conductor 1260 in the semiconductor device illustrated in FIGS. 21A to 21C. The oxide 1230c may have a barrier property.

For example, an insulating film containing excess oxygen is provided in contact with the oxide 1230 and covered by a barrier film, whereby the composition of the oxide can be almost the same as the stoichiometric composition or can be in a supersaturated state containing more oxygen than that in the stoichiometric composition. It is also possible to prevent entry of impurities such as hydrogen into the oxide 1230.

One of a pair of the conductor 1240a and the conductor 1240b functions as a source electrode, and the other functions as a drain electrode.

Any of metals such as aluminum, titanium, chromium, nickel, copper, yttrium, zirconium, molybdenum, silver, tantalum, and tungsten, or an alloy containing any of the metals as its main component can be used for each of the conductors 1240a and 1240b. In particular, a metal nitride film such as a tantalum nitride film is preferable because it has a barrier property against hydrogen or oxygen and has high oxidation resistance.

Although a single-layer structure is illustrated in the drawings, a stacked-layer structure of two or more layers may be used. For example, a tantalum nitride film and a tungsten film may be stacked. Alternatively, a titanium film and an aluminum film may be stacked. Other examples include a two-layer structure where an aluminum film is stacked over a tungsten film, a two-layer structure where a copper film is stacked over a copper-magnesium-aluminum alloy film, a two-layer structure where a copper film is stacked over a titanium film, and a two-layer structure where a copper film is stacked over a tungsten film.

Other examples include a three-layer structure where a titanium film or a titanium nitride film is formed, an aluminum film or a copper film is stacked over the titanium film or the titanium nitride film, and a titanium film or a titanium nitride film is formed over the aluminum film or the copper film; and a three-layer structure where a molybdenum film or a molybdenum nitride film is formed, an aluminum film or a copper film is stacked over the molybdenum film or the molybdenum nitride film, and a molybdenum film or a molybdenum nitride film is formed over the aluminum film or the copper film. Note that a transparent conductive material containing indium oxide, tin oxide, or zinc oxide may be used.

The conductor 1260 functioning as a gate electrode can be formed using, for example, a metal selected from aluminum, chromium, copper, tantalum, titanium, molybdenum, and tungsten, an alloy containing any of these metals as its component, an alloy containing any of these metals in combination, or the like. In particular, a metal nitride film such as a tantalum nitride film is preferable because it has a barrier property against hydrogen or oxygen and has high oxidation resistance. Furthermore, one or both of manganese and zirconium may be used. Alternatively, a semiconductor typified by polycrystalline silicon doped with an impurity element such as phosphorus, or a silicide such as nickel silicide may be used. Although a single-layer structure is illustrated in the drawings, a stacked-layer structure of two or more layers may be used.

A two-layer structure where a titanium film is stacked over an aluminum film may be employed, for example. Other examples include a two-layer structure where a titanium film is stacked over a titanium nitride film, a two-layer structure where a tungsten film is stacked over a titanium nitride film, and a two-layer structure where a tungsten film is stacked over a tantalum nitride film or a tungsten nitride film.

Other examples include a three-layer structure where a titanium film is formed, an aluminum film is stacked over the titanium film, and a titanium film is formed over the aluminum film. An alloy film or a nitride film that contains aluminum and one or more metals selected from titanium, tantalum, tungsten, molybdenum, chromium, neodymium, and scandium may be used.

The conductor 1260 can also be formed using a light-transmitting conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added. The conductor 1260 can have a stacked structure using the above light-transmitting conductive material and the above metal.

Next, the insulator 1280 and the insulator 1282 are provided over the transistor 1200A.

The insulator 1280 preferably contains an oxide containing oxygen more than that in the stoichiometric composition. That is, in the insulator 1280, a region containing oxygen in excess of that in the stoichiometric composition (hereinafter also referred to as oxygen-excess region) is preferably formed. In particular, in the case of using an oxide semiconductor in the transistor 1200A, when an insulator including an excess-oxygen region is provided in an interlayer film or the like in the vicinity of the transistor 1200A, oxygen vacancies in the oxide 1230 of the transistor 1200A are reduced, whereby the reliability can be improved.

As the insulator including the excess-oxygen region, specifically, an oxide material that releases part of oxygen by heating is preferably used. Oxide that releases part of oxygen by heating is an oxide film of which the amount of released oxygen converted into oxygen atoms is greater than or equal to $1.0 \times 10^{18}$ atoms/cm$^3$, preferably greater than or equal to $3.0 \times 10^{20}$ atoms/cm$^3$ in TDS analysis. Note that the temperature of the film surface in the TDS analysis is preferably higher than or equal to 100° C. and lower than or equal to 700° C., or higher than or equal to 100° C. and lower than or equal to 500° C.

For example, as such a material, a material containing silicon oxide or silicon oxynitride is preferably used. Alternatively, a metal oxide can be used. Note that in this specification, "silicon oxynitride" refers to a material that contains oxygen at a higher proportion than nitrogen, and "silicon nitride oxide" refers to a material that contains nitrogen at a higher proportion than oxygen.

The insulator 1280 covering the transistor 1200A may function as a planarization film that covers a roughness thereunder.

The insulator 1282 is preferably formed using an insulating film having a barrier property against oxygen or hydrogen, e.g., an aluminum oxide film or hafnium oxide film. The insulator 1282 formed of such a material functions as a layer that prevents release of oxygen from the metal oxide 1230 or entry of impurities such as hydrogen from the outside.

The above structure makes it possible to provide a transistor including an oxide semiconductor with high on-state current. A transistor including an oxide semiconductor with low off-state current can be provided. Furthermore, when the transistor with the above structure is used in a semiconductor device, variation in the electrical characteristics of the semiconductor device can be reduced, and the reliability thereof can be improved. Furthermore, a semiconductor device with low power consumption can be provided.

<Transistor Structure 2>

Figure 22A:
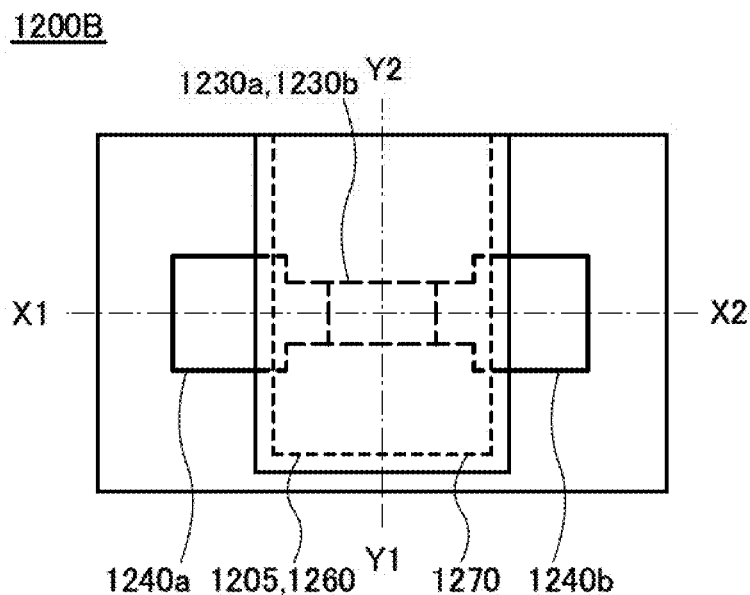
FIG. 22A is a top view and FIGS. 22B and 22C are cross-sectional views illustrating a structural example of a transistor.
Figure 22B:
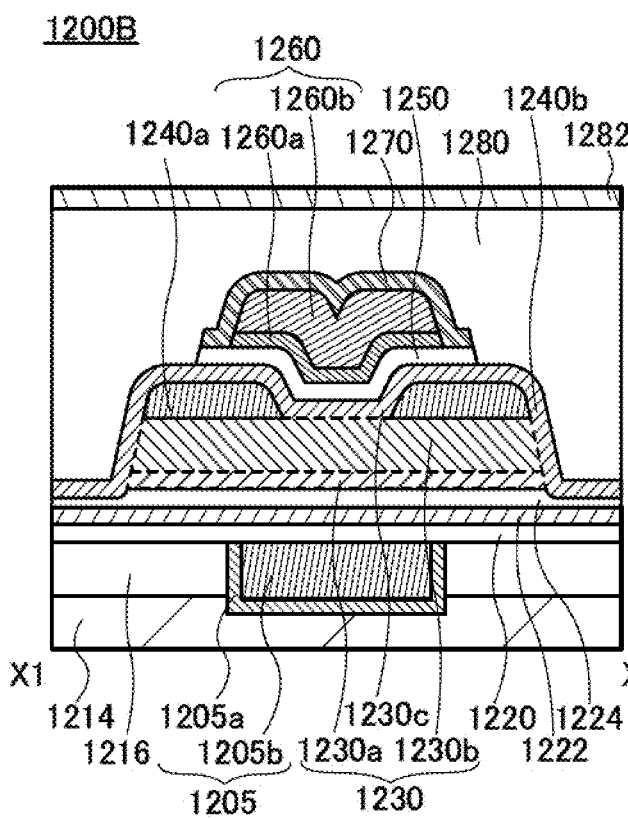
Figure 22C:
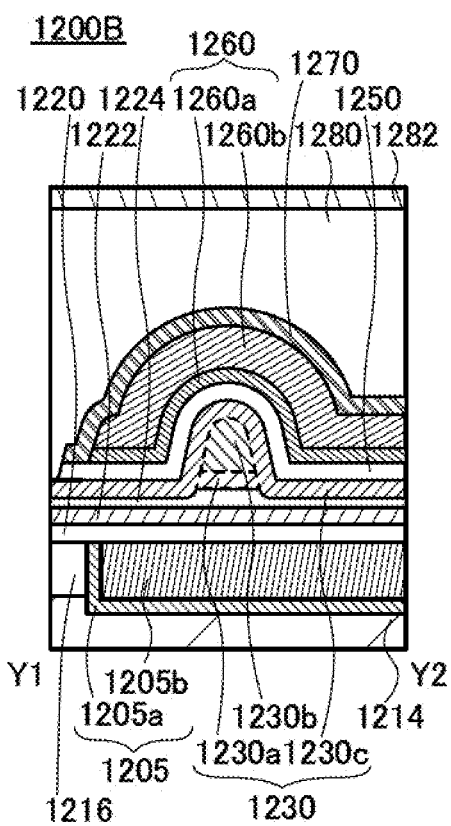

FIGS. 22A to 22C illustrate an example of a transistor structure different from that in FIGS. 21A to 21C. FIG. 22A illustrates a top surface of a transistor 1200B. Some films are omitted in FIG. 22A for simplification of the drawing. FIG. 22B is a cross-sectional view along the dashed-dotted line X1-X2 in FIG. 22A. FIG. 22C is a cross-sectional view along the dashed-dotted line Y1-Y2 in FIG. 22A. Note that the direction of the dashed-dotted line X1-X2 may be called the channel length direction, and the direction of the dashed-dotted line Y1-Y2 may be called the channel width direction.

Note that in the transistor 1200B illustrated in FIGS. 22A to 22C, components having the same function as the components in the transistor 1200A in FIGS. 21A to 21C are denoted by the same reference numerals.

In the structure in FIGS. 22A to 22C, the conductor 1260 has two stacked layers of a conductor 1260a and a conductor 1260b. In the two-layer structure, layers formed using the same material may be stacked. For example, the conductor 1260a is formed by a thermal CVD method, an MOCVD method, or an ALD method. In particular, the conductor 1260a is preferably formed by an ALD method. The application of an ALD method or the like can reduce damage to the insulator 1250 which is caused during deposition. Furthermore, it is preferable to form the conductor 1260a by an ALD method or the like, because coverage can be improved. Thus, the transistor with high reliability can be provided.

Next, the conductor 1260b is formed by a sputtering method. At that time, since the conductor 1260a is provided over the insulator 1250, damage caused during deposition of the conductor 1260b can be prevented from affecting the insulator 1250. Since the deposition rate in a sputtering method is higher than that in an ALD method, the productivity can be improved with a high yield.

In the structure illustrated in FIGS. 22A to 22C, an insulator 1270 is provided to cover the conductor 1260. In the case where the insulator 1280 is formed using an oxide material from which oxygen is released, the insulator 1270 is formed using a substance having a barrier property against oxygen to prevent the conductor 1260b from being oxidized by the released oxygen.

For example, the insulator 1270 can be formed using metal oxide such as aluminum oxide. The insulator 1270 is formed to a thickness with which the oxidation of the conductor 1260 is prevented. For example, the thickness of the insulator 1270 is set greater than or equal to 1 nm and less than or equal to 10 nm, preferably greater than or equal to 3 nm and less than or equal to 7 nm.

This structure can expand the range of choices for materials of the conductor 1260. For example, a material which has high conductivity while having low oxidation resistance, such as aluminum, can be used. Furthermore, a conductor that can be easily formed or processed can be used, for example.

Thus, the oxidation of the conductor 1260 can be prevented, and oxygen released from the insulator 1280 can be supplied to the oxide 1230 efficiently. Furthermore, a conductor that has high conductivity is used for the conductor 1260, whereby the transistor with low power consumption can be provided.

<Transistor Structure 3>

Figure 23A:
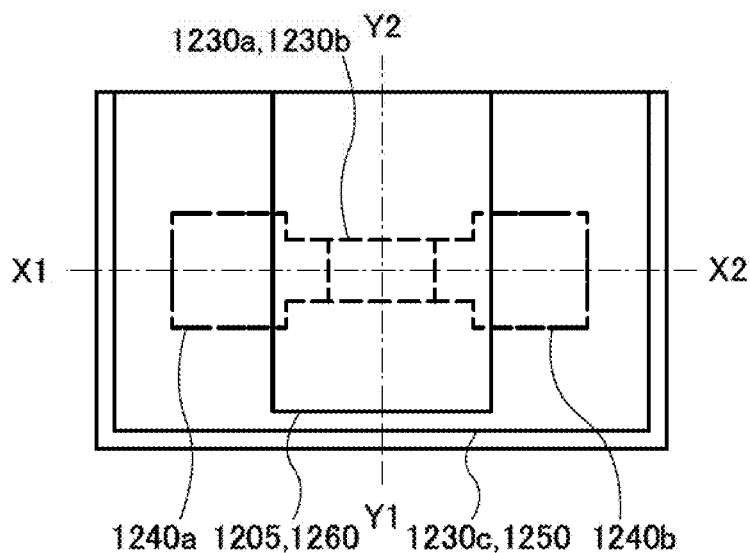
FIG. 23A is a top view and FIGS. 23B and 23C are cross-sectional views illustrating a structure example of a transistor.
Figure 23B:
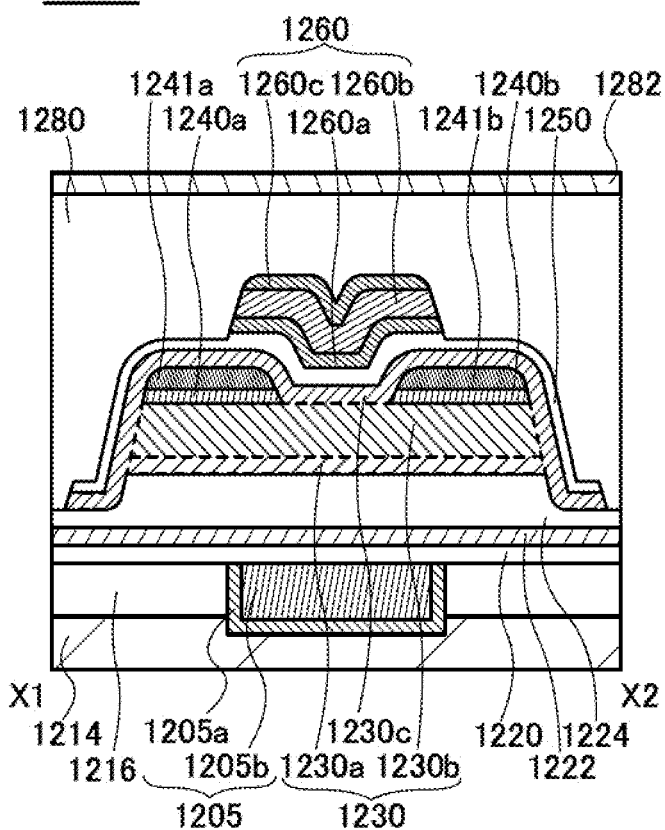
Figure 23C:
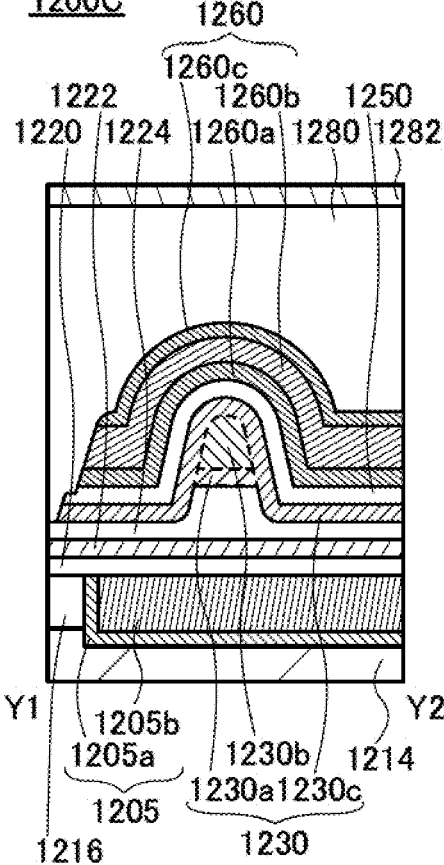

FIGS. 23A to 23C illustrate an example of a transistor structure different from those in FIGS. 21A to 21C and FIGS. 22A to 22C. FIG. 23A illustrates a top surface of a transistor 1200C. Some films are omitted in FIG. 23A for simplification of the drawing. FIG. 23B is a cross-sectional view along the dashed-dotted line X1-X2 in FIG. 23A. FIG. 23C is a cross-sectional view along the dashed-dotted line Y1-Y2 in FIG. 23A. Note that the direction of the dashed-dotted line X1-X2 may be called the channel length direction, and the direction of the dashed-dotted line Y1-Y2 may be called the channel width direction.

Note that in the transistor 1200C in FIGS. 23A to 23C, components having the same function as the components in the transistor 1200A in FIGS. 21A to 21C are denoted by the same reference numerals.

In the structure illustrated in FIGS. 23A to 23C, the conductor 1260 functioning as the gate electrode includes a conductor 1260a, a conductor 1260b, and a conductor 1260c. The oxide 1230c over the insulator 1224 may be divided as long as it covers the side surface of the oxide 1230b.

The conductor 1260a is formed by a thermal CVD method, an MOCVD method, and an ALD method. In particular, the conductor 1260a is preferably formed by an ALD method. The use of an ALD method or the like can reduce plasma damage to the insulator 1250. Furthermore, it is preferable to form the conductor 1260a by an ALD method or the like, because coverage can be improved. Thus, the transistor with high reliability can be provided.

The conductor 1260b is formed using a material having high conductivity, such as tantalum, tungsten, copper, or aluminum. The conductor 1260c, which is formed over the conductor 1260b, is preferably formed using a material with high oxidation resistance, such as tungsten nitride.

For example, in the case where an oxide material from which oxygen is released is used as the insulator 1280, when a conductor with high oxidation resistance is used as the conductor 1260c, a large area of which is in contact with the insulator 1280 including the oxygen-excess region, oxygen released from the oxygen-excess region can be prevented from being absorbed by the conductor 1260. Thus, the oxidation of the conductor 1260 can be prevented, and oxygen released from the insulator 1280 can be supplied to the metal oxide 1230 efficiently. Furthermore, a conductor that has high conductivity is used for the conductor 1260b, whereby the transistor with low power consumption can be provided.

As illustrated in FIG. 23C, the oxide 1230b is covered with the conductor 1260 in the channel width direction of the transistor. By the existence of a projection of the insulator 1224, the side surface of the oxide semiconductor 1230b can be covered with the conductor 1260. For example, at the side surfaces of the oxide 1230b, the bottom surface of the conductor 1260 is preferably located closer to the substrate than the bottom surface of the oxide 1230b by adjusting the shape of the projection of the insulator 1224. That is, the transistor 1200C has a structure in which the oxide 1230b can be electrically surrounded by an electric field of the conductor 1260. Such a structure in which the oxide 1230b is electrically surrounded by an electric field of the conductors is referred to as a surrounded channel (s-channel) structure. In the s-channel structure of the transistor 1200C, a channel can be formed in the whole (bulk) of the oxide 1230b. In the s-channel structure, the drain current of the transistor is increased, so that a larger amount of on-state current (current which flows between the source and the drain when the transistor is on) can be obtained. Furthermore, the entire channel formation region of the oxide 1230b can be depleted by the electric field of the conductor 1260. Accordingly, the off-state current of the s-channel transistor can be further reduced. When the channel width is shortened, the effects of the s-channel structure, such as an increase in on-state current and a reduction in off-state current, can be enhanced.

<Transistor Structure 4>

Figure 24A:
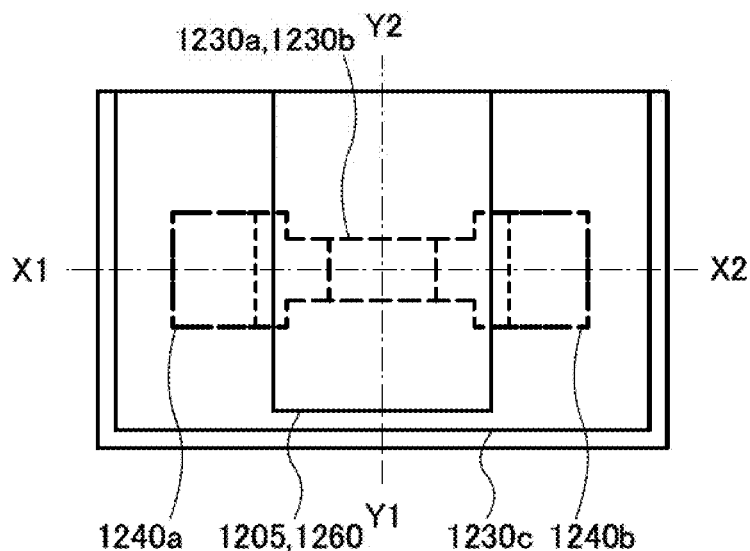
FIG. 24A is a top view and FIGS. 24B and 24C are cross-sectional views illustrating a structure example of a transistor.
Figure 24B:
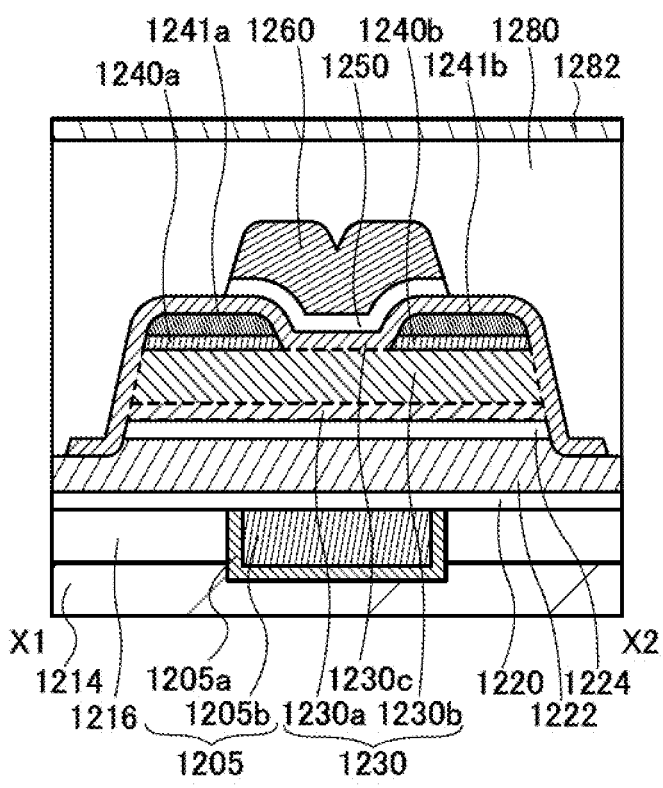
Figure 24C:
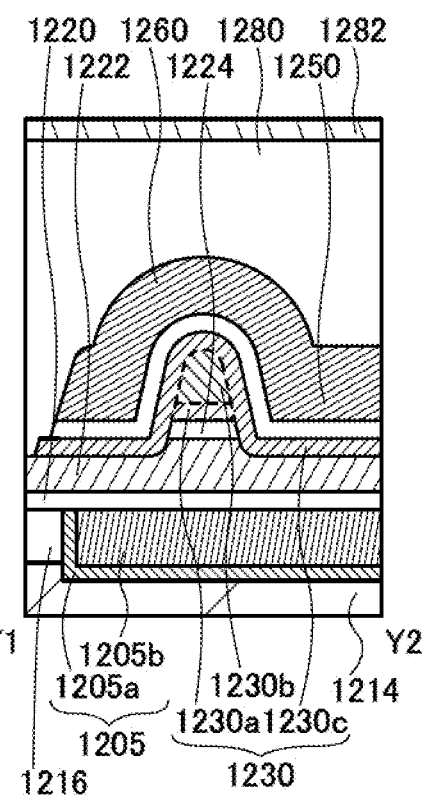

FIGS. 24A to 24C illustrate an example of a transistor structure different from those in FIGS. 21A to 21C, FIGS. 22A to 22C, and FIGS. 23A to 23C. FIG. 24A illustrates a top surface of a transistor 1200D. For simplification of the figure, some films are omitted in FIG. 24A. FIG. 24B is a cross-sectional view taken along dashed-dotted line X1-X2 in FIG. 24A, and FIG. 24C is a cross-sectional view taken along dashed-dotted line Y1-Y2 in FIG. 24A. Note that the direction of the dashed-dotted line X1-X2 may be called the channel length direction, and the direction of the dashed-dotted line Y1-Y2 may be called the channel width direction.

Note that in the transistor 1200D in FIGS. 24A to 24C, components having the same function as the components in the transistor 1200A in FIGS. 21A to 21C are denoted by the same reference numerals.

In the structure shown in FIGS. 24A to 24C, conductors functioning as a source and a drain have a stacked-layer structure. It is preferable that a conductor which is highly adhesive to the oxide 1230b be used as the conductors 1240a and 1240b, and a material with high conductivity be used as conductors 1241a and 1241b. The conductors 1240a and 1240b are preferably formed by an ALD method. When the conductors 1240a and 1240b are formed by an ALD method or the like, coverage can be improved.

For example, when metal oxide including indium is used as the oxide 1230b, titanium nitride or the like may be used as the conductors 1240a and 1240b. When a material having high conductivity, such as tantalum, tungsten, copper, or aluminum, is used for the conductors 1241a and 1241b, the transistor with high reliability and low power consumption can be provided.

As illustrated in FIGS. 24B and 24C, the oxide 1230b is covered with the conductor 1205 and the conductor 1260 in the channel width direction of the transistor. The insulator 1222 has a projection, whereby the side surface of the oxide 1230b is also covered with the conductor 1260.

Here, when a high-k material such as hafnium oxide is used as the insulator 1222, the equivalent oxide ($SiO_2$) thickness (EOT) of the insulator 1222 can be small because the insulator 1222 has a high relative dielectric constant. Accordingly, the distance between the conductor 1205 and the oxide 1230 can be increased owing to the physical thickness of the insulator 1222, without a reduction in the influence of the electric field which is applied from the conductor 1205 to the oxide 1230. Thus, the distance between the conductor 1205 and the oxide 1230 can be adjusted by changing the thickness of the insulator 1222.

For example, at the side surfaces of the oxide 1230b, the bottom surface of the conductor 1260 is preferably located closer to the substrate than the bottom surface of the oxide 1230b by adjusting the shape of the projection of the insulator 1224. That is, the transistor 1200D has a structure in which the oxide 1230b can be electrically surrounded by an electric field of the conductor 1260. Thus, like the transistor 1200C, the transistor 1200D has an s-channel structure. In the transistor 1200D with the s-channel structure, a channel can be formed in the whole (bulk) of the oxide semiconductor 1230b. In the s-channel structure, the drain current of the transistor is increased, so that a larger amount of on-state current (current which flows between the source and the drain when the transistor is on) can be obtained. Furthermore, the entire channel formation region of the oxide 1230b can be depleted by the electric field of the conductor 1260. Accordingly, the off-state current of the s-channel transistor can be further reduced. When the channel width is shortened, the effects of the s-channel structure, such as an increase in on-state current and a reduction in off-state current, can be enhanced.

<Transistor Structure 5>

Figure 25A:
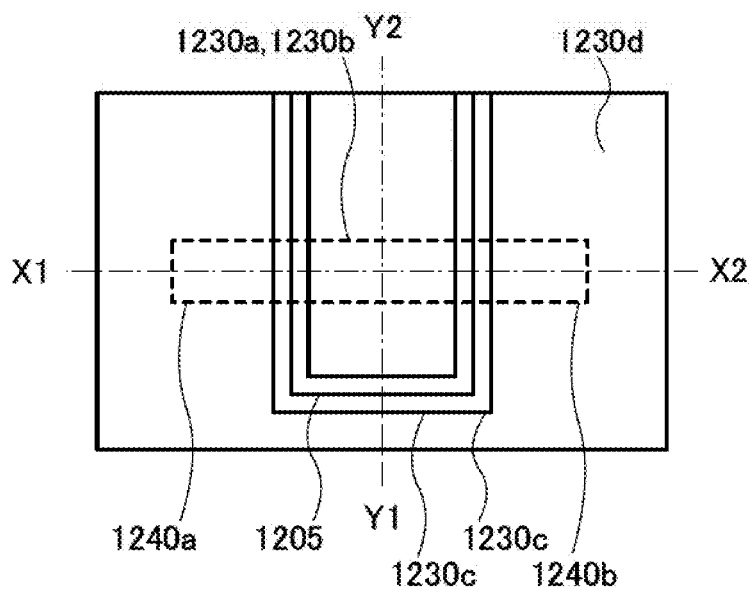
FIG. 25A is a top view and FIGS. 25B and 25C are cross-sectional views illustrating a structure example of a transistor.
Figure 25B:
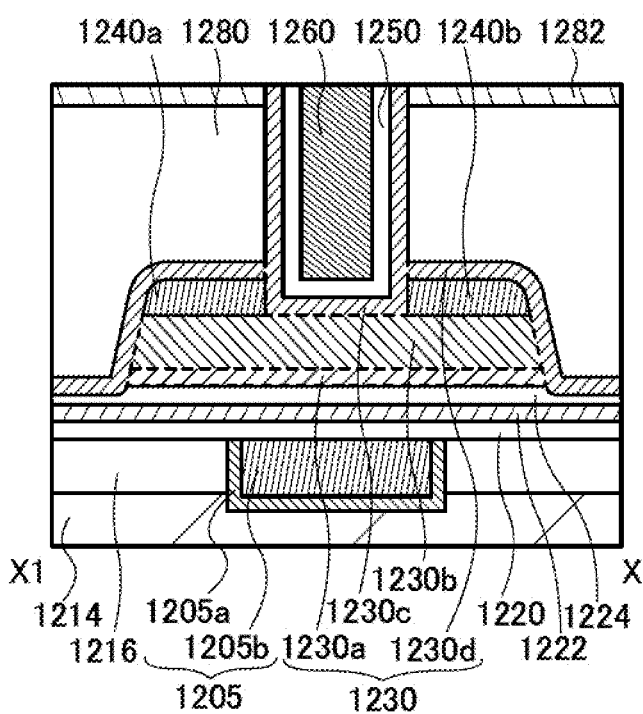
Figure 25C:
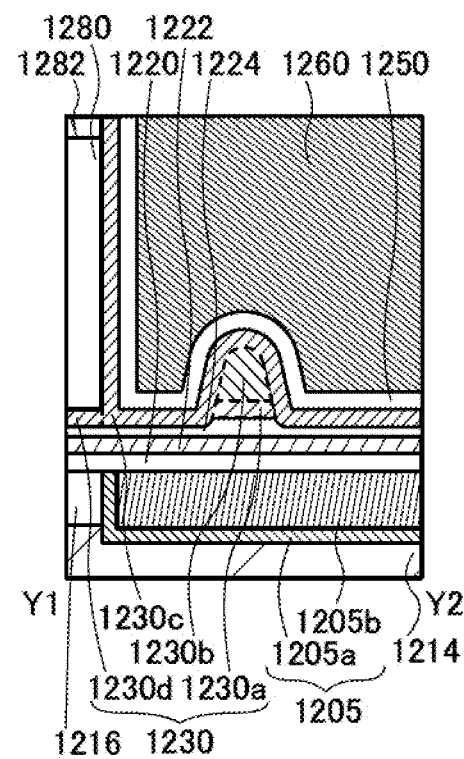

FIGS. 25A to 25C illustrate an example of a transistor structure different from those in FIGS. 21A to 21C, FIGS. 22A to 22C, FIGS. 23A to 23C, and FIGS. 24A to 24C. FIG. 25A illustrates a top surface of a transistor 1200E. For simplification of the drawing, some films are not illustrated in FIG. 25A. FIG. 25B is a cross-sectional view taken along dashed-dotted line X1-X2 in FIG. 25A, and FIG. 25C is a cross-sectional view taken along dashed-dotted line Y1-Y2. Note that the direction of the dashed-dotted line X1-X2 may be called the channel length direction, and the direction of the dashed-dotted line Y1-Y2 may be called the channel width direction.

Note that in the transistor 1200E in FIGS. 25A to 25C, components having the same function as the components in the transistor 1200A in FIGS. 21A to 21C are denoted by the same reference numerals.

In the transistor 1200E illustrated in FIGS. 25A to 25C, the oxide 1230c, the insulator 1250, and the conductor 1260 are formed in an opening formed in the insulator 1280. Furthermore, an end portion of each of the conductor 1240a and the conductor 1240*b* is aligned with an end portion of the opening formed in the insulator 1280. Furthermore, the end portion of each of the conductor 1240*a* and the conductor 1240*b* is aligned with part of an end portion of the oxide 1230. Thus, the conductors 1240*a* and 1240*b* can be formed concurrently with the opening in the insulator 1280. This leads to a reduction in the number of masks and steps and improvement in yield and productivity.

The conductor 1240*a*, the conductor 1240*b*, the oxide 1230*c*, and the oxide 1230*d* are in contact with the insulator 1280 having the oxygen-excess region with the oxide 1230*d* located therebetween. Thus, since the oxide 1230*d* exists between the insulator 1280 and the oxide 1230*b* including the region where the channel is formed, impurities such as hydrogen, water, and halogen can be prevented from diffusing from the insulator 1280 into the oxide 1230*b*.

Since the transistor 1200E illustrated in FIGS. 25A to 25C has a structure where the conductors 1240*a* and 1240*b* hardly overlap with the conductor 1260, the parasitic capacitance added to the conductor 1260 can be reduced. Thus, the transistor with a high operation frequency can be provided.

<Transistor Structure 6>

Figure 26A:
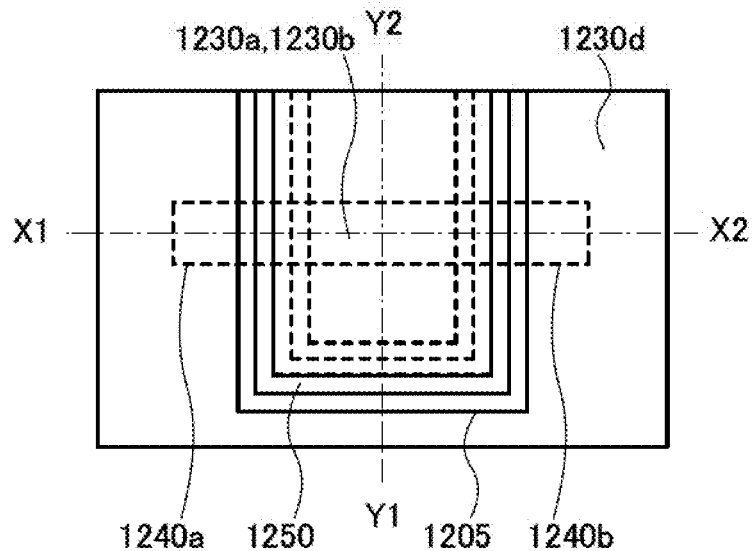
FIG. 26A is a top view and FIGS. 26B and 26C are cross-sectional views illustrating a structure example of a transistor.
Figure 26B:
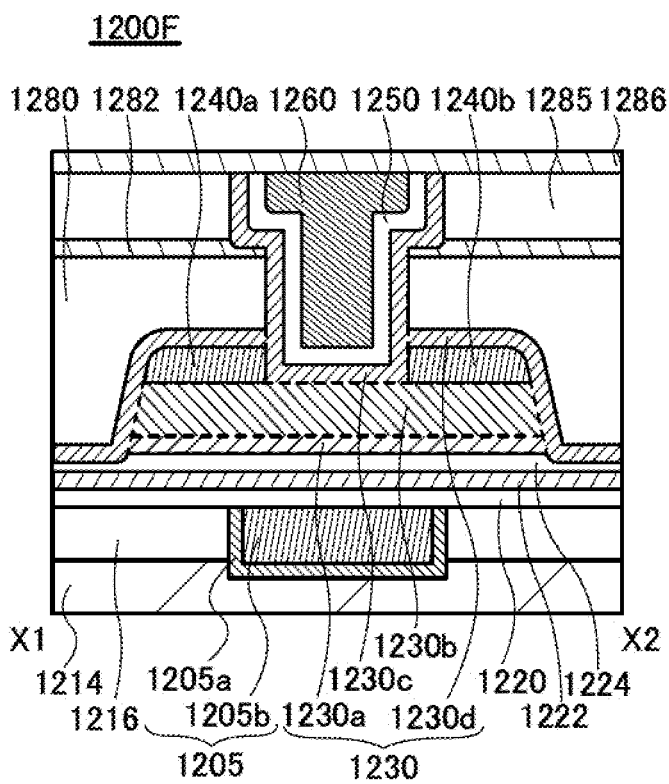
Figure 26C:
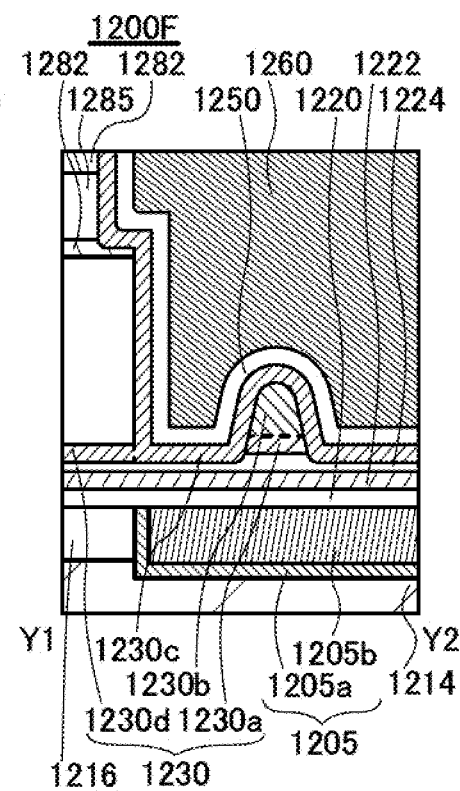

FIGS. 26A to 26C illustrates an example of a transistor structure different from those in FIGS. 21A to 21C, FIGS. 22A to 22C, FIGS. 23A to 23C, FIGS. 24A to 24C, and FIGS. 25A to 25C. FIG. 26A illustrates a top surface of a transistor 1200F. For simplification of the figure, some films are not illustrated in FIG. 26A. FIG. 26B is a cross-sectional view taken along dashed-dotted line X1-X2 in FIG. 26A, and FIG. 26C is a cross-sectional view taken along dashed-dotted line Y1-Y2 in FIG. 26A. Note that the direction of the dashed-dotted line X1-X2 may be called the channel length direction, and the direction of the dashed-dotted line Y1-Y2 may be called the channel width direction.

Note that in the transistor 1200F in FIGS. 26A to 26C, components having the same function as the components in the transistor 1200E in FIGS. 25A to 25C are denoted by the same reference numerals.

An insulator 1285 and an insulator 1286 are formed over the insulator 1282.

In an opening formed in the insulator 1280, the insulator 1282, and the insulator 1285, the oxide 1230*c*, the insulator 1250, and the conductor 1260 are formed. Furthermore, an end portion of each of the conductor 1240*a* and the conductor 1240*b* is aligned with an end portion of the opening formed in the insulator 1280. Furthermore, the end portion of each of the conductor 1240*a* and the conductor 1240*b* is aligned with part of end portions of the oxide 1230*c*. Thus, the conductors 1240*a* and 1240*b* can be formed concurrently with the opening in the insulator 1280. This leads to a reduction in the number of masks and steps and improvement in yield and productivity.

The conductor 1240*a*, the conductor 1240*b*, the oxide 1230*c*, and the oxide 1230*d* are in contact with the insulator 1280 having the oxygen-excess region with the oxide 1230*d* located therebetween. Thus, since the oxide 1230*d* exists between the insulator 1280 and the oxide 1230*b* including the region where the channel is formed, impurities such as hydrogen, water, and halogen can be prevented from diffusing from the insulator 1280 into the oxide 1230*b*.

In addition, since a high-resistance offset region is not formed in the transistor 1200F illustrated in FIGS. 26A to 26C, the on-state current of the transistor can be increased.

<Transistor Structure 7>

Figure 27A:
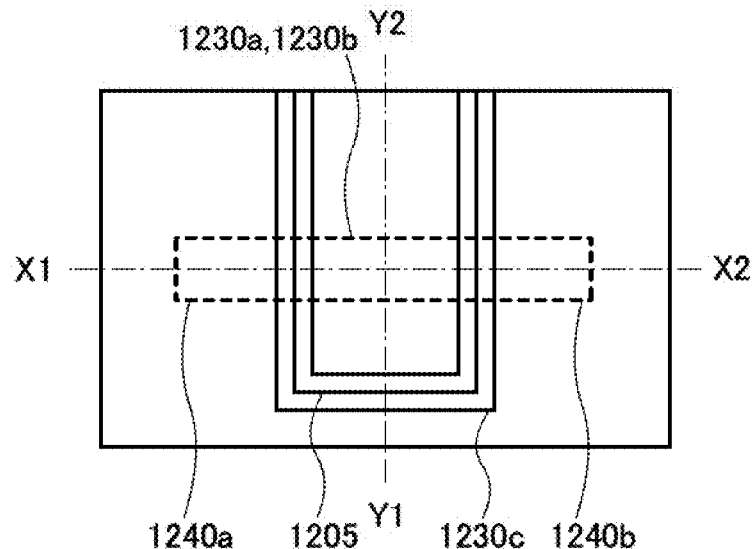
FIG. 27A is a top view and FIGS. 27B and 27C are cross-sectional views illustrating a structure example of a transistor.
Figure 27B:
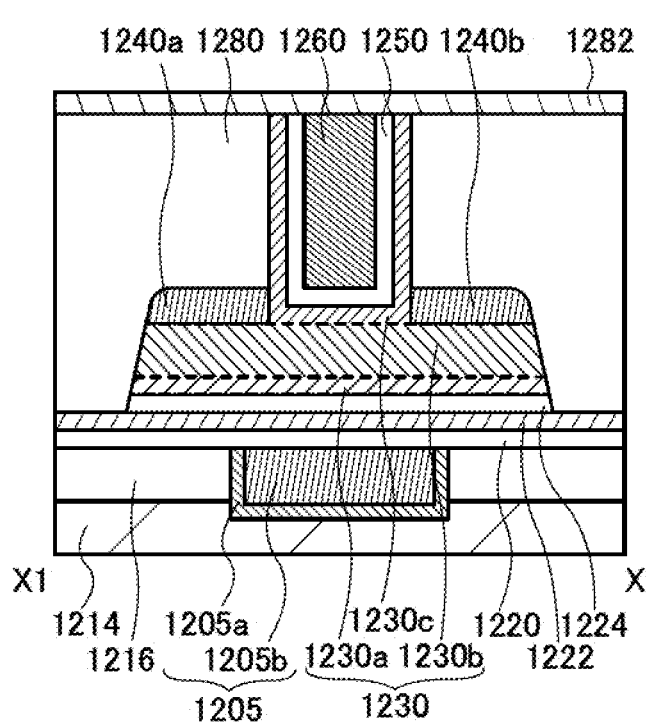
Figure 27C:
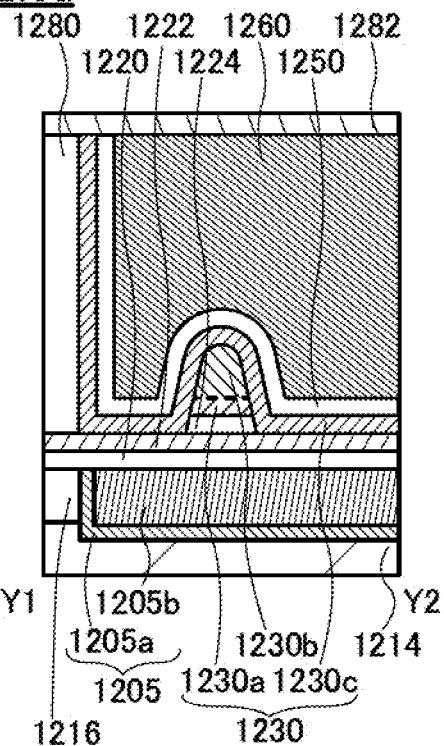

FIGS. 27A to 27C illustrate an example of a transistor structure different from those in FIGS. 21A to 21C, FIGS. 22A to 22C, FIGS. 23A to 23C, FIGS. 24A to 24C, FIGS. 25A to 25C, and FIGS. 26A to 26C. FIG. 27A illustrates a top surface of a transistor 1200G. For simplification of the figure, some films are omitted in FIG. 27A. FIG. 27B is a cross-sectional view taken along dashed-dotted line X1-X2 in FIG. 27A, and FIG. 27C is a cross-sectional view taken along dashed-dotted line Y1-Y2 in FIG. 27A. Note that the direction of the dashed-dotted line X1-X2 may be called the channel length direction, and the direction of the dashed-dotted line Y1-Y2 may be called the channel width direction.

Note that in the transistor 1200G in FIGS. 27A to 27C, components having the same function as the components in the transistor 1200A in FIGS. 21A to 21C are denoted by the same reference numerals.

The transistor 1200G illustrated in FIGS. 27A to 27C does not have the oxide 1230*d*. For example, when the conductor 1240*a* and the conductor 1240*b* are formed using a conductor with a high oxidation resistance, the oxide 1230*d* is not necessarily provided. This leads to a reduction in the number of masks and steps and improvement in yield and productivity.

The insulator 1224 may be provided in only the region overlapping with the oxide 1230*a* and the oxide 1230*b*. In that case, the oxide 1230*a*, the oxide 1230*b*, and the insulator 1224 can be processed using the insulator 1222 as an etching stopper. As a result, yield and productivity can be improved.

Since the transistor 1200G illustrated in FIGS. 27A to 27C has a structure in which the conductors 1240*a* and 1240*b* hardly overlap with the conductor 1260, the parasitic capacitance added to the conductor 1260 can be reduced. Thus, the transistor with a high operation frequency can be provided.

Note that this embodiment can be combined with any of the other embodiments in this specification as appropriate.

Embodiment 6

In this embodiment, a structure of an oxide semiconductor film that can be used for the oxide 1230 described in the above embodiment will be described.

An oxide semiconductor is classified into a single crystal oxide semiconductor and a non-single-crystal oxide semiconductor. Examples of a non-single-crystal oxide semiconductor include a c-axis-aligned crystalline oxide semiconductor (CAAC-OS), a polycrystalline oxide semiconductor, a nanocrystalline oxide semiconductor (nc-OS), an amorphous-like oxide semiconductor (a-like OS), and an amorphous oxide semiconductor.

From another perspective, an oxide semiconductor is classified into an amorphous oxide semiconductor and a crystalline oxide semiconductor. Examples of a crystalline oxide semiconductor include a single crystal oxide semiconductor, a CA AC-OS, a polycrystalline oxide semiconductor, and an nc-OS.

An amorphous structure is generally thought to be isotropic and have no non-uniform structure, to be metastable and not to have fixed positions of atoms, to have a flexible bond angle, and to have a short-range order but have no long-range order, for example.

This means that a stable oxide semiconductor cannot be regarded as a completely amorphous oxide semiconductor. Moreover, an oxide semiconductor that is not isotropic (e.g., an oxide semiconductor that has a periodic structure in a microscopic region) cannot be regarded as a completely amorphous oxide semiconductor. In contrast, an a-like OS, which is not isotropic, has an unstable structure that contains a void. Because of its instability, an a-like OS is close to an amorphous oxide semiconductor in terms of physical properties.

<CAAC-OS>

First, a CAAC-OS will be described.

A CAAC-OS is one of oxide semiconductors having a plurality of c-axis aligned crystal parts (also referred to as pellets).

Figure 31A:
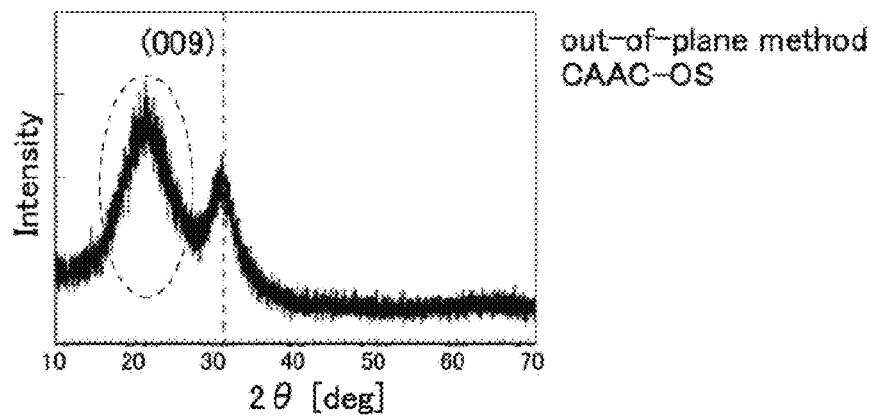
FIGS. 31A to 31E show structural analysis of a CAAC-OS and a single crystal oxide semiconductor by XRD and selected-area electron diffraction patterns of a CAAC-OS.

Analysis of a CAAC-OS by X-ray diffraction (XRD) is described. For example, when the structure of a CAAC-OS including an InGaZnO$_4$ crystal that is classified into the space group R-3m is analyzed by an out-of-plane method, a peak appears at a diffraction angle (2θ) of around 31° as shown in FIG. 31A. This peak is derived from the (009) plane of the InGaZnO$_4$ crystal, which indicates that crystals in the CAAC-OS have c-axis alignment, and that the c-axes are aligned in a direction substantially perpendicular to a surface over which the CAAC-OS film is formed (also referred to as a formation surface) or the top surface of the CAAC-OS film. Note that a peak sometimes appears at a 2θ of around 36° in addition to the peak at a 2θ of around 31°. The peak at a 2θ of around 36° is derived from a crystal structure classified into the space group Fd-3m. Therefore, it is preferred that the CAAC-OS do not show the peak at a 2θ of around 36°.

Figure 31B:
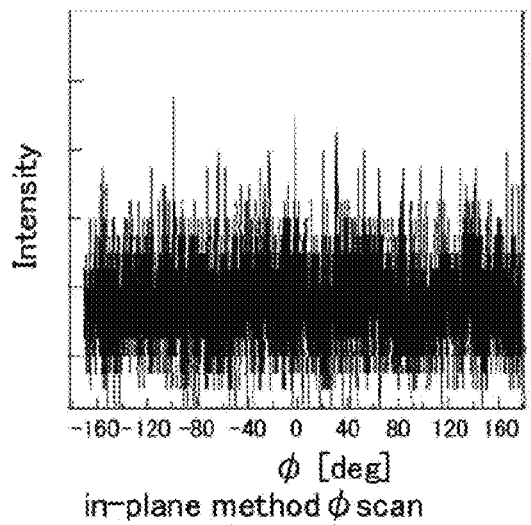
Figure 31C:
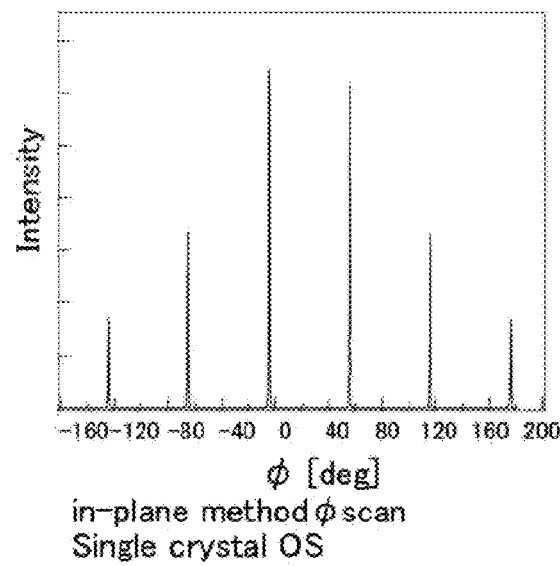

On the other hand, in structural analysis of the CAAC-OS by an in-plane method in which an X-ray is incident on the CAAC-OS in a direction parallel to the formation surface, a peak appears at a 2θ of around 56°. This peak is derived from the (110) plane of the InGaZnO$_4$ crystal. When analysis (φ scan) is performed with 2θ fixed at around 56° and with the sample rotated using a normal vector to the sample surface as an axis (φ axis), as shown in FIG. 31B, a peak is not clearly observed. In contrast, in the case where single crystal InGaZnO$_4$ is subjected to φ scan with 2θ fixed at around 56°, as shown in FIG. 31C, six peaks which are derived from crystal planes equivalent to the (110) plane are observed. Accordingly, the structural analysis using XRD shows that the directions of a-axes and b-axes are irregularly oriented in the CAAC-OS.

Figure 31D:
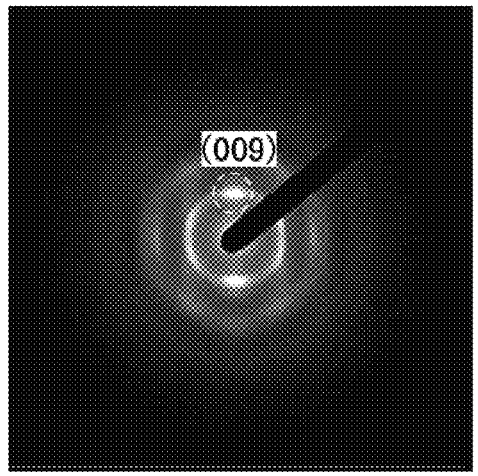
Figure 31E:
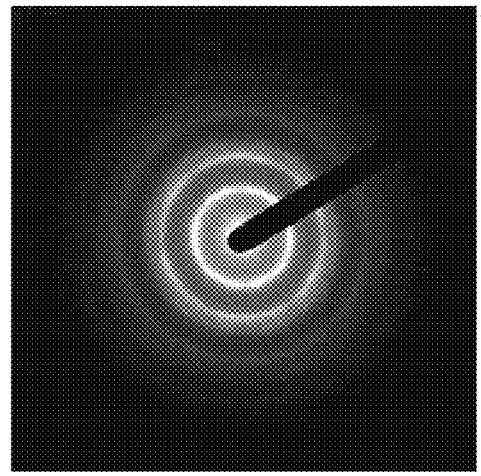

Next, a CAAC-OS analyzed by electron diffraction will be described. For example, when an electron beam with a probe diameter of 300 nm is incident on a CAAC-OS including an InGaZnO$_4$ crystal in a direction parallel to the formation surface of the CAAC-OS, a diffraction pattern (also referred to as a selected-area electron diffraction pattern) shown in FIG. 31D can be obtained. In this diffraction pattern, spots derived from the (009) plane of an InGaZnO$_4$ crystal are included. Thus, the electron diffraction also indicates that pellets included in the CAAC-OS have c-axis alignment and that the c-axes are aligned in a direction substantially perpendicular to the formation surface or the top surface of the CAAC-OS. Meanwhile, FIG. 31E shows a diffraction pattern obtained in such a manner that an electron beam with a probe diameter of 300 nm is incident on the same sample in a direction perpendicular to the sample surface. As shown in FIG. 31E, a ring-like diffraction pattern is observed. Thus, the electron diffraction using an electron beam with a probe diameter of 300 nm also indicates that the a-axes and b-axes of the pellets included in the CAAC-OS do not have regular orientation. The first ring in FIG. 31E is considered to be derived from the (010) plane, the (100) plane, and the like of the InGaZnO$_4$ crystal. The second ring in FIG. 31E is considered to be derived from the (110) plane and the like.

In a combined analysis image (also referred to as a high-resolution TEM image) of a bright-field image and a diffraction pattern of a CAAC-OS, which is obtained using a transmission electron microscope (TEM), a plurality of pellets can be observed. However, even in the high-resolution TEM image, a boundary between pellets, that is, a crystal grain boundary is not clearly observed in some cases. Thus, in the CAAC-OS, a reduction in electron mobility due to the grain boundary is less likely to occur.

Figure 32A:
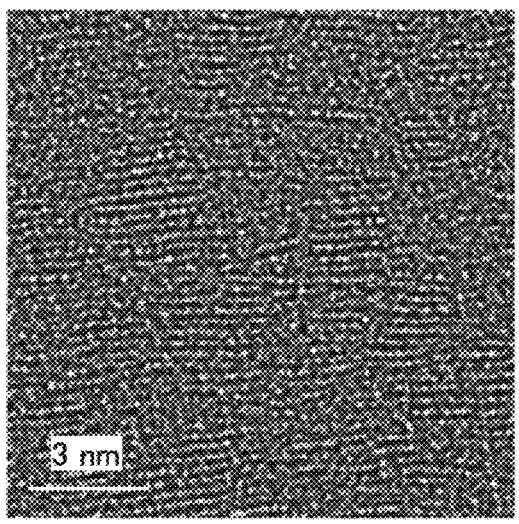
FIGS. 32A to 32E show a cross-sectional TEM image and plan-view TEM images of a CAAC-OS and images obtained through analysis thereof.

FIG. 32A shows a high-resolution TEM image of a cross section of the CAAC-OS which is observed from a direction substantially parallel to the sample surface. The high-resolution TEM image is obtained with a spherical aberration corrector function. The high-resolution TEM image obtained with a spherical aberration corrector function is particularly referred to as a Cs-corrected high-resolution TEM image. The Cs-corrected high-resolution TEM image can be observed with, for example, an atomic resolution analytical electron microscope JEM-ARM200F manufactured by JEOL Ltd.

FIG. 32A shows pellets in which metal atoms are arranged in a layered manner. FIG. 32A proves that the size of a pellet is greater than or equal to 1 nm or greater than or equal to 3 nm. Therefore, the pellet can also be referred to as a nanocrystal (nc). Furthermore, the CAAC-OS can also be referred to as an oxide semiconductor including c-axis aligned nanocrystals (CANC). A pellet reflects unevenness of a formation surface or a top surface of the CAAC-OS, and is parallel to the formation surface or the top surface of the CAAC-OS.

Figure 32B:
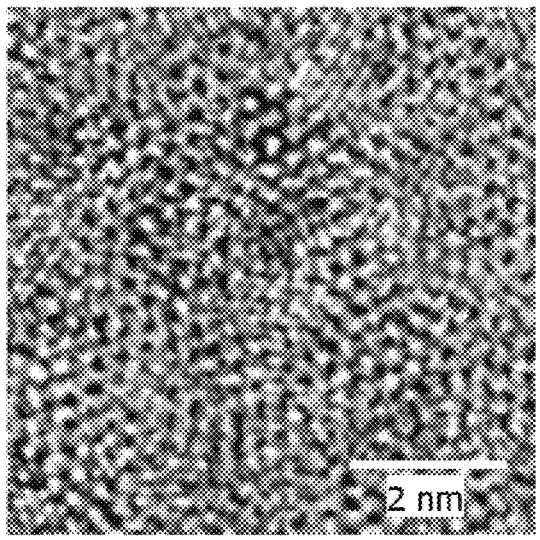
Figure 32C:
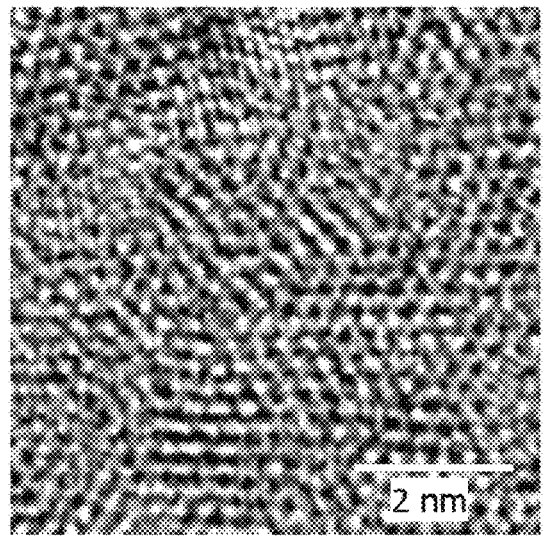
Figure 32D:
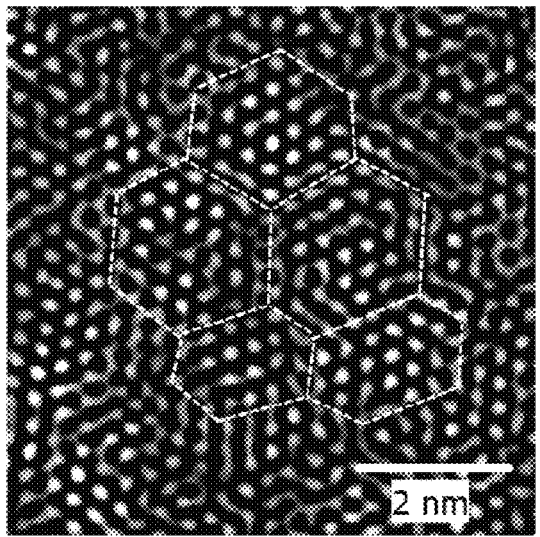
Figure 32E:
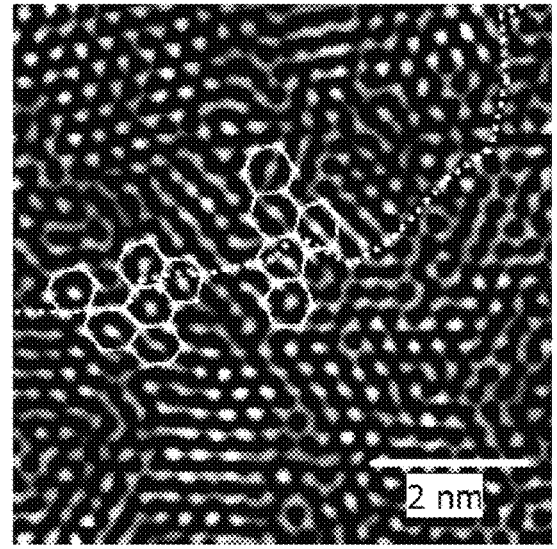

FIGS. 32B and 32C show Cs-corrected high-resolution TEM images of a plane of the CAAC-OS observed from a direction substantially perpendicular to the sample surface. FIGS. 32D and 32E are images obtained through image processing of FIGS. 32B and 32C. The method of image processing is as follows. The image in FIG. 32B is subjected to fast Fourier transform (FFT), so that an FFT image is obtained. Then, mask processing is performed such that a range of from 2.8 nm$^{-1}$ to 5.0 nm$^{-1}$ from the origin in the obtained FFT image remains. After the mask processing, the FFT image is processed by inverse fast Fourier transform (IFFT) to obtain a processed image. The image obtained in this manner is called an FFT filtering image. The FFT filtering image is a Cs-corrected high-resolution TEM image from which a periodic component is extracted, and shows a lattice arrangement.

In FIG. 32D, a portion where a lattice arrangement is broken is denoted with a dashed line. A region surrounded by a dashed line is one pellet. The portion denoted with the dashed line is a junction of pellets. The dashed line draws a hexagon, which means that the pellet has a hexagonal shape. Note that the shape of the pellet is not always a regular hexagon but is a non-regular hexagon in many cases.

In FIG. 32E, a dotted line denotes a portion between a region where a lattice arrangement is well aligned and another region where a lattice arrangement is well aligned, and a dashed line denotes the direction of the lattice arrangement. A clear crystal grain boundary cannot be observed even in the vicinity of the dotted line. When a lattice point in the vicinity of the dotted line is regarded as a center and surrounding lattice points are joined, a distorted hexagon, pentagon, and/or heptagon can be formed, for example. That is, a lattice arrangement is distorted so that formation of a crystal grain boundary is inhibited. This is probably because the CAAC-OS can tolerate distortion owing to a low density of arrangement of oxygen atoms in the a-b plane direction, an interatomic bond distance changed by substitution of a metal element, and the like.

As described above, the CAAC-OS has c-axis alignment, its pellets (nanocrystals) are connected in an a-b plane direction, and the crystal structure has distortion. For this reason, the CAAC-OS can also be referred to as an oxide semiconductor including a c-axis-aligned a-b-plane-anchored (CAA) crystal.

The CAAC-OS is an oxide semiconductor with high crystallinity. Entry of impurities, formation of defects, or the like might decrease the crystallinity of an oxide semiconductor. This means that the CAAC-OS has small amounts of impurities and defects (e.g., oxygen vacancies).

Note that the impurity means an element other than the main components of the oxide semiconductor, such as hydrogen, carbon, silicon, or a transition metal element. For example, an element (specifically, silicon or the like) having higher strength of bonding to oxygen than a metal element included in an oxide semiconductor extracts oxygen from the oxide semiconductor, which results in disorder of the atomic arrangement and reduced crystallinity of the oxide semiconductor. A heavy metal such as iron or nickel, argon, carbon dioxide, or the like has a large atomic radius (or molecular radius), and thus disturbs the atomic arrangement of the oxide semiconductor and decreases crystallinity.

<nc-OS>

Next, an nc-OS is described.

Analysis of an nc-OS by XRD is described. When the structure of an nc-OS is analyzed by an out-of-plane method, a peak indicating orientation does not appear. That is, a crystal of an nc-OS does not have orientation.

Figure 33A:
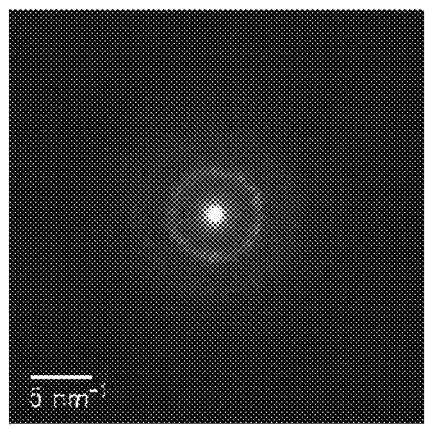
FIGS. 33A to 33D show electron diffraction patterns and a cross-sectional TEM image of an nc-OS.
Figure 33B:
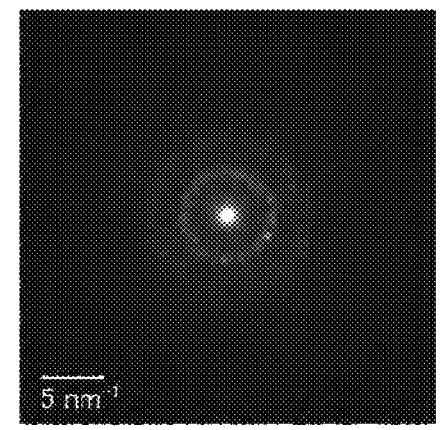

For example, when an electron beam with a probe diameter of 50 nm is incident on a 34-nm-thick region of thinned nc-OS including an $InGaZnO_4$ crystal in a direction parallel to the formation surface, a ring-shaped diffraction pattern (a nanobeam electron diffraction pattern) shown in FIG. 33A is observed. FIG. 33B shows a diffraction pattern obtained when an electron beam with a probe diameter of 1 nm is incident on the same sample. As shown in FIG. 33B, a plurality of spots are observed in a ring-like region. In other words, ordering in an nc-OS is not observed with an electron beam with a probe diameter of 50 nm but is observed with an electron beam with a probe diameter of 1 nm.

Figure 33C:
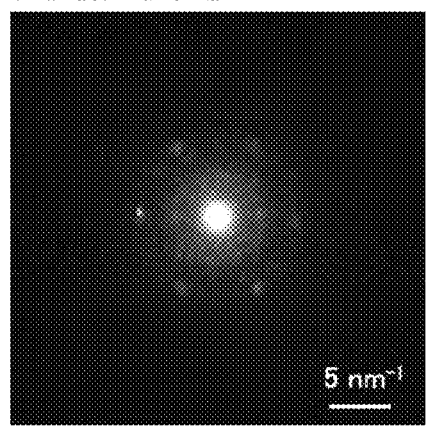

Furthermore, an electron diffraction pattern in which spots are arranged in an approximately regular hexagonal shape is observed in some cases as shown in FIG. 33C when an electron beam having a probe diameter of 1 nm is incident on a region with a thickness of less than 10 nm. This means that an nc-OS has a well-ordered region, i.e., a crystal, in the range of less than 10 nm in thickness. Note that an electron diffraction pattern having regularity is not observed in some regions because crystals are aligned in various directions.

Figure 33D:
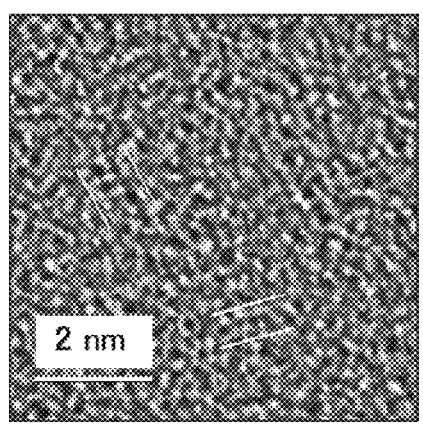

FIG. 33D shows a Cs-corrected high-resolution TEM image of a cross section of an nc-OS observed from the direction substantially parallel to the formation surface. In a high-resolution TEM image, an nc-OS has a region in which a crystal part is observed, such as the part indicated by additional lines in FIG. 33D, and a region in which a crystal part is not clearly observed. In most cases, the size of a crystal part included in the nc-OS is greater than or equal to 1 nm and less than or equal to 10 nm, or specifically, greater than or equal to 1 nm and less than or equal to 3 nm. Note that an oxide semiconductor including a crystal part whose size is greater than 10 nm and less than or equal to 100 nm is sometimes referred to as a microcrystalline oxide semiconductor. In a high-resolution TEM image of the nc-OS, for example, a grain boundary is not clearly observed in some cases. Note that there is a possibility that the origin of the nanocrystal is the same as that of a pellet in a CAAC-OS. Therefore, a crystal part of the nc-OS may be referred to as a pellet in the following description.

As described above, in the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different pellets in the nc-OS. Thus, the orientation of the whole film is not observed. Accordingly, the nc-OS cannot be distinguished from an a-like OS or an amorphous oxide semiconductor, depending on an analysis method.

Since there is no regularity of crystal orientation between the pellets (nanocrystals) as mentioned above, the nc-OS can also be referred to as an oxide semiconductor including random aligned nanocrystals (RANC) or an oxide semiconductor including non-aligned nanocrystals (NANC).

The nc-OS is an oxide semiconductor that has high regularity as compared with an amorphous oxide semiconductor. Therefore, the nc-OS is likely to have a lower density of defect states than an a-like OS and an amorphous oxide semiconductor. Note that there is no regularity of crystal orientation between different pellets in the nc-OS. Therefore, the nc-OS has a higher density of defect states than the CAAC-OS.

<a-like OS>

An a-like OS has a structure between those of the nc-OS and the amorphous oxide semiconductor.

Figure 34A:
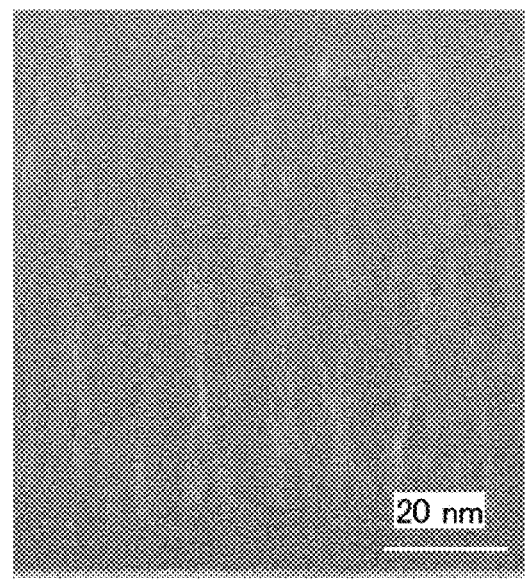
FIGS. 34A and 34B show cross-sectional TEM images of an a-like OS.
Figure 34B:
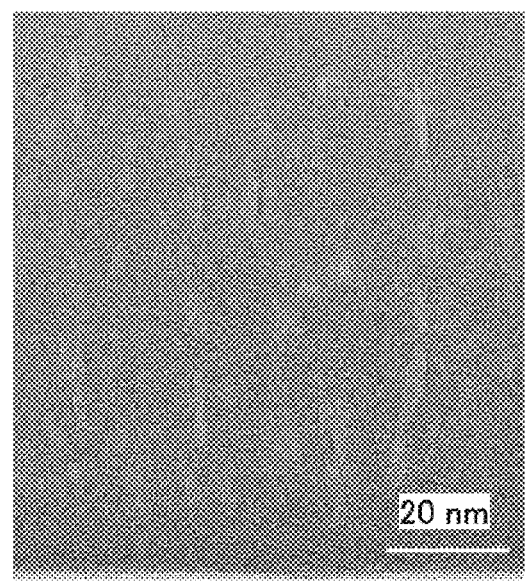

FIGS. 34A and 34B are high-resolution cross-sectional TEM images of an a-like OS.

FIG. 34A is the high-resolution cross-sectional TEM image of the a-like OS at the start of the electron irradiation. FIG. 34B is the high-resolution cross-sectional TEM image of the a-like OS after the electron ($e^-$) irradiation at $4.3 \times 10^8$ $e^-/nm^2$. FIGS. 34A and 34B show that stripe-like bright regions extending vertically are observed in the a-like OS from the start of the electron irradiation. It can also be found that the shape of the bright region changes after the electron irradiation. Note that the bright region is presumably a void or a low-density region.

The a-like OS has an unstable structure because it contains a void. To verify that an a-like OS has an unstable structure as compared with a CAAC-OS and an nc-OS, a change in structure caused by electron irradiation is described below.

An a-like OS, an nc-OS, and a CAAC-OS are prepared as samples. Each of the samples is an In-Ga-Zn oxide.

First, a high-resolution cross-sectional TEM image of each sample is obtained. The high-resolution cross-sectional TEM images show that all the samples have crystal parts.

It is known that a unit cell of an $InGaZnO_4$ crystal has a structure in which nine layers including three In—O layers and six Ga-Zn-O layers are stacked in the c-axis direction. The distance between the adjacent layers is equivalent to the lattice spacing on the (009) plane (also referred to as d value). The value is calculated to be 0.29 nm from crystal structural analysis. Accordingly, a portion where the spacing between lattice fringes is greater than or equal to 0.28 nm and less than or equal to 0.30 nm is regarded as a crystal part of $InGaZnO_4$ in the following description. Each of lattice fringes corresponds to the a-b plane of the $InGaZnO_4$ crystal.

Figure 35:
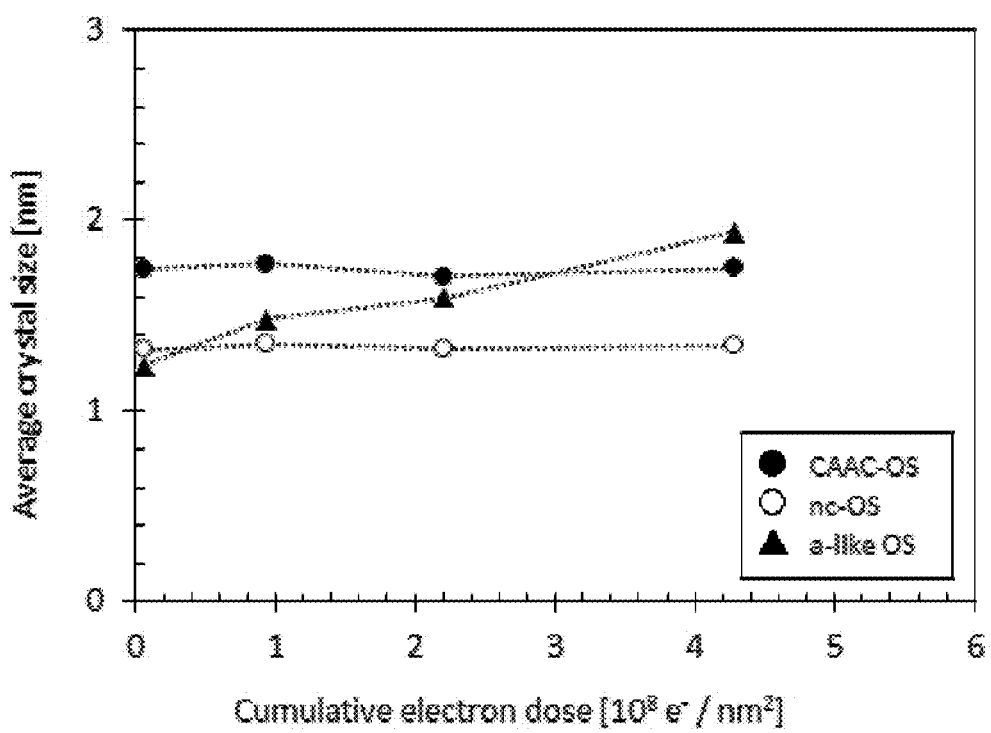
FIG. 35 shows a change in crystal part of an In-Ga-Zn oxide induced by electron irradiation.

FIG. 35 shows change in the average size of crystal parts (at 22 points to 30 points) in each sample. Note that the crystal part size corresponds to the length of a lattice fringe. FIG. 35 indicates that the crystal part size in the a-like OS increases with an increase in the cumulative electron dose in obtaining TEM images, for example. As shown in FIG. 35, a crystal part of approximately 1.2 nm (also referred to as an initial nucleus) at the start of TEM observation grows to a size of approximately 1.9 nm at a cumulative electron (e⁻) dose of $4.2\times10^8$ e⁻/nm². In contrast, the crystal part size in the nc-OS and the CAAC-OS shows little change from the start of electron irradiation to a cumulative electron dose of $4.2\times10^8$ e–/nm². As shown in FIG. 35, the crystal part sizes in an nc-OS and a CAAC-OS are approximately 1.3 nm and approximately 1.8 nm, respectively, regardless of the cumulative electron dose. For the electron beam irradiation and TEM observation, a Hitachi H-9000NAR transmission electron microscope was used. The conditions of electron beam irradiation were as follows: the accelerating voltage was 300 kV; the current density was $6.7\times10^5$ e⁻/(nm²·s ); and the diameter of the irradiation region was 230 nm.

In this manner, growth of the crystal part in the a-like OS is induced by electron irradiation. In contrast, in the nc-OS and the CAAC-OS, growth of the crystal part is hardly induced by electron irradiation. Therefore, the a-like OS has an unstable structure as compared with the nc-OS and the CAAC-OS.

The a-like OS has a lower density than the nc-OS and the CAAC-OS because it contains a void. Specifically, the density of the a-like OS is higher than or equal to 78.6% and lower than 92.3% of the density of the single crystal oxide semiconductor having the same composition. The density of each of the nc-OS and the CAAC-OS is higher than or equal to 92.3% and lower than 100% of the density of the single crystal oxide semiconductor having the same composition. Note that it is difficult to deposit an oxide semiconductor having a density of lower than 78% of the density of the single crystal oxide semiconductor.

For example, in the case of an oxide semiconductor having an atomic ratio of In:Ga:Zn=1:1:1, the density of single crystal InGaZnO₄ with a rhombohedral crystal structure is 6.357 g/cm³. Accordingly, in the case of the oxide semiconductor having an atomic ratio of In:Ga:Zn=1:1:1, the density of the a-like OS is higher than or equal to 5.0 g/cm³ and lower than 5.9 g/cm³. For example, in the case of the oxide semiconductor having an atomic ratio of In:Ga:Zn=1:1:1, the density of each of the nc-OS and the CAAC-OS is higher than or equal to 5.9 g/cm³ and lower than 6.3 g/cm³.

Note that in the case where an oxide semiconductor having a certain composition does not exist in a single crystal structure, single crystal oxide semiconductors with different compositions are combined at an adequate ratio, which makes it possible to calculate density equivalent to that of a single crystal oxide semiconductor with the desired composition. The density of a single crystal oxide semiconductor having the desired composition can be estimated using a weighted average according to the combination ratio of the single crystal oxide semiconductors with different compositions. Note that it is preferable to use as few kinds of single crystal oxide semiconductors as possible to estimate the density.

As described above, oxide semiconductors have various structures and various properties. Note that an oxide semiconductor may be a stacked layer including two or more films of an amorphous oxide semiconductor, an a-like OS, an nc-OS, and a CAAC-OS, for example.

<Carrier Density of Oxide Semiconductor>

Next, the carrier density of an oxide semiconductor will be described below.

Examples of a factor affecting the carrier density of an oxide semiconductor include oxygen vacancy (Vo) and impurities in the oxide semiconductor.

As the amount of oxygen vacancy in the oxide semiconductor increases, the density of defect states increases when hydrogen is bonded to the oxygen vacancy (this state is also referred to as VoH). The density of defect states also increases with an increase in the amount of impurity in the oxide semiconductor. Hence, the carrier density of an oxide semiconductor can be controlled by controlling the density of defect states in the oxide semiconductor.

A transistor using the oxide semiconductor in a channel region will be described below.

The carrier density of the oxide semiconductor is preferably reduced in order to inhibit the negative shift of the threshold voltage of the transistor or reduce the off-state current of the transistor. In order to reduce the carrier density of the oxide semiconductor, the impurity concentration in the oxide semiconductor is reduced so that the density of defect states can be reduced. In this specification and the like, a state with a low impurity concentration and a low density of defect states is referred to as a highly purified intrinsic or substantially highly purified intrinsic state. The carrier density of a highly purified intrinsic oxide semiconductor is lower than $8\times10^{15}$ cm⁻³, preferably lower than $1\times10^{11}$ cm⁻³, and further preferably lower than $1\times10^{10}$ cm⁻³ and is higher than or equal to $1\times10^{-9}$ cm⁻³.

In contrast, the carrier density of the oxide semiconductor is preferably increased in order to improve the on-state current of the transistor or improve the field-effect mobility of the transistor. In order to increase the carrier density of the oxide semiconductor, the impurity concentration or the density of defect states in the oxide semiconductor is slightly increased. Alternatively, the bandgap of the oxide semiconductor is preferably narrowed. For example, an oxide semiconductor that has a slightly high impurity concentration or a slightly high density of defect states in the range where a favorable on/off ratio is obtained in the $I_d$-$V_g$ characteristics of the transistor can be regarded as substantially intrinsic. Furthermore, an oxide semiconductor that has a high electron affinity and thus has a narrow bandgap so as to increase the density of thermally excited electrons (carriers) can be regarded as substantially intrinsic. Note that a transistor using an oxide semiconductor with higher electron affinity has lower threshold voltage.

The aforementioned oxide semiconductor with an increased carrier density has somewhat n-type conductivity; thus, it can be referred to as a "slightly-n" oxide semiconductor.

The carrier density of a substantially intrinsic oxide semiconductor is preferably higher than or equal to $1\times10^5$ cm⁻³ and lower than $1\times10^{18}$ cm⁻³, further preferably higher than or equal to $1\times10^7$ cm⁻³ and lower than or equal to $1\times10^{17}$ cm⁻³, still further preferably higher than or equal to $1\times10^9$ cm⁻³ and lower than or equal to $5\times10^{16}$ cm⁻³, yet further preferably higher than or equal to $1\times10^{10}$ cm⁻³ and lower than or equal to $1\times10^{16}$ cm⁻³, and yet still preferably higher than or equal to $1\times10^{11}$ cm⁻³ and lower than or equal to $1\times10^{15}$ cm⁻³.

Note that this embodiment can be combined with any of the other embodiments in this specification as appropriate.

(Notes on the Description in this Specification and the Like)

The following are notes on the structures in the above embodiments.

<Notes On One Embodiment of the Present Invention Described in Embodiments>

One embodiment of the present invention can be constituted by appropriately combining the structure described in an embodiment with any of the structures described in the other embodiments. In addition, in the case where a plurality of structure examples are described in one embodiment, some of the structure examples can be combined as appropriate.

Note that what is described (or part thereof) in an embodiment can be applied to, combined with, or replaced with another content in the same embodiment and/or what is described (or part thereof) in another embodiment or other embodiments.

Note that in each embodiment, a content described in the embodiment is a content described with reference to a variety of diagrams or a content described with text disclosed in this specification.

Note that by combining a diagram (or part thereof) described in one embodiment with another part of the diagram, a different diagram (or part thereof) described in the embodiment, and/or a diagram (or part thereof) described in another embodiment or other embodiments, much more diagrams can be formed.

<Notes on Ordinal Numbers>

In this specification and the like, ordinal numbers such as "first", "second", and "third" are used in order to avoid confusion among components. Thus, the terms do not limit the number or order of components. In the present specification and the like, a "first" component in one embodiment can be referred to as a "second" component in other embodiments or claims. Furthermore, in the present specification and the like, a "first" component in one embodiment can be referred to without the ordinal number in other embodiments or claims.

<Notes on the Description for Drawings>

Embodiments are described with reference to drawings. However, the embodiments can be implemented with various modes. It will be readily appreciated by those skilled in the art that modes and details can be changed in various ways without departing from the spirit and scope of the present invention. Thus, the present invention should not be interpreted as being limited to the description of the embodiments. Note that in the structures of the embodiments, the same portions or portions having similar functions are denoted by the same reference numerals in different drawings, and the description of such portions is not repeated.

In this specification and the like, the terms for explaining arrangement, such as "over" and "under", are used for convenience to describe the positional relation between components with reference to drawings. Furthermore, the positional relation between components is changed as appropriate in accordance with a direction in which the components are described. Therefore, the terms for explaining arrangement are not limited to those used in this specification and may be changed to other terms as appropriate depending on the situation.

The term "over" or "under" does not necessarily mean that a component is placed directly over or directly under and directly in contact with another component. For example, the expression "electrode B over insulating layer A" does not necessarily mean that the electrode B is on and in direct contact with the insulating layer A and can mean the case where another component is provided between the insulating layer A and the electrode B.

Furthermore, in a block diagram in this specification and the like, components are functionally classified and shown by blocks that are independent from each other. However, in an actual circuit and the like, such components are sometimes hard to classify functionally, and there is a case in which one circuit is concerned with a plurality of functions or a case in which a plurality of circuits are concerned with one function.

Therefore, blocks in a block diagram do not necessarily show components described in the specification, which can be explained with another term as appropriate depending on the situation.

In drawings, the size, the layer thickness, or the region is determined arbitrarily for description convenience. Therefore, the size, the layer thickness, or the region is not limited to the illustrated scale. Note that the drawings are schematically shown for clarity, and embodiments of the present invention are not limited to shapes or values shown in the drawings. For example, the following can be included: variation in signal, voltage, or current due to noise or difference in timing.

In drawings such as a top view (also referred to as a plan view or a layout view) and a perspective view, some of components might not be illustrated for clarity of the drawings.

In the drawings, the same components, components having similar functions, components formed of the same material, or components formed at the same time are denoted by the same reference numerals in some cases, and the description thereof is not repeated in some cases.

<Notes on Expressions that can be Rephrased>

In this specification and the like, the terms "one of a source and a drain" (or a first electrode or a first terminal) and "the other of the source and the drain" (or a second electrode or a second terminal) are used to describe the connection relation of a transistor. This is because a source and a drain of a transistor are interchangeable depending on the structure, operation conditions, or the like of the transistor. Note that the source or the drain of the transistor can also be referred to as a source (or drain) terminal, a source (or drain) electrode, or the like as appropriate depending on the situation. In this specification and the like, two terminals except a gate are sometimes referred to as a first terminal and a second terminal or as a third terminal and a fourth terminal. In this specification and the like, in the case where a transistor has two or more gates (such a structure is referred to as a dual-gate structure in some cases), these gates are referred to as a first gate and a second gate or a front gate and a back gate in some cases. Note that a "bottom gate" is a terminal which is formed before a channel formation region in manufacture of a transistor, and a "top gate" is a terminal which is formed after a channel formation region in manufacture of a transistor.

A transistor is an element having three terminals: a gate, a source, and a drain. A gate is a terminal which functions as a control terminal for controlling the conduction state of a transistor. Functions of input/output terminals of the transistor depend on the type and the levels of potentials applied to the terminals, and one of the two terminals serves as a source and the other serves as a drain. Therefore, the terms "source" and "drain" can be switched in this specification and the like. In this specification and the like, two terminals except a gate are sometimes referred to as a first terminal and a second terminal or as a third terminal and a fourth terminal.

In addition, in this specification and the like, the term such as an "electrode" or a "wiring" does not limit a function of the component. For example, an "electrode" is used as part of a "wiring" in some cases, and vice versa. Furthermore, the term "electrode" or "wiring" can also mean a combination of a plurality of "electrodes" and "wirings" formed in an integrated manner.

In this specification and the like, "voltage" and "potential" can be replaced with each other. The term "voltage" refers to a potential difference from a reference potential. When the reference potential is a ground potential, for example, "voltage" can be replaced with "potential." The ground potential does not necessarily mean 0 V. Potentials are relative values, and the potential applied to a wiring or the like is changed depending on the reference potential, in some cases. Note that in this specification, the reference potential refers to a reference potential only in a certain portion or place, and does not refer to a reference potential in another portion or place.

In this specification and the like, the terms "film" and "layer" can be interchanged with each other depending on the case or circumstances. For example, the term "conductive layer" can be changed into the term "conductive film" in some cases. Moreover, the term "insulating film" can be changed into the term "insulating layer" in some cases, or can be replaced with a word not including the term "film" or "layer" depending on the case or circumstances. For example, the term "conductive layer" or "conductive film" can be changed into the term "conductor" in some cases. Furthermore, for example, the term "insulating layer" or "insulating film" can be changed into the term "insulator" in some cases.

In this specification and the like, the terms "wiring", "signal line", "power supply line", and the like can be interchanged with each other depending on circumstances or conditions. For example, the term "wiring" can be changed into the term "signal line" in some cases. For example, the term "wiring" can be changed into the term such as "power source line" in some cases. The term such as "signal line" or "power source line" can be changed into the term "wiring" in some cases. The term such as "power source line" can be changed into the term such as "signal line" in some cases. The term such as "signal line" can be changed into the term such as "power source line" in some cases. The term "potential" that is applied to a wiring can be changed into the term "signal" or the like depending on circumstances or conditions. Inversely, the term "signal" or the like can be changed into the term "potential" in some cases.

<Notes on Definitions of Terms>

The following are definitions of the terms mentioned in the above embodiments.

<<Semiconductor>>

In this specification, a "semiconductor" may have characteristics of an "insulator" in some cases when the conductivity is sufficiently low, for example. Furthermore, a "semiconductor" and an "insulator" cannot be strictly distinguished from each other in some cases because a border between the "semiconductor" and the "insulator" is not clear. Accordingly, a "semiconductor" in this specification can be called an "insulator" in some cases. Similarly, an "insulator" in this specification can be called a "semiconductor" in some cases.

Furthermore, a "semiconductor" includes characteristics of a "conductor" in some cases when the conductivity is sufficiently high, for example. Furthermore, a "semiconductor" and a "conductor" cannot be strictly distinguished from each other in some cases because a border between the "semiconductor" and the "conductor" is not clear. Accordingly, a "semiconductor" in this specification can be called a "conductor" in some cases. Similarly, a "conductor" in this specification can be called a "semiconductor" in some cases.

Note that an impurity in a semiconductor refers to, for example, elements other than the main components of a semiconductor layer. For example, an element with a concentration of lower than 0.1 atomic % is an impurity. When an impurity is contained, the density of states (DOS) may be formed in a semiconductor, the carrier mobility may be decreased, or the crystallinity may be decreased. In the case where the semiconductor is an oxide semiconductor, examples of an impurity which changes characteristics of the semiconductor include Group 1 elements, Group 2 elements, Group 13 elements, Group 14 elements, Group 15 elements, and transition metals other than the main components of the semiconductor; specifically, there are hydrogen (included in water), lithium, sodium, silicon, boron, phosphorus, carbon, and nitrogen, for example. When the semiconductor is an oxide semiconductor, oxygen vacancies may be formed by entry of impurities such as hydrogen, for example. Furthermore, when the semiconductor is a silicon layer, examples of an impurity which changes the characteristics of the semiconductor include oxygen, Group 1 elements except hydrogen, Group 2 elements, Group 13 elements, and Group 15 elements.

<<Transistor>>

In this specification, a transistor is an element having at least three terminals of a gate, a drain, and a source. The transistor has a channel formation region between the drain (a drain terminal, a drain region, or a drain electrode) and the source (a source terminal, a source region, or a source electrode), and current can flow through the channel formation region between the source and the drain. Note that in this specification and the like, a channel formation region refers to a region through which current mainly flows.

Furthermore, functions of a source and a drain might be switched when transistors having different polarities are employed or a direction of current flow is changed in circuit operation, for example. Therefore, the terms "source" and "drain" can be switched in this specification and the like.

<<Switch>>

In this specification and the like, a switch is conducting (on state) or not conducting (off state) to determine whether current flows therethrough or not. Alternatively, a switch has a function of selecting and changing a current path.

Examples of a switch include an electrical switch and a mechanical switch. That is, any element can be used as a switch as long as it can control current, without limitation to a certain element.

Examples of the electrical switch include a transistor (e.g., a bipolar transistor or a MOS transistor), a diode (e.g., a PN diode, a PIN diode, a Schottky diode, a metal-insulator-metal (MIM) diode, a metal-insulator-semiconductor (MIS) diode, or a diode-connected transistor), and a logic circuit in which such elements are combined.

In the case of using a transistor as a switch, an "on state" of the transistor refers to a state in which a source electrode and a drain electrode of the transistor are electrically short-circuited. Furthermore, an "off state" of the transistor refers to a state in which the source electrode and the drain electrode of the transistor are electrically cut off. In the case where a transistor operates just as a switch, the polarity (conductivity type) of the transistor is not particularly limited to a certain type.

An example of a mechanical switch is a switch formed using a micro electro mechanical systems (MEMS) technology, such as a digital micromirror device (DMD). Such a switch includes an electrode which can be moved mechanically, and operates by controlling conduction and non-conduction in accordance with movement of the electrode.

<<Channel Length>>

In this specification and the like, the channel length refers to, for example, the distance between a source (source region or source electrode) and a drain (drain region or drain electrode) in a region where a semiconductor (or a portion where current flows in a semiconductor when a transistor is on) and a gate electrode overlap with each other or a region where a channel is formed in a top view of the transistor.

In one transistor, channel lengths in all regions are not necessarily the same. In other words, the channel length of one transistor is not fixed to one value in some cases.

Therefore, in this specification, the channel length is any one of values, the maximum value, the minimum value, or the average value in a region where a channel is formed.

<<Channel Width>>

In this specification and the like, the channel width refers to, for example, the length of a portion where a source and a drain face each other in a region where a semiconductor (or a portion where a current flows in a semiconductor when a transistor is on) and a gate electrode overlap with each other, or a region where a channel is formed in a top view of the transistor.

In one transistor, channel widths in all regions are not necessarily the same. In other words, the channel width of one transistor is not fixed to one value in some cases. Therefore, in this specification, a channel width is any one of values, the maximum value, the minimum value, or the average value in a region where a channel is formed.

Note that depending on transistor structures, a channel width in a region where a channel is formed actually (hereinafter referred to as an effective channel width) is different from a channel width shown in a top view of the transistor (hereinafter referred to as an apparent channel width) in some cases. For example, in a transistor having a three-dimensional structure, an effective channel width is greater than an apparent channel width shown in a top view of the transistor, and its influence cannot be ignored in some cases. For example, in a miniaturized transistor having a three-dimensional structure, the proportion of a channel region formed in a side surface of a semiconductor is high in some cases. In that case, an effective channel width obtained when a channel is actually formed is greater than an apparent channel width shown in the top view.

In a transistor having a three-dimensional structure, an effective channel width is difficult to measure in some cases. For example, to estimate an effective channel width from a design value, it is necessary to assume that the shape of a semiconductor is known as an assumption condition. Therefore, in the case where the shape of a semiconductor is not known accurately, it is difficult to measure an effective channel width accurately.

Therefore, in this specification, in a top view of a transistor, an apparent channel width that is a length of a portion where a source and a drain face each other in a region where a semiconductor and a gate electrode overlap with each other is referred to as a surrounded channel width (SCW) in some cases. Furthermore, in this specification, in the case where the term "channel width" is simply used, it may denote a surrounded channel width and an apparent channel width. Alternatively, in this specification, in the case where the term "channel width" is simply used, it may denote an effective channel width in some cases. Note that the values of a channel length, a channel width, an effective channel width, an apparent channel width, a surrounded channel width, and the like can be determined by obtaining and analyzing a cross-sectional TEM image and the like.

Note that in the case where field-effect mobility, a current value per channel width, and the like of a transistor are obtained by calculation, a surrounded channel width may be used for the calculation. In that case, a value different from one in the case where an effective channel width is used for the calculation is obtained in some cases.

<<Connection>>

In this specification and the like, when it is described that X and Y are connected, the case where X and Y are electrically connected, the case where X and Y are functionally connected, and the case where X and Y are directly connected are included therein. Accordingly, another element may be interposed between elements having a connection relation shown in drawings and texts, without limiting to a predetermined connection relation, for example, the connection relation shown in the drawings and the texts.

Here, X, Y, and the like each denote an object (e.g., a device, an element, a circuit, a wiring, an electrode, a terminal, a conductive film, a layer, or the like).

For example, in the case where X and Y are electrically connected, one or more elements that enable an electrical connection between X and Y (e.g., a switch, a transistor, a capacitor, an inductor, a resistor, a diode, a display element, a light-emitting element, or a load) can be connected between X and Y. Note that the switch is controlled to be turned on or off. That is, a switch is conducting or not conducting (is turned on or off) to determine whether current flows therethrough or not.

For example, in the case where X and Y are functionally connected, one or more circuits that enable functional connection between X and Y (e.g., a logic circuit such as an inverter, a NAND circuit, or a NOR circuit; a signal converter circuit such as a DA converter circuit, an AD converter circuit, or a gamma correction circuit; a potential level converter circuit such as a power source circuit (e.g., a step-up converter or a step-down converter) or a level shifter circuit for changing the potential level of a signal; a voltage source; a current source; a switching circuit; an amplifier circuit such as a circuit that can increase signal amplitude, the amount of current, or the like, an operational amplifier, a differential amplifier circuit, a source follower circuit, or a buffer circuit; a signal generation circuit; a memory circuit; and/or a control circuit) can be connected between X and Y. For example, even when another circuit is interposed between X and Y, X and Y are functionally connected if a signal output from X is transmitted to Y.

Note that when it is explicitly described that X and Y are electrically connected, the case where X and Y are electrically connected (i.e., the case where X and Y are connected with another element or another circuit provided therebetween), the case where X and Y are functionally connected (i.e., the case where X and Y are functionally connected with another circuit provided therebetween), and the case where X and Y are directly connected (i.e., the case where X and Y are connected without another element or another circuit provided therebetween) are included therein. That is, the explicit expression "X and Y are electrically connected" is the same as the explicit simple expression "X and Y are connected".

For example, any of the following expressions can be used for the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to one part of Z1 and another part of Z1 is directly connected to X while a drain (or a second terminal or the like) of the transistor is directly connected to one part of Z2 and another part of Z2 is directly connected to Y.

The expressions include, for example, "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in this order", "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in this order", and "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided to be connected in this order". When the connection order in a circuit configuration is defined by an expression similar to the above examples, a source (or a first terminal or the like) and a drain (or a second terminal or the like) of a transistor can be distinguished from each other to specify the technical scope. Note that these expressions are examples and there is no limitation on the expressions. Here, X, Y, Z1, and Z2 each denote an object (e.g., a device, an element, a circuit, a wiring, an electrode, a terminal, a conductive film, and a layer).

Even when independent components are electrically connected to each other in a circuit diagram, one component has functions of a plurality of components in some cases. For example, when part of a wiring also functions as an electrode, one conductive film functions as the wiring and the electrode. Thus, "electrical connection" in this specification includes in its category such a case where one conductive film has functions of a plurality of components.

<<Parallel and perpendicular>>

In this specification, the term "parallel" indicates that the angle formed between two straight lines is greater than or equal to −10° and less than or equal to 10°, and accordingly also includes the case where the angle is greater than or equal to −5° and less than or equal to 5°. In addition, the term "substantially parallel" indicates that the angle formed between two straight lines is greater than or equal to −30° and less than or equal to 30°. The term "perpendicular" indicates that the angle formed between two straight lines is greater than or equal to 80° and less than or equal to 100°. Thus, the case where the angle is greater than or equal to 85° and less than or equal to 95° is also included. In addition, the term "substantially perpendicular" indicates that the angle formed between two straight lines is greater than or equal to 60° and less than or equal to 120°.

<<Trigonal and Rhombohedral>>

In this specification, trigonal and rhombohedral crystal systems are included in a hexagonal crystal system.

EXPLANATION OF REFERENCE

OUT[1]: column output circuit, OUT[j]: column output circuit, OUT[n]: column output circuit, OUTFIT column output circuit, $C_{ref}$: reference column output circuit, AM[1,1]: memory cell, AM[i,1]: memory cell, AM[m,1]: memory cell, AM[1,j]: memory cell, AM[i,j]: memory cell, AM[m,j]: memory cell, AM[1,j]: memory cell, AM[i,n]: memory cell, AM[m,n]: memory cell, AM[i+1]: memory cell, AM[i,j+1]: memory cell, AM[i+1,j+1]: memory cell, $AM_{ref}$[1]: memory cell, $AM_{ref}$[i]: memory cell, $AM_{ref}$[m]: memory cell, $AM_{ref}$[i+1]: memory cell, CI: constant current circuit, $CI_{ref}$: constant current circuit, CM: current mirror circuit, OT[1]: output terminal, OT[j]: output terminal, OT[n]: output terminal, OT[j+1]: output terminal, $OT_{ref}$: output terminal, SPT[1]: output terminal, SPT[j]: output terminal, SPT[n]: output terminal, SPT[j+1]: output terminal, CT1: terminal, CT2: terminal, CT3: terminal, CT4: terminal, CT5[1]: terminal, CT5[j]: terminal, CT5[n]: terminal, CT5[j+1]: terminal, CT6[1]: terminal, CT6[j]: terminal, CT6[n]: terminal, CT6[j+1]: terminal, CT7: terminal, CTB: terminal, Tr1: transistor, Tr2: transistor, Tr3: transistor, Tr4: transistor, Try: transistor, Tr6: transistor, Tr7: transistor, Tr11: transistor, Tr12: transistor, C1: capacitor, C2: capacitor, OSP: wiring, ORP: wiring, B[1]: wiring, B[j]: wiring, B[n]: wiring, B[j+1]: wiring, Bref: wiring, WD[1]: wiring, WD[j]: wiring, WD[n]: wiring, WD[j+1]: wiring, $WD_{ref}$: wiring, VR: wiring, RW[1]: wiring, RW[i]: wiring, RW[m]: wiring, RW[i+1]: wiring, WW[1]: wiring, WW[i]: wiring, WW[m]: wiring, WW[i+1]: wiring, OL[1]: wiring, OL[j]: wiring, OL[n]: wiring, OL[j+1]: wiring, $OL_{ref}$: wiring, IL[1]: wiring, IL[j]: wiring, IL[n]: wiring, IL[+1]: wiring, $IL_{ref}$: wiring, BG[1]: wiring, BG[j]: wiring, BG[n]: wiring, BG[j+1]: wiring, $BG_{ref}$: wiring, VDDL: wiring, VSSL: wiring, $NCM_{ref}$: node, N[1,1]: node, N[i,1]: node, N[m,1]: node, N[1,j]: node, N[i,j]: node, N[m,j]: node, N[1,n]: node, N[i,n]: node, N[m,n]: node, N[i+1,j]: node, N[i,j+1]: node, N[i+1,j+1]: node, $N_{ref}$[1]: node, $N_{ref}$[m]: node, $N_{ref}$[m]: node, $N_{ref}$[i+1]: node, Co1: arrow, Co2: arrow, Ro1: arrow, Ro2: arrow, SW1: switch, SW2: switch, M: transistor, MD: transistor, C11: capacitor, C12: capacitor, Sig1(j): signal line, Sig2(j): signal line, Sig1 (j+1): signal line, Sig2(j+1): signal line, G1(i): scan line, G2(i): scan line, CL(g): control line, ML(h): sensor signal line, C(g): electrode, M(h): electrode, BR(g,h): conductive film, CSCOM: wiring, VCOM1: wiring, VCOM2: fourth conductive film, ANO: third conductive film, FPC1: flexible printed circuit, FPC2: flexible printed circuit, ACF1: conductive material, ACF2: conductive material, AF1: alignment film, AF2: alignment film, BM: light-blocking film, CF1: coloring film, CF2: coloring film, KB1: structure body, CP: conductive material, GD: driver circuit, SD: driver circuit, OSC: oscillator circuit, DC: detection circuit, I1: insulator, I2: insulator, S1: oxide, S2: oxide, S3: oxide, 100: semiconductor device, 110: offset circuit, 111: offset circuit, 112: offset circuit, 113: offset circuit, 120: memory cell array, 121: memory cell array, 150: offset circuit, 160: memory cell array, 501A: first insulating film, 501C: second insulating film, 504: conductive film, 506: insulating film, 505: bonding layer, 508: semiconductor film, 511B: conductive film, 511C: conductive film, 512A: conductive film, 512B: conductive film, 516: insulating film, 518: insulating film, 519B: terminal, 519C: terminal, 520: functional layer, 521: insulating film, 522: connection portion, 524: conductive film, 528: insulating film, 530(11): pixel circuit, 530(11+1): pixel circuit, 550(i,j): second display element, 550(j): second display element, 551(i,j): third electrode, 552: fourth electrode, 553(j): layer, 570: substrate, 591A: opening, 591B: opening, 591C: opening, 592A: first opening, 592B: second opening, 592C: opening, 700TP1: touch panel, 702(i,j): pixel, 702(i,j+1): pixel, 702(i+1): pixel, 702(i+2,j): pixel, 705: sealing material, 706: insulating film, 709: bonding layer, 710: substrate, 719: terminal, 750(i,j): first display element, 750(i,j+1): first display element, 750(i,j+2): first display element, 751(i,j): first electrode, 751(i,j+1): first electrode, 751(i,j+2): first electrode, 751(i+1,j): first electrode, 751(i,j+2): first electrode, 751E: region, 751H: opening, 752: second electrode, 753: layer, 754A: first intermediate film, 754B: second intermediate film, 754C: intermediate film, 770:

substrate, 770P: functional layer, 770D: functional layer, 771: insulating film, 775($g$,$h$): sensing element, 775($g$,1): sensing element, 775($g$,$q$): sensing element, 775(1,$h$): sensing element, 775($p$,$h$): sensing element, 1200A: transistor, 1200B: transistor, 1200C: transistor, 1200D: transistor, 1200E: transistor, 1200F: transistor, 1200G: transistor, 1205: conductor, 1205$a$: conductor, 1205$b$: conductor, 1220: insulator, 1222: insulator, 1224: insulator, 1230: oxide, 1230$a$: oxide, 1230$b$: oxide, 1230$c$: oxide, 1230$d$: oxide, 1240$a$: conductor, 1240$b$: conductor, 1241$a$: conductor, 1241$b$: conductor, 1250: insulator, 1260: conductor, 1260$a$: conductor, 1260$b$: conductor, 1260$c$ conductor, 1270: insulator, 1280: insulator, 1282: insulator, 1285: insulator, 1286: insulator, 4700: electronic component, 4701: lead, 4702: printed circuit board, 4703: circuit portion, 4704: circuit board, 4800: semiconductor wafer, 4800$a$: chip, 4801: wafer, 4801$a$: wafer, 4802: circuit portion, 4803: spacing, 4803$a$: spacing, 4810: semiconductor wafer, 5221: housing, 5222: display portion, 5223: operation button, 5224: speaker, 5431: housing, 5432: display portion, 5433: palm print reading portion, 5434: wiring, 5435: hand, 5501: housing, 5502: display portion, 5503: microphone, 5504: speaker, 5505: operation button, 5801: first housing, 5802: second housing, 5803: display portion, 5804: operation key, 5805: lens, 5806: joint, 6560: TV, 6561: broadcast station, 6562: artificial satellite, 6563: radio wave tower, 6564: antenna, 6565: antenna, 6566A: radio wave, 6566B: radio wave, 6567A: radio wave, 6567B: radio wave, 6600: ambulance, 6601: medical institution, 6602: medical institution, 6605: high-speed network, 6610: camera, 6611: encoder, 6612: communication device, 6615: video data, 6616: video data, 6620: communication device, 6621: decoder, 6622: server, 6623: display device This application is based on Japanese Patent Application serial no. 2016-055281 filed with Japan Patent Office on Mar. 18, 2016, the entire contents of which are hereby incorporated by reference.

The invention claimed is:

1. An artificial neural network comprising:
a plurality of memory cells,
wherein a first memory cell of the plurality of memory cells retains a potential corresponding to first analog data,
wherein a second memory cell of the plurality of memory cells retains a potential corresponding to second analog data,
wherein the artificial neural network is capable of pattern recognition due to learning about a variety of input patterns when a connection strength is changed,
wherein the first analog data serves as weight coefficients and the second analog data serves as neuron outputs, whereby the artificial neural network is capable of performing a weighting calculation of neuron outputs concurrently,
wherein data corresponding to results of the weighting calculation is obtained as output signals,
wherein a first circuit is electrically connected to a first wiring of a plurality of wirings,
wherein the first circuit is configured to supply a first current to the first wiring,
wherein a first terminal of a first transistor of a plurality of transistors is electrically connected to a first terminal of a second transistor of the plurality of transistors,
wherein a gate of the first transistor is electrically connected to a second terminal of the second transistor,
wherein the first terminal of the second transistor is electrically connected to the first wiring,
wherein a first terminal of a third transistor of the plurality of transistors is electrically connected to the second terminal of the second transistor, and
wherein a first terminal of a first capacitor of a plurality of capacitors is electrically connected to the gate of the first transistor.

2. An artificial neural network comprising:
a first memory cell; and
a second memory cell,
wherein the first memory cell retains a potential corresponding to a weight coefficient,
wherein the second memory cell retains a potential corresponding to a neuron output,
wherein the artificial neural network is capable of pattern recognition,
wherein the artificial neural network is capable of performing a weighting calculation of neuron outputs concurrently so as to obtain synapse inputs as output signals,
wherein a first circuit is electrically connected to a first wiring of a plurality of wirings,
wherein the first circuit is configured to supply a first current to the first wiring,
wherein a first terminal of a first transistor of a plurality of transistors is electrically connected to a first terminal of a second transistor of the plurality of transistors,
wherein a gate of the first transistor is electrically connected to a second terminal of the second transistor,
wherein the first terminal of the second transistor is electrically connected to the first wiring,
wherein a first terminal of a third transistor of the plurality of transistors is electrically connected to the second terminal of the second transistor, and
wherein a first terminal of a first capacitor of a plurality of capacitors is electrically connected to the gate of the first transistor.

3. The artificial neural network according to claim 1,
wherein the first wiring is electrically connected to a first output terminal of a plurality of output terminals,
wherein a second circuit is electrically connected to a second wiring of the plurality of wirings,
wherein the second circuit is configured to supply a second current to the second wiring,
wherein the second wiring is electrically connected to a second output terminal of the plurality of output terminals, and
wherein a third circuit is configured to output a third current corresponding to a potential of the second wiring from the first wiring and the second wiring.

4. The artificial neural network according to claim 3,
wherein the first memory cell is electrically connected to the first output terminal, and
wherein the second memory cell is electrically connected to the second output terminal.

5. The artificial neural network according to claim 1, wherein the plurality of transistors have a same polarity.

6. The artificial neural network according to claim 1,
wherein a channel formation region in one of the plurality of transistors comprises an oxide containing at least one of indium, an element M, and zinc, and
wherein the element M is one of aluminum, gallium, yttrium, and tin.

7. A semiconductor wafer comprising:
a plurality of the artificial neural networks according to claim 1; and
a region for dicing.

8. An electronic device comprising:
the artificial neural network according to claim 1; and
a housing.

9. The artificial neural network according to claim 2,
wherein the first wiring is electrically connected to a first output terminal of a plurality of output terminals,
wherein a second circuit is electrically connected to a second wiring of the plurality of wirings,
wherein the second circuit is configured to supply a second current to the second wiring,
wherein the second wiring is electrically connected to a second output terminal of the plurality of output terminals, and
wherein a third circuit is configured to output a third current corresponding to a potential of the second wiring from the first wiring and the second wiring.

10. The artificial neural network according to claim 9,
wherein the first memory cell is electrically connected to the first output terminal, and
wherein the second memory cell is electrically connected to the second output terminal.

11. The artificial neural network according to claim 2, wherein the plurality of transistors have a same polarity.

12. The artificial neural network according to claim 2,
wherein a channel formation region in one of the plurality of transistors comprises an oxide containing at least one of indium, an element M, and zinc, and
wherein the element M is one of aluminum, gallium, yttrium, and tin.

13. A semiconductor wafer comprising:
a plurality of the artificial neural networks according to claim 2; and
a region for dicing.

14. An electronic device comprising:
the artificial neural network according to claim 2; and
a housing.

* * * * *